US012764899B1

(12) United States Patent
Shahi et al.

(10) Patent No.: US 12,764,899 B1
(45) Date of Patent: Oct. 13, 2026

(54) TANK-BASED DUAL-MODE DATACENTER COOLING SYSTEM

(71) Applicant: NVIDIA Corporation, Santa Clara, CA (US)

(72) Inventors: Pardeep Shahi, Arlington, TX (US); Ali Heydari, Napa, CA (US)

(73) Assignee: NVIDIA Corporation, Santa Clara, CA (US)

(*) Notice: Subject to any disclaimer, the term of this patent is extended or adjusted under 35 U.S.C. 154(b) by 261 days.

(21) Appl. No.: 18/108,159

(22) Filed: Feb. 10, 2023

(51) Int. Cl.
*H05K 7/20* (2006.01)

(52) U.S. Cl.
CPC ..... *H05K 7/20236* (2013.01); *H05K 7/20272* (2013.01); *H05K 7/20772* (2013.01); *H05K 7/20254* (2013.01); *H05K 7/20263* (2013.01)

(58) Field of Classification Search
CPC ........... H05K 7/20236; H05K 7/20254; H05K 7/20772–20781; H05K 7/20272; H05K 7/20263
See application file for complete search history.

(56) References Cited

U.S. PATENT DOCUMENTS

| | | | | |
|---|---|---|---|---|
| 11,729,950 | B2 * | 8/2023 | Chehade | H05K 7/208 361/699 |
| 2005/0126747 | A1 * | 6/2005 | Chu | H05K 7/2079 165/11.1 |
| 2019/0383559 | A1 * | 12/2019 | Aoki | F28D 1/05316 |
| 2020/0288601 | A1 * | 9/2020 | Gao | H05K 7/20272 |
| 2020/0383237 | A1 * | 12/2020 | Hashimoto | H05K 7/20272 |
| 2023/0080447 | A1 * | 3/2023 | Shah | H05K 7/20836 361/679.53 |
| 2023/0156959 | A1 * | 5/2023 | Malouin | H05K 7/20781 361/699 |
| 2023/0217625 | A1 * | 7/2023 | Gao | H05K 7/20781 |
| 2024/0196563 | A1 * | 6/2024 | Jia | H05K 7/20263 |

FOREIGN PATENT DOCUMENTS

| | | | | |
|---|---|---|---|---|
| CN | 114980652 A | * | 8/2022 | H05K 7/20236 |
| CN | 115413183 A | * | 11/2022 | |
| JP | 6790855 B2 | * | 11/2020 | G06F 1/20 |

* cited by examiner

*Primary Examiner* — Zachary Pape
(74) *Attorney, Agent, or Firm* — Lowenstein Sandler LLP

(57) ABSTRACT

A system includes one or more first cooling loops to cool one or more first components of one or more servers at least partially submerged in an immersion coolant tank, and one or more second cooling loops to cool one or more second components of the one or more servers. The system can flow first coolant to cold plates to cool high-power server components and flow second coolant to cool low-power server components by immersion cooling.

19 Claims, 35 Drawing Sheets

TANK-BASED DUAL-MODE DATACENTER COOLING SYSTEM

FIELD

At least one embodiment pertains to cooling systems for a datacenter. In at least one embodiment, a tank-based dual-mode cooling system cools servers of a datacenter submerged in an immersion coolant tank by a combination of cold plate cooling and immersion cooling.

BACKGROUND

Datacenter cooling systems may use fans to circulate air through server components. Air cooling systems alone may not draw sufficient heat to support effective or efficient cooling in datacenters. Accordingly, some datacenters utilize liquid cooling to cool high-power components in servers and concurrently use air cooling to cool a remainder of components in the servers. However, such combined air cooling and liquid cooling may not sufficiently cool some systems.

DETAILED DESCRIPTION

Figure 1:
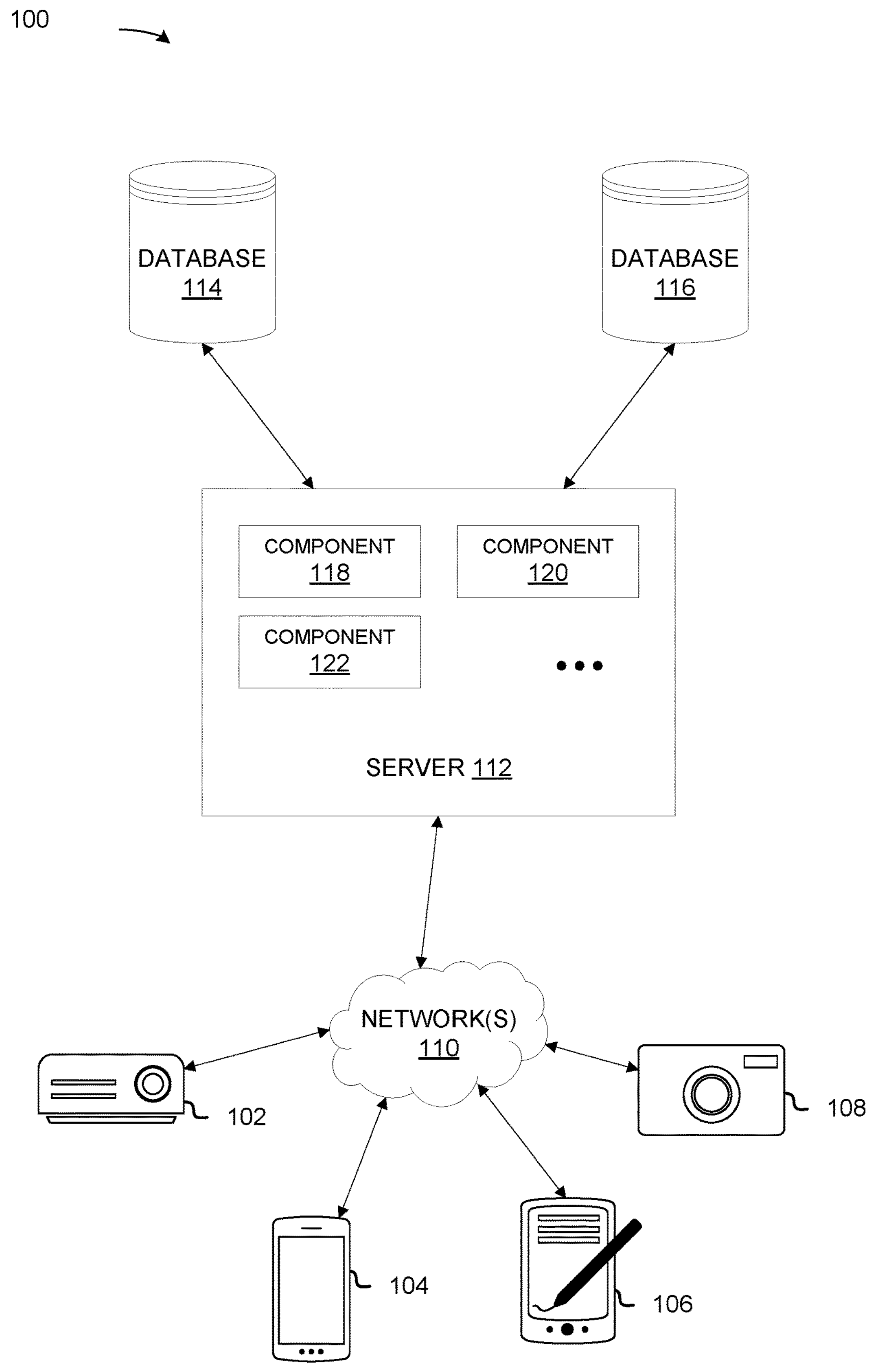
FIG. 1 illustrates an example datacenter having a dual-mode cooling system, according to at least one embodiment.

In the following description, numerous specific details are set forth to provide a more thorough understanding of at least one embodiment. However, it will be apparent to one skilled in the art that the inventive concepts may be practiced without one or more of these specific details.

Datacenters may use air cooling to cool servers to prevent malfunction due to high heat. Air cooling of high density servers has become inefficient and ineffective in view of high heat requirements caused by present day computing devices. Often, air cooling is insufficient to properly cool computing devices in present day datacenters. In at least one embodiment, to remedy this, some servers use liquid cooling to cool high-power components such as CPUs, GPUs, other processing units, or similar. In at least one embodiment, cold plates that receive a liquid coolant are coupled to high-power components. In at least one embodiment, cold plates can transfer heat energy from a component to a flowing liquid coolant. In at least one embodiment, liquid coolant is flowed from a cold plate to a distribution unit (e.g., a coolant distribution unit (CDU), etc.) where heat is rejected from coolant. In at least one embodiment, cooled liquid coolant is then flowed back to cold plates to remove more heat from server components. Although high-power server components can be cooled with liquid coolant via cold plates, low-power server components are still cooled via air cooling. Cooling low-power components with air requires energy to run fans to move air through servers. Air has a relatively low heat capacity, so a large amount of air is moved over server components to provide proper cooling. Although cooling efficiency may be increased by cooling high-power server components via liquid cooling in datacenters, cooling low-power server components via air cooling hampers cooling efficiency in datacenters.

Some datacenters cool servers (e.g., server components) via liquid immersion cooling. In some datacenters, entire server units are submerged in a vat (e.g., a tank, a tub, a pool, etc.) of dielectric liquid coolant. Heat from server components (e.g., both high-power server components and low-power server components) is transferred to dielectric liquid coolant. Often, dielectric liquid coolant has a greater heat capacity than air, meaning that server components are more effectively cooled than by air cooling. However, dielectric liquid coolant may have a lower heat capacity than other liquid coolants, such as water, that may be used for cold plate cooling as described above. Thus, high-power server components may not be efficiently and/or effectively cooled by immersion cooling.

In at least one embodiment, a cooling system for a datacenter has dual-cooling modes. In at least one embodiment, a datacenter cooling system includes one or more first cooling loops that flow a first coolant to cool one or more first components of one or more servers via cold plates and one or more second cooling loops that flow a second coolant to cool one or more second components of one or more servers via immersion cooling. In at least one embodiment, one or more servers are at least partially submerged in one or more immersion coolant tanks. In at least one embodiment, a datacenter server receives a first coolant from a first CDU. First coolant may be routed through piping, tubing, and/or one or more manifolds along one or more first flow paths between a first CDU to one or more servers. In at least one embodiment, first coolant is flowed through one or more cold plates coupled to one or more high-power server components such as a CPU, GPU, etc. First coolant may receive heat from one or more high-power components and may flow through piping, tubing, and/or one or more manifolds along one or more first flow paths to a first CDU where first coolant is cooled then returned back to one or more servers along one or more first flow paths. In at least one embodiment, a first CDU may cause heat to be exchanged between first coolant and a primary coolant such as water via a first heat exchanger of a first CDU. Primary coolant may be flowed from a first CDU to a cooling tower, chiller, dry cooler, etc. where heat from first coolant is rejected to an ambient environment. In at least one embodiment, a first CDU is disposed within an immersion coolant tank. In at least one embodiment, a first CDU is disposed external to an immersion coolant tank. In at least one embodiment, a first flow path is a loop along which first coolant flows.

In at least one embodiment, one or more servers at least partially submerged in an immersion coolant tank receive a second coolant from a second CDU. In at least one embodiment, one or more servers are at least partially submerged in second coolant. In at least one embodiment, second coolant is different from first coolant. In at least one embodiment, second coolant is an electrically-insulating dielectric coolant. In at least one embodiment, second coolant may be routed through piping, tubing, reservoirs, and/or one or more manifolds along one or more second flow paths between a second CDU and one or more servers. In at least one embodiment, second coolant at least partially fills an immersion coolant tank in which one or more servers are at least partially submerged. In at least one embodiment, second coolant is flowed in an immersion coolant tank by convection. In at least one embodiment, second coolant may come in thermal contact with low-power server components in an immersion coolant tank, thus cooling low-power server components by immersion cooling. In at least one embodiment, second coolant may receive heat from one or more low-power components and/or high-power components and may flow through piping, tubing, and/or one or more manifolds along one or more second flow paths to a second CDU where second coolant is cooled then returned back to cool one or more servers along one or more second flow paths. In at least one embodiment, a second CDU may cause heat to be exchanged between second coolant and another coolant described above via a second heat exchanger of a second CDU. In at least one embodiment, another coolant may be flowed from a second CDU to a cooling tower, chiller, dry cooler, etc. where heat from second coolant is rejected to an ambient environment. In at least one embodiment, a second CDU is disposed within an immersion coolant tank. In at least one embodiment a second CDU is disposed external to an immersion coolant tank. In at least one embodiment, a second flow path is a loop along which second coolant flows.

In at least one embodiment, by cooling both high-power server components and low-power server components via different forms of liquid cooling, a datacenter as described herein may have a heightened cooling efficiency compared to some datacenters. In at least one embodiment, replacing air cooling of low-power server components with liquid immersion cooling reduces power consumption used for datacenter cooling. In at least one embodiment described herein a datacenter may have a heightened cooling efficiency and/or effectiveness while reducing power consumption. In at least one embodiment, pressure losses from pumping immersion coolant may be decreased by circulating immersion coolant in an immersion tank by convection which may further reduce power consumption.

Servers and Data Centers

The following figures set forth, without limitation, exemplary network server and data center based systems that can be used to implement at least one embodiment.

FIG. 1 illustrates a distributed system 100, in accordance with at least one embodiment. In at least one embodiment, distributed system 100 includes one or more client computing devices 102, 104, 106, and 108, which are configured to execute and operate a client application such as a web browser, proprietary client, and/or variations thereof over one or more network(s) 110. In at least one embodiment, server 112 may be communicatively coupled with remote client computing devices 102, 104, 106, and 108 via network 110.

In at least one embodiment, server 112 may be adapted to run one or more services or software applications such as services and applications that may manage session activity of single sign-on (SSO) access across multiple data centers. In at least one embodiment, server 112 may also provide other services or software applications can include non-virtual and virtual environments. In at least one embodiment, these services may be offered as web-based or cloud services or under a Software as a Service (SaaS) model to users of client computing devices 102, 104, 106, and/or 108. In at least one embodiment, users operating client computing devices 102, 104, 106, and/or 108 may in turn utilize one or more client applications to interact with server 112 to utilize services provided by these components.

In at least one embodiment, software components 118, 120 and 122 of system 100 are implemented on server 112. In at least one embodiment, one or more components of system 100 and/or services provided by these components may also be implemented by one or more of client computing devices 102, 104, 106, and/or 108. In at least one embodiment, users operating client computing devices may then utilize one or more client applications to use services provided by these components. In at least one embodiment, these components may be implemented in hardware, firmware, software, or combinations thereof. It should be appreciated that various different system configurations are possible, which may be different from distributed system 100. The embodiment shown in FIG. 1 is thus one example of a distributed system for implementing an embodiment system and is not intended to be limiting.

In at least one embodiment, client computing devices 102, 104, 106, and/or 108 may include various types of computing systems. In at least one embodiment, a client computing device may include portable handheld devices (e.g., an iPhone®, cellular telephone, an iPad®, computing tablet, a personal digital assistant (PDA)) or wearable devices (e.g., a Google Glass® head mounted display), running software such as Microsoft Windows Mobile®, and/or a variety of mobile operating systems such as iOS, Windows Phone, Android, BlackBerry 10, Palm OS, and/or variations thereof. In at least one embodiment, devices may support various applications such as various Internet-related apps, e-mail, short message service (SMS) applications, and may use various other communication protocols. In at least one embodiment, client computing devices may also include general purpose personal computers including, by way of example, personal computers and/or laptop computers running various versions of Microsoft Windows®, Apple Macintosh®, and/or Linux operating systems. In at least one embodiment, client computing devices can be workstation computers running any of a variety of commercially-available UNIX® or UNIX-like operating systems, including without limitation a variety of GNU/Linux operating systems, such as Google Chrome OS. In at least one embodiment, client computing devices may also include electronic devices such as a thin-client computer, an Internet-enabled gaming system (e.g., a Microsoft Xbox gaming console with or without a Kinect® gesture input device), and/or a personal messaging device, capable of communicating over network(s) 110. Although distributed system 100 in FIG. 1 is shown with four client computing devices, any number of client computing devices may be supported. Other devices, such as devices with sensors, etc., may interact with server 112.

In at least one embodiment, network(s) 110 in distributed system 100 may be any type of network that can support data communications using any of a variety of available protocols, including without limitation TCP/IP (transmission control protocol/Internet protocol), SNA (systems network architecture), IPX (Internet packet exchange), AppleTalk, and/or variations thereof. In at least one embodiment, network(s) 110 can be a local area network (LAN), networks based on Ethernet, Token-Ring, a wide-area network, Internet, a virtual network, a virtual private network (VPN), an intranet, an extranet, a public switched telephone network (PSTN), an infra-red network, a wireless network (e.g., a network operating under any of the Institute of Electrical and Electronics (IEEE) 802.11 suite of protocols, Bluetooth®, and/or any other wireless protocol), and/or any combination of these and/or other networks.

In at least one embodiment, server 112 may be composed of one or more general purpose computers, specialized server computers (including, by way of example, PC (personal computer) servers, UNIX® servers, mid-range servers, mainframe computers, rack-mounted servers, etc.), server farms, server clusters, or any other appropriate arrangement and/or combination. In at least one embodiment, server 112 can include one or more virtual machines running virtual operating systems, or other computing architectures involving virtualization. In at least one embodiment, one or more flexible pools of logical storage devices can be virtualized to maintain virtual storage devices for a server. In at least one embodiment, virtual networks can be controlled by server 112 using software defined networking. In at least one embodiment, server 112 may be adapted to run one or more services or software applications.

In at least one embodiment, server 112 may run any operating system, as well as any commercially available server operating system. In at least one embodiment, server 112 may also run any of a variety of additional server applications and/or mid-tier applications, including HTTP (hypertext transport protocol) servers, FTP (file transfer protocol) servers, CGI (common gateway interface) servers, JAVA® servers, database servers, and/or variations thereof. In at least one embodiment, exemplary database servers include without limitation those commercially available from Oracle, Microsoft, Sybase, IBM (International Business Machines), and/or variations thereof.

In at least one embodiment, server 112 may include one or more applications to analyze and consolidate data feeds and/or event updates received from users of client computing devices 102, 104, 106, and 108. In at least one embodiment, data feeds and/or event updates may include, but are not limited to, Twitter® feeds, Facebook® updates or real-time updates received from one or more third party information sources and continuous data streams, which may include real-time events related to sensor data applications, financial tickers, network performance measuring tools (e.g., network monitoring and traffic management applications), clickstream analysis tools, automobile traffic monitoring, and/or variations thereof. In at least one embodiment, server 112 may also include one or more applications to display data feeds and/or real-time events via one or more display devices of client computing devices 102, 104, 106, and 108.

In at least one embodiment, distributed system 100 may also include one or more databases 114 and 116. In at least one embodiment, databases may provide a mechanism for storing information such as user interactions information, usage patterns information, adaptation rules information, and other information. In at least one embodiment, databases 114 and 116 may reside in a variety of locations. In at least one embodiment, one or more of databases 114 and 116 may reside on a non-transitory storage medium local to (and/or resident in) server 112. In at least one embodiment, databases 114 and 116 may be remote from server 112 and in communication with server 112 via a network-based or dedicated connection. In at least one embodiment, databases 114 and 116 may reside in a storage-area network (SAN). In at least one embodiment, any necessary files for performing functions attributed to server 112 may be stored locally on server 112 and/or remotely, as appropriate. In at least one embodiment, databases 114 and 116 may include relational databases, such as databases that are adapted to store, update, and retrieve data in response to SQL-formatted commands.

Figure 2A:
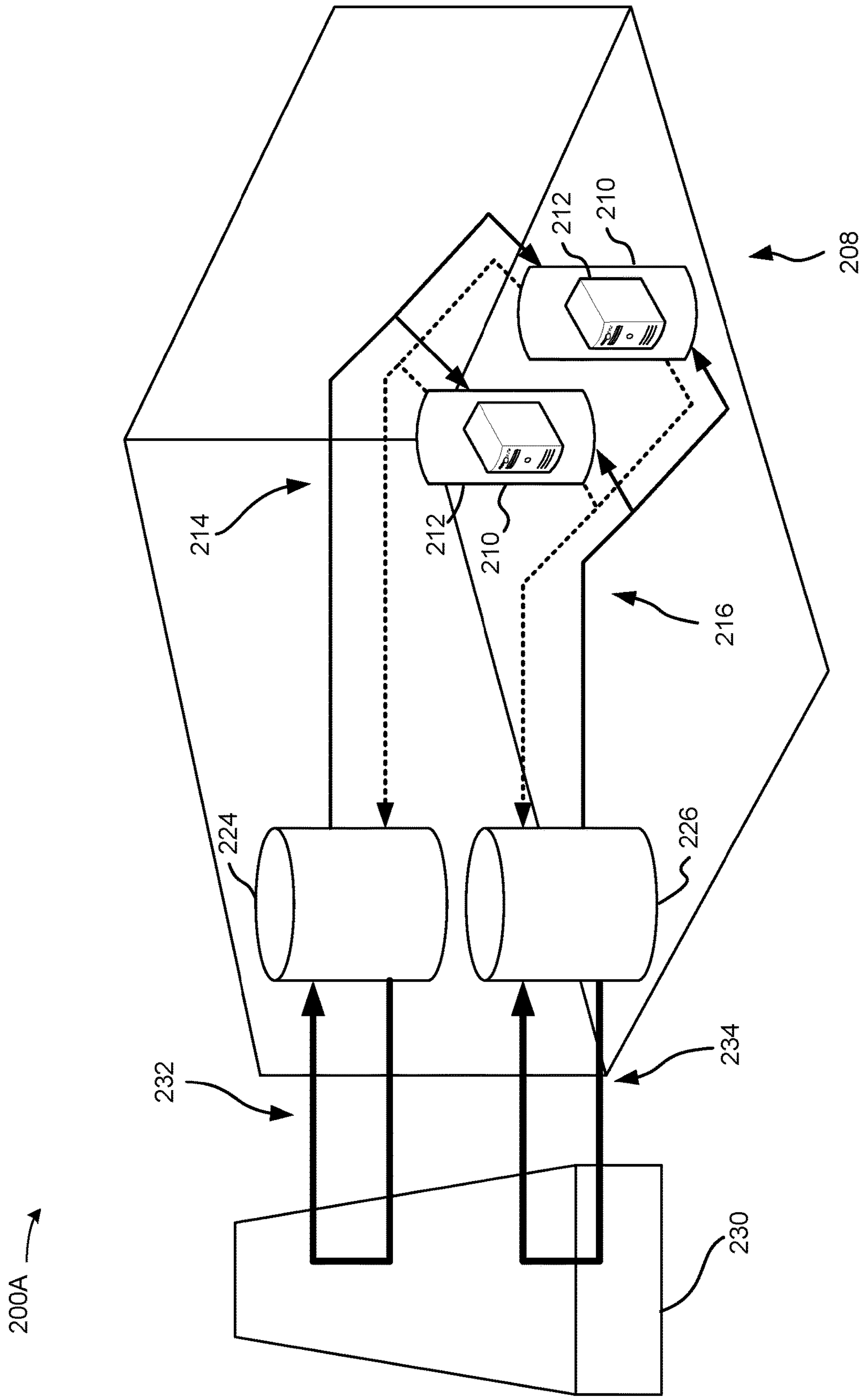
FIG. 2A illustrates an example tank-based dual-mode datacenter cooling system, according to at least one embodiment.

FIG. 2A illustrates an example tank-based dual-mode datacenter cooling system 200A, according to at least one embodiment. In at least one embodiment, system 200A includes a datacenter 208 having one or more servers 212 disposed in one or more immersion coolant tanks 210. In at least one embodiment, one or more servers 212 are supported in an at least partially submerged state in immersion coolant tanks 210. In at least one embodiment, as discussed above with reference to FIG. 1, each server 212 includes multiple components such as component 118, component 120, component 122, and so on. In at least one embodiment, a server 212 includes one or more components having greater than a threshold power density. Power density may be used to describe component power relative to component size. Components having greater than a threshold power density may be referred to as high-power components. In at least one embodiment, a high-power component may be a processing unit such as a central processing unit (CPU) or a graphical processing unit (GPU). In at least one embodiment, a high-power component may include a specialized or general processing device, such as aforementioned GPU and CPU, a field programmable gate array (FPGA), a data processing unit (DPU), and so on. In at least one embodiment, a high-power component of a server 212 may output more than a threshold amount of heat. Similarly, in at least one embodiment, a server 212 includes one or more components having less than a threshold power density. Components having less than a threshold power density may be referred to as low-power components. In at least one embodiment, a low-power component of a server 212 may output less than a threshold amount of heat. In at least one embodiment, low-power components of a server may include a power supply, a motherboard, memory, a network interface card (NIC), a solid state drive or hard drive, an audio card, and so on.

In at least one embodiment, components of servers 212 are cooled by a first cooling loop 214 and/or a second cooling loop 216. In at least one embodiment, each of cooling loops 214 and 216 flow a coolant to cool server components. In at least one embodiment, each of cooling loops 214 and 216 include conduits such as piping, tubing, and/or one or more valves to flow coolant between a first cooling distribution unit (CDU) 224 and servers 212 or between a second CDU 226 and immersion coolant tanks 210. In at least one embodiment, first cooling loop 214 may flow coolant along pipes, tubing, one or more manifolds, and/or one or more valves (described below) from first CDU 224 to servers 212 and back to first CDU 224. In at least one embodiment, second cooling loop 216 may flow coolant from second CDU 226 to immersion coolant tanks 210 and back to second CDU 226. In at least one embodiment, second CDU 226 is disposed within an immersion coolant tank 210. In at least one embodiment, coolant may carry heat from servers 212 to CDUs 224 and 226.

In at least one embodiment, first cooling loop 214 flows a first coolant to cool high-power components of servers 212. In at least one embodiment, cold plates associated with first cooling loop 214 for receiving first coolant are coupled to high-power server components. In at least one embodiment, a cold plate is a metal plate that can be attached to an electronic device such as a CPU or a GPU. In at least one embodiment, a cold plate is attached to an electronic device by an adhesive such as a thermal epoxy. In at least one embodiment, a cold plate is attached to an electronic device by one or more mechanical fasteners. In at least one embodiment, a cold plate can implement localized cooling of powered electronics by transferring heat from an electronic device to a liquid coolant that flows to a remote heat exchanger. In at least one embodiment, a cold plate includes a thick metal plate having one or more internal passages through which liquid coolant can flow. In at least one embodiment, a cold plate can be made of a material such as aluminum, steel, stainless steel, or copper. In at least one embodiment, an electronic device in contact with a cold plate is cooled by conduction. Heat from an electronic device may conduct from a device to an attached cold plate. Heat may be carried away by liquid coolant flowing through a cold plate.

In at least one embodiment, first coolant is flowed along a flow path of first cooling loop through one or more cold plates to remove heat from high-power components of servers 212. In at least one embodiment, first coolant is an electrically conductive coolant. In at least one embodiment, first coolant can include water, deionized water, or a refrigerant such as R-134a. In at least one embodiment, first coolant includes a mixture of water and additives such as a water and ethylene glycol mixture or a water and propylene glycol mixture. In at least one embodiment, first coolant includes a 25% concentration of propylene glycol in deionized water. Heat from high-power server components is carried by first coolant to first CDU 224. In at least one embodiment, first cooling loop 214 includes one or more supply conduits (represented by solid lines) and one or more return conduits (represented by dashed lines). In at least one embodiment, first coolant is a single-phase coolant. In at least one embodiment, first coolant is a dual-phase coolant. In at least one embodiment, first coolant may not vaporize when heated by first server components.

In at least one embodiment, second cooling loop 216 flows a second coolant to cool low-power components of servers 212. In at least one embodiment, second coolant is different from first coolant and is kept separate from first coolant so that first coolant and second coolant do not mix. In at least one embodiment, second coolant is a dielectric coolant. In at least one embodiment, second coolant is electrically non-conductive. Accordingly, second coolant may contact electrical contacts without causing shorts between electrical contacts. In at least one embodiment, second coolant can include fluorochemicals, fluorocarbons, and/or hydrocarbons. In at least one embodiment, second coolant includes oil such as mineral oil, synthetic oil, and/or natural oil. In at least one embodiment, second coolant includes an engineered fluid such as BitCool® BC-888 dielectric coolant or ElectroCool® EC-100 dielectric coolant marketed by Engineered Fluids, Inc. of Saint Petersburg, Florida.

In at least one embodiment, second coolant is flowed into an immersion coolant tank 210 to cool one or more low-power components submerged in an immersion coolant tank 210 by immersion cooling. In at least one embodiment, second coolant may additionally absorb and carry some heat from first coolant. In at least one embodiment, servers 212 are supported in immersion coolant tanks 210 so that servers 212 are at least partially submerged in second coolant within immersion coolant tanks 210. In at least one embodiment, as second coolant is flowed through immersion coolant tanks 210, second coolant carries heat from at least low-power components away from servers 212. In at least one embodiment, heat from low-power server components is carried by second coolant to second CDU 226. In at least one embodiment, second cooling loop 216 includes one or more supply conduits (represented by solid lines) and one or more return conduits (represented by dashed lines). In at least one embodiment, second coolant is a single-phase coolant. Second coolant may not vaporize when heated by second server components. In at least one embodiment, second coolant is a dual-phase coolant.

In at least one embodiment, first CDU 224 includes a heat exchanger to exchange heat between first cooling loop 214 and a third cooling loop 232. In at least one embodiment, third cooling loop 232 flows a primary coolant, such as water, from first CDU 224 to a cooling tower 230 to exchange heat from first cooling loop 214 with an ambient environment. In at least one embodiment, third cooling loop 232 flows primary coolant from first CDU 224 to cooling tower 230 or a chiller to exchange heat with a cold sink such as an ambient environment. In at least one embodiment, an ambient environment includes an air environment or a liquid environment. In at least one embodiment, first CDU 224 includes one or more pumps to pump first coolant and/or primary coolant of third cooling loop 232. In at least one embodiment, first CDU 224 includes a controller to control flow and/or distribution of coolant along first cooling loop 214 and/or third cooling loop 232. In at least one embodiment, first CDU 224 includes one or more valves to effectuate such control.

In at least one embodiment, second CDU 226 includes a heat exchanger to exchange heat between second cooling loop 216 and a fourth cooling loop 234. In at least one embodiment, fourth cooling loop 234 flows a primary coolant described above. For example, fourth cooling loop 234 may flow water. In at least one embodiment, fourth cooling loop 234 flows primary coolant from second CDU to cooling tower 230 or a chiller to exchange heat from second cooling loop 216 with a cold sink such as an ambient environment. In at least one embodiment, second CDU 226 includes one or more pumps to pump second coolant and/or primary coolant of fourth coolant loop 234. In at least one embodiment, second CDU 226 includes a controller to control flow and/or distribution of coolant along second cooling loop 216 and/or fourth cooling loop 234. In at least one embodiment, second CDU 226 includes one or more values to effectuate such control.

In at least one embodiment, system 200 includes two cooling towers 230 or two chillers, one associated with each of third cooling loop 232 and fourth cooling loop 234. In at least one embodiment, third and fourth cooling loops 232 and 234 may be referred to as “primary” cooling loops, while first and second cooling loops 214 and 216 may be referred to as “secondary” cooling loops.

Figure 2B:
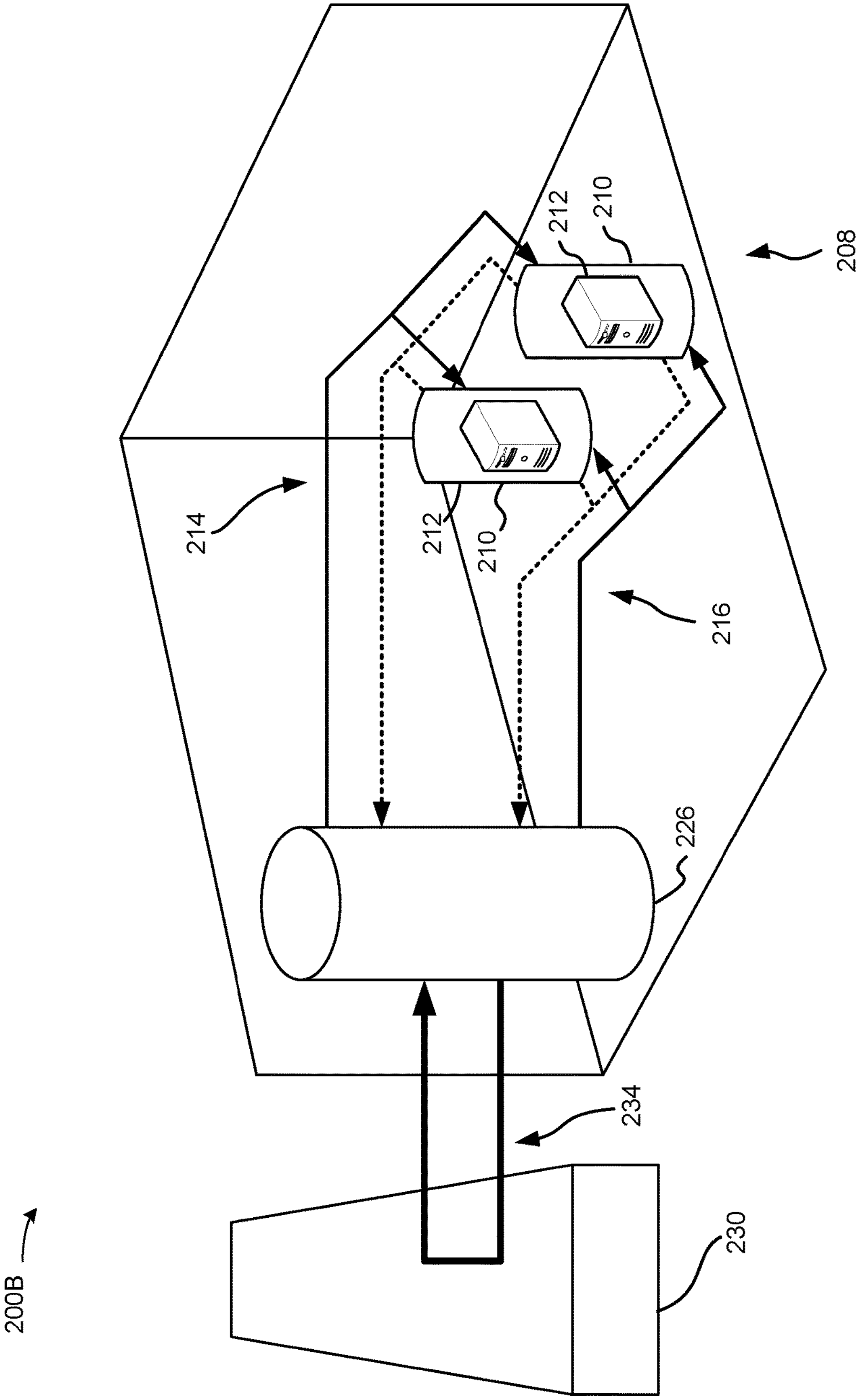
FIG. 2B illustrates an example tank-based dual-mode datacenter cooling system, according to at least one embodiment.

FIG. 2B illustrates an example tank-based dual-mode datacenter cooling system 200B, according to at least one embodiment. Features included in system 200B having same or similar numbering may include the same structure or functionality as those in system 200A. In at least one embodiment, system 200B includes a single CDU to exchange heat between two secondary cooling loops and a single primary cooling loop. In at least one embodiment, both first cooling loop 214 and second cooling loop 216 flow a dielectric coolant to respectively cool first server components via cold plates and second server components via immersion cooling. In at least one embodiment, both first cooling loop 214 and second cooling loop 216 exchange heat with fourth cooling loop 234 in second CDU 226. In at least one embodiment, cold plates of first cooling loop 214 are optimized for the flow of dielectric coolant. Including only a single CDU and a single primary cooling loop to remove heat from both first cooling loop 214 and second cooling loop 216 may reduce the size of datacenter 208.

Figure 3:
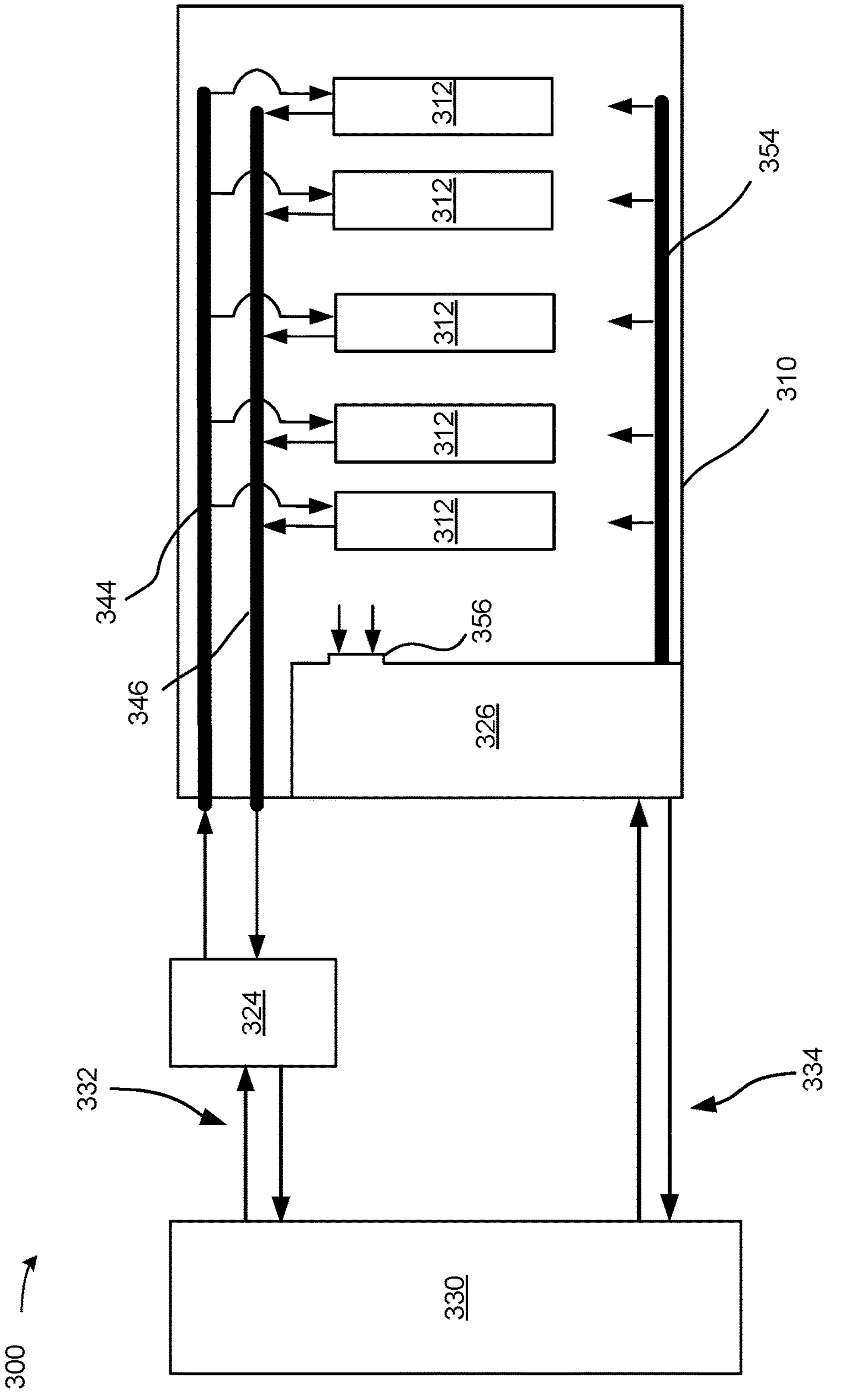
FIG. 3 illustrates a schematic diagram of a tank-based dual-mode datacenter cooling system, according to at least one embodiment.

FIG. 3 illustrates a schematic diagram of a tank-based dual-mode datacenter cooling system 300, according to at least one embodiment. Features illustrated in FIG. 3 having similar numbering to features shown in other figures may have similar functions. In at least one embodiment, system 300 includes multiple servers 312 disposed in an immersion coolant tank 310. In at least one embodiment, multiple servers 312 are at least partially submerged in dielectric coolant within immersion coolant tank 310. In at least one embodiment, servers 312 are a part of a datacenter having multiple tanks 310, each tank containing multiple servers 312. Although only one immersion coolant tank 310 is shown in FIG. 3, system 300 can provide cooling for servers 312 in multiple tanks 310.

In at least one embodiment, first coolant is flowed along one or more flow paths of one or more first cooling loops from first CDU 324 to servers 312. In at least one embodiment, first coolant is flowed through one or more manifolds. In at least one embodiment, a first supply manifold 344 is supplied with first coolant from first CDU 324. In at least one embodiment, first supply manifold 344 may distribute first coolant to multiple servers 312 supported in tank 310. In at least one embodiment, first supply manifold 344 may be at least partially disposed within tank 310. In at least one embodiment, first coolant may flow from first supply manifold 344 into servers 312 and cool high-power component(s) of servers 312. In at least one embodiment, high-power server components within servers 312 may each be coupled to one or more cold plates to receive first coolant. In at least one embodiment, one or more cold plates may transfer heat from a high-power server component to first coolant. In at least one embodiment, first coolant carries heat away from high-power components of servers 312. In at least one embodiment, a first return manifold 346 collects heated first coolant output from each of servers 312. In at least one embodiment, first return manifold 346 is at least partially disposed within tank 310. In at least one embodiment, first coolant flows from first return manifold 346 to first CDU 324, where first coolant is cooled by chilled primary coolant such as water or other coolant flowing between chiller 330 and first CDU 324. In at least one embodiment, heat may be exchanged between first coolant and cooled primary coolant in a liquid-to-liquid heat exchanger within first CDU 324. In at least one embodiment, cooled first coolant is again flowed from first CDU 324 to servers 312 via first supply manifold 344.

In at least one embodiment, second coolant is flowed along one or more flow paths of one or more second cooling loops from second CDU 326 to servers 312. In at least one embodiment, second coolant is flowed through one or more manifolds. In at least one embodiment, a second supply manifold 354 is supplied with second coolant from second CDU 326. In at least one embodiment, second supply manifold 354 may distribute second coolant to multiple servers 312 within tank 310. In at least one embodiment, second supply manifold 354 distributes second coolant via one or more jets. In at least one embodiment, second coolant may flow from second supply manifold 354 to substantially fill tank 310 and to immerse low-power components of servers 312 in second coolant.

In at least one embodiment, while flowing and/or circulating within tank 310, second coolant may remove heat from low-power server components. In at least one embodiment, as described above, second coolant is a dielectric coolant. In at least one embodiment, second coolant is not electrically conductive. In at least one embodiment, warmed second coolant is returned to second CDU 326 via a second coolant return opening 356. In at least one embodiment, second coolant flows from second coolant return opening

356 to second CDU 326 where second coolant is cooled by chilled primary coolant flowing between chiller 330 and second CDU 326. In at least one embodiment, heat may be exchanged between second coolant and cooled primary coolant in a liquid-to-liquid heat exchanger within second CDU 326. In at least one embodiment, cooled second coolant is again flowed from second CDU 326 to servers 312 via second supply manifold 354 to immerse servers supported in tank 310. In at least one embodiment, second CDU 326 is disposed within immersion coolant tank 310. In at least one embodiment, second CDU 326 is coupled to a body of immersion coolant tank 310.

In at least one embodiment, primary coolant flows between chiller 330 and first and second CDUs 324 and 326 via a third cooling loop 332 and a fourth cooling loop 334, respectively. In at least one embodiment, cool air is drawn into chiller 330 by one or more fans. In at least one embodiment, primary coolant carrying heat transferred from first and second cooling loops (e.g., via heat exchangers in first CDU 324 and/or second CDU 326), is cooled by cool air. In at least one embodiment, heat from primary coolant is transferred to air, and heated air is forced out of chiller 330 (by one or more fans). In at least one embodiment, primary coolant is therefore cooled by air. In at least one embodiment, cooled primary coolant flows back to first CDU 324 along a flow path of a third cooling loop 332 and back to second CDU 326 along a flow path of a fourth cooling loop 334.

Figure 4:
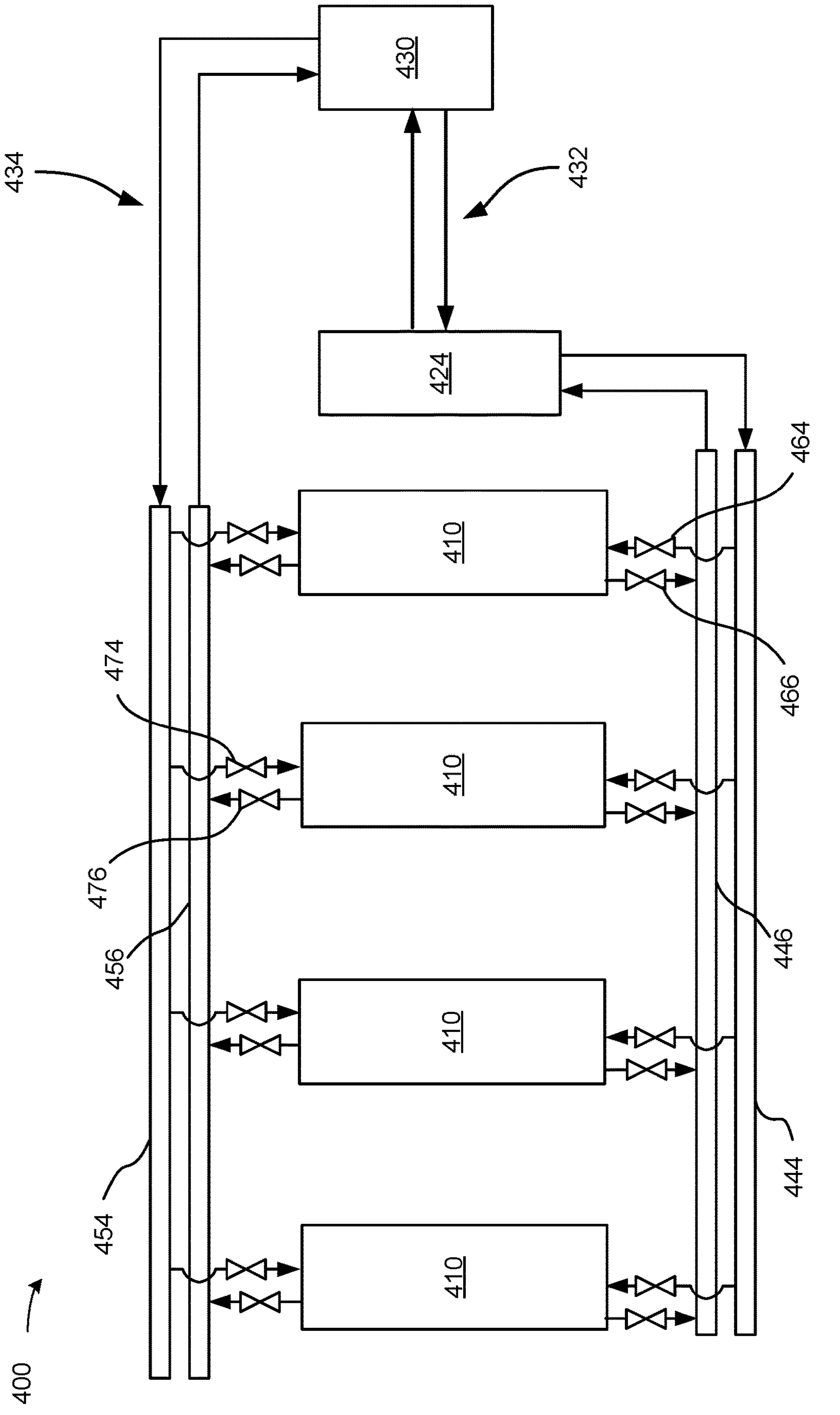
FIG. 4 illustrates a schematic diagram of a tank-based dual-mode datacenter cooling system, according to at least one embodiment.

FIG. 4 illustrates a schematic diagram of a tank-based dual-mode datacenter cooling system 400, according to at least one embodiment. Features illustrated in FIG. 4 having similar numbering to features shown in other figures may have similar functions. In at least one embodiment, first coolant is flowed from a first CDU 424 to one or more servers disposed in immersion coolant tanks 410. In at least one embodiment, tanks 410 are disposed in a row, forming a row of tanks 410. In at least one embodiment, a first row supply manifold 444 receives first coolant from first CDU 424 and distributes first coolant to tank supply manifolds disposed within immersion coolant tanks 410. In at least one embodiment, first coolant may flow from first row supply manifold 444 to first tank supply manifolds through a first supply valve 464. In at least one embodiment, first supply valve 464 can be closed to stop flow of first coolant. In at least one embodiment, first supply valve 464 can be at least partially closed and/or opened to regulate flow of first coolant. In at least one embodiment, first tank supply manifolds disposed within tanks 410 may be fluidly coupled to first row supply manifold 444 via a quick-disconnecting coupler (e.g., a quick-disconnect, etc.). In at least one embodiment, first supply valve 464 may be fluidly coupled to first row supply manifold 444 and/or first tank supply manifold via one or more quick-disconnecting couplers. In at least one embodiment, first supply valve 464 is coupled to (e.g., mounted on) first row supply manifold 444. In at least one embodiment, first coolant flows from a first tank supply manifold within a tank 410 to one or more servers supported within tank 410. In at least one embodiment, first coolant may flow via one or more conduits, such as pipes or tubes, from a first tank supply manifold to servers within a tank 410.

In at least one embodiment, first coolant is flowed into one or more cold plates to cool one or more high-power server components such as a CPU or GPU. In at least one embodiment, first coolant removes heat from high-power server components and flows to a first tank return manifold disposed within a tank 410. In at least one embodiment, first coolant flows through one or more conduits from cold plates within servers to a first tank return manifold. In at least one embodiment, a first tank return manifold collects heated first coolant from one or more servers disposed within a corresponding immersion coolant tank 410. In at least one embodiment, first coolant then flows from a first tank return manifold to first row return manifold 446. In at least one embodiment, first coolant may flow from a first tank return manifold within an immersion coolant tank 410 to first row return manifold 446 through a first return valve 466. In at least one embodiment, first return valve 466 can be closed to stop flow of first coolant. In at least one embodiment, first return valve 466 can be at least partially closed and/or opened to regulate flow of first coolant. In at least one embodiment, a first tank return manifold may be fluidly coupled to a first row return manifold 446 via a quick-disconnecting coupler. In at least one embodiment, first return valve 466 may be fluidly coupled to first row return manifold 446 and/or first tank return manifolds via one or more quick-disconnecting couplers. In at least one embodiment, first return valve 466 is coupled to first row return manifold 446. In at least one embodiment, first row return manifold 446 collects first coolant from multiple first tank return manifolds. In at least one embodiment, first coolant flows from first row return manifold 446 to first CDU 424 where first coolant is cooled by cooled primary coolant of a third cooling loop 432 and returned to first row supply manifold 444. In at least one embodiment, primary coolant of a third cooling loop 432 is cooled by a chiller 430.

In at least one embodiment, cooled primary coolant of a fourth cooling loop 434, is flowed from chiller 430 to one or more second CDUs disposed in immersion coolant tanks 410. In at least one embodiment, each immersion coolant tank 410 includes a corresponding second CDU. In at least one embodiment, a second row supply manifold 454 receives cooled primary coolant from chiller 430 and distributes cooled primary coolant to one or more second CDUs disposed in immersion coolant tanks 410. In at least one embodiment, cooled primary coolant may flow from second row supply manifold 454 to second CDUs via one or more second supply valves 474. In at least one embodiment, a second supply valve 474 can be closed to stop flow of cooled primary coolant from chiller 430 to a second CDU within a corresponding tank 410. In at least one embodiment, second supply valve 474 can be at least partially closed and/or opened to regulate flow of cooled primary coolant. In at least one embodiment, second CDUs within tanks 410 may be fluidly coupled to second row supply manifold 454 via a quick-disconnecting coupler. In at least one embodiment, second supply valve 474 may be fluidly coupled to second row supply manifold 454 and/or a second CDUs within a tank 410 via one or more quick-disconnecting couplers. In at least one embodiment, second supply valve 474 is coupled to second row supply manifold 454.

In at least one embodiment, cooled primary coolant flows through a second CDU disposed within an immersion coolant tank 410 to cool second coolant circulating through a second CDU within a tank 410 to cool one or more low-power server components of one or more servers within a tank 410 by immersion cooling. In at least one embodiment, heat from one or more low-power server components is exchanged from second coolant within a tank 410 with cooled primary coolant in a second CDU. Cooled primary coolant may be warmed by second coolant in a heat exchanger of a second CDU to form warmed primary coolant. In at least one embodiment, warmed primary coolant flows from a second CDU within a tank 410 to second row return manifold 456. In at least one embodiment, warmed primary coolant may flow from a second CDU to second row return manifold 456 through a second return valve 476. In at least one embodiment, a second return valve 476 can be at least partially closed and/or opened to regulate flow of warmed primary coolant. In at least one embodiment, one or more second CDUs may be fluidly coupled to a second row return manifold 456 via a quick-disconnecting coupler. In at least one embodiment, second return valve 476 may be fluidly coupled to second row return manifold 456 and/or one or more second CDUs within tanks 410 via one or more quick-disconnecting couplers. In at least one embodiment, second return valve 476 is coupled to second row return manifold 456. In at least one embodiment, second row return manifold 456 collects warmed primary coolant from multiple second CDUs disposed within tanks 410. In at least one embodiment, warmed primary coolant flows from second row return manifold 456 to chiller 430, where warmed primary coolant is cooled to form cooled primary coolant. Cooled primary coolant is then flowed from chiller 430 to second row supply manifold 454.

In at least one embodiment, where system 400 includes multiple rows of immersion coolant tanks 410, system 400 includes a corresponding first row supply manifold 444, first row return manifold 446, second row supply manifold 454, and second row return manifold 456 for each row of tanks 410.

Figure 5:
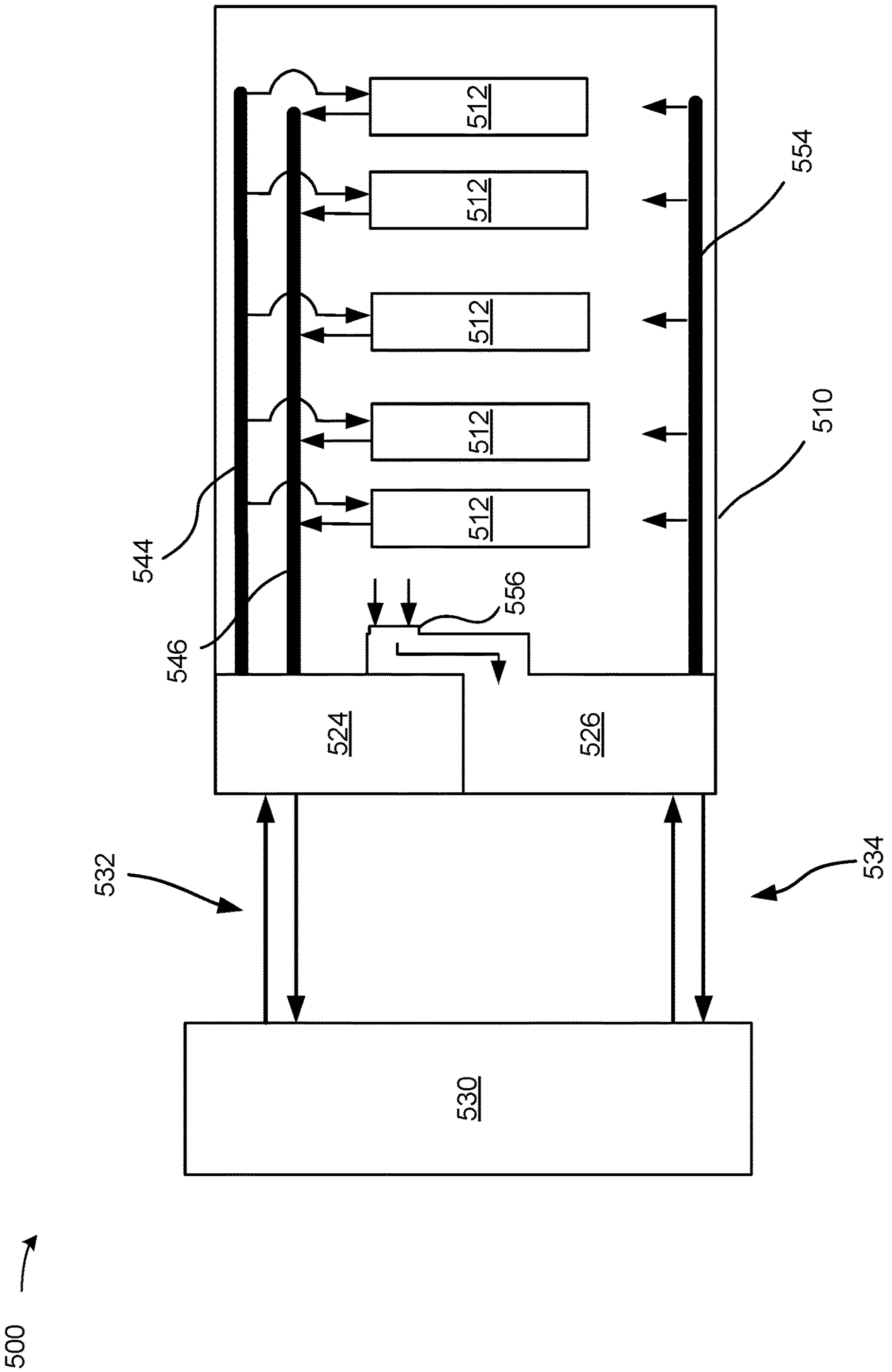
FIG. 5 illustrates a schematic diagram of a tank-based dual-mode datacenter cooling system, according to at least one embodiment.

FIG. 5 illustrates a schematic diagram of a tank-based dual-mode datacenter cooling system 500, according to at least one embodiment. Features illustrated in FIG. 5 having similar numbering to features shown in other figures may have similar functions.

In at least one embodiment, first coolant is flowed along one or more flow paths of one or more first cooling loops from first CDU 524 to servers 512. In at least one embodiment, first CDU 524 is disposed within immersion coolant tank 510. In at least one embodiment, first CDU 524 is coupled to a body of immersion coolant tank 510. In at least one embodiment, first coolant is flowed from first CDU 524 to servers 512 via first supply manifold 544 to cool one or more high-power server components. In at least one embodiment, first coolant flows from servers 512 to first CDU 524 via first return manifold 546 to carry heat away from servers 512. In at least one embodiment, first coolant exchanges heat with primary coolant of a third cooling loop 532 within a heat exchanger of first CDU 524. In at least one embodiment, third cooling loop 532 flows a primary coolant between chiller 530 and first CDU 524 to cool first coolant.

In at least one embodiment, second coolant is flowed along one or more flow paths of one or more second cooling loops from second CDU 526 to servers 512. In at least one embodiment, second coolant is flowed from second CDU 526 to servers 512 via second supply manifold 554. In at least one embodiment, second coolant circulates within immersion tank 510 by convection. In at least one embodiment, second coolant cools one or more low-power components of servers 512. In at least one embodiment, second coolant returns to second CDU 526 via second coolant return opening 556. In at least one embodiment, second coolant exchanges heat with primary coolant of a fourth cooling loop 534 within a heat exchanger of second CDU 526. In at least one embodiment, fourth cooling loop 534 flows primary coolant between chiller 530 and second CDU 526 to cool second coolant.

Figure 6:
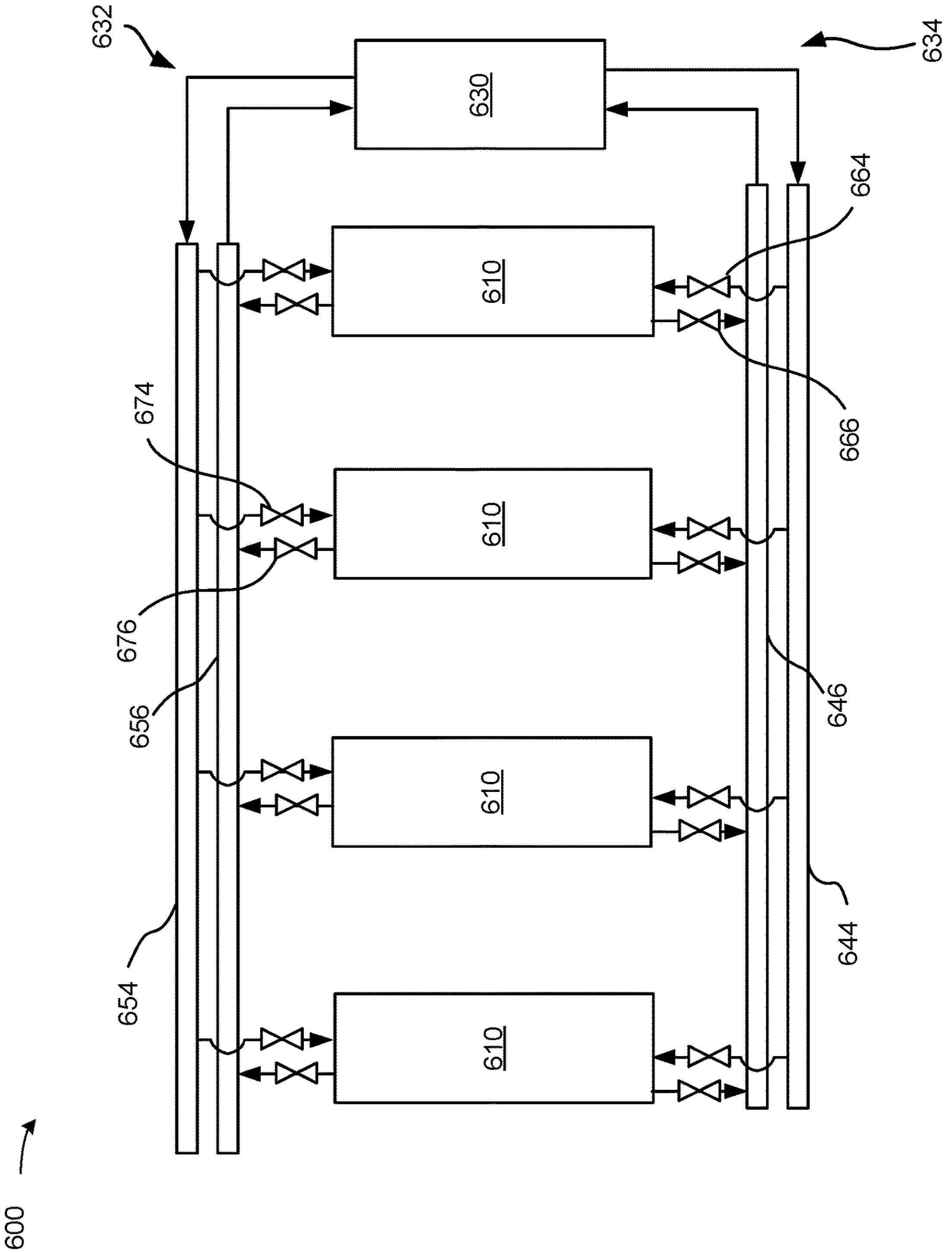
FIG. 6 illustrates a schematic diagram of a tank-based dual-mode datacenter cooling system, according to at least one embodiment.

FIG. 6 illustrates a schematic diagram of a tank-based dual-mode datacenter cooling system 600, according to at least one embodiment. Features illustrated in FIG. 6 having similar numbering to features shown in other figures may have similar functions. In at least one embodiment, cooled primary coolant of a third cooling loop 632, such as cooled water, is flowed from chiller 630 to one or more first CDUs disposed in immersion coolant tanks 610. In at least one embodiment, tanks 610 are disposed in a row, forming a row of tanks 610. In at least one embodiment, a first row supply manifold 644 receives cooled primary coolant from chiller 630 and distributes cooled primary coolant to one or more first CDUs disposed in immersion coolant tanks 610. In at least one embodiment, cooled primary coolant may flow from first row supply manifold 644 to first CDUs via one or more first supply valves 664. In at least one embodiment, a first supply valve 664 can be closed to stop flow of cooled primary coolant from chiller 640 to a first CDU within a corresponding tank 610. In at least one embodiment, first supply valve 664 can be at least partially closed and/or opened to regulate flow of cooled primary coolant. In at least one embodiment, first CDUs within tanks 610 may be fluidly coupled to first row supply manifold 644 via a quick-disconnecting coupler. In at least one embodiment, first supply valve 664 may be fluidly coupled to first row supply manifold 644 and/or a first CDU within a tank 610 via one or more quick-disconnecting couplers. In at least one embodiment, first supply valve 664 is coupled to first row supply manifold 644.

In at least one embodiment, cooled primary coolant flows through a first CDU disposed within an immersion coolant tank 610 to cool first coolant circulating through a first CDU to cool one or more high-power server components of one or more servers within a tank 610. In at least one embodiment, each immersion coolant tank 610 includes a corresponding first CDU. In at least one embodiment, one or more high-power server components are coupled to cold plates to receive first coolant and to cool high-power server components. In at least one embodiment, heat from one or more high-power server components is exchanged from first coolant with cooled coolant in a first CDU. Cooled primary coolant may be warmed by first coolant in a heat exchanger of a first CDU to form warmed primary coolant. In at least one embodiment, warmed primary coolant flows from a first CDU within a tank 610 to first row return manifold 646. In at least one embodiment, warmed primary coolant may flow from a first CDU to first return manifold 646 through a first return valve 666. In at least one embodiment, a first return valve 666 can be at least partially closed and/or opened to regulate flow of warmed primary coolant. In at least one embodiment, one or more first CDUs may be fluidly coupled to a first row return manifold 646 via a quick-disconnecting coupler. In at least one embodiment, first return valve 666 may be fluidly coupled to first row return manifold 646 and/or one or more first CDUs within tanks 610 via one or more quick-disconnecting couplers. In at least one embodiment, first return valve 666 is coupled to first row return manifold 646. In at least one embodiment, first row return manifold 646 collects warmed primary coolant from multiple first CDUs disposed within tanks 410. In at least one embodiment, warmed primary coolant flows from first row return manifold 646 to chiller 630, where warmed primary coolant is cooled to form cooled primary coolant. Cooled primary coolant is then flowed from chiller 630 to first row supply manifold 644.

In at least one embodiment, cooled primary coolant of a fourth cooling loop 634, such as cooled water, is flowed from chiller 630 to one or more second CDUs disposed in immersion coolant tanks 610. In at least one embodiment, each immersion coolant tank 610 includes a corresponding second CDU. In at least one embodiment, a second row supply manifold 654 receives cooled primary coolant from chiller 630 and distributes cooled primary coolant to one or more second CDUs disposed in immersion coolant tanks 610. In at least one embodiment, cooled primary coolant may flow from second row supply manifold 654 to second CDUs via one or more second supply valves 674. In at least one embodiment, a second supply valve 674 can be closed to stop flow of cooled primary coolant from chiller 630 to a second CDU within a corresponding tank 610. In at least one embodiment, second supply valve 674 can be at least partially closed and/or opened to regulate flow of cooled primary coolant. In at least one embodiment, second CDUs within tanks 610 may be fluidly coupled to second row supply manifold 654 via a quick-disconnecting coupler. In at least one embodiment, second supply valve 674 may be fluidly coupled to second row supply manifold 654 and/or a second CDUs within a tank 610 via one or more quick-disconnecting couplers. In at least one embodiment, second supply valve 674 is coupled to second row supply manifold 654.

In at least one embodiment, cooled primary coolant flows through a second CDU disposed within an immersion coolant tank 610 to cool second coolant circulating within a tank 610 to cool one or more low-power server components of one or more servers within a tank 610 by immersion cooling. In at least one embodiment, heat from one or more low-power server components is exchanged from second coolant within a tank 610 with cooled primary coolant in a second CDU. Cooled primary coolant may be warmed by second coolant in a heat exchanger of a second CDU to form warmed primary coolant. In at least one embodiment, warmed primary coolant flows from a second CDU within a tank 610 to second row return manifold 656. In at least one embodiment, warmed primary coolant may flow from a second CDU to second row return manifold 656 through a second return valve 676. In at least one embodiment, a second return valve 676 can be at least partially closed and/or opened to regulate flow of warmed primary coolant. In at least one embodiment, one or more second CDUs may be fluidly coupled to a second row return manifold 656 via a quick-disconnecting coupler. In at least one embodiment, second return valve 676 may be fluidly coupled to second row return manifold 656 and/or one or more second CDUs within tanks 610 via one or more quick-disconnecting couplers. In at least one embodiment, second return valve 676 is coupled to second row return manifold 656. In at least one embodiment, second row return manifold 656 collects warmed primary coolant from multiple second CDUs disposed within tanks 610. In at least one embodiment, warmed primary coolant flows from second row return manifold 656 to chiller 630, where warmed primary coolant is cooled to form cooled primary coolant. Cooled primary coolant is then flowed from chiller 630 to second row supply manifold 654.

In at least one embodiment, where system 600 includes multiple rows of immersion coolant tanks 610, system 600 includes a corresponding first row supply manifold 644, first row return manifold 646, second row supply manifold 654, and second row return manifold 656 for each row of tanks 610.

Figure 7:
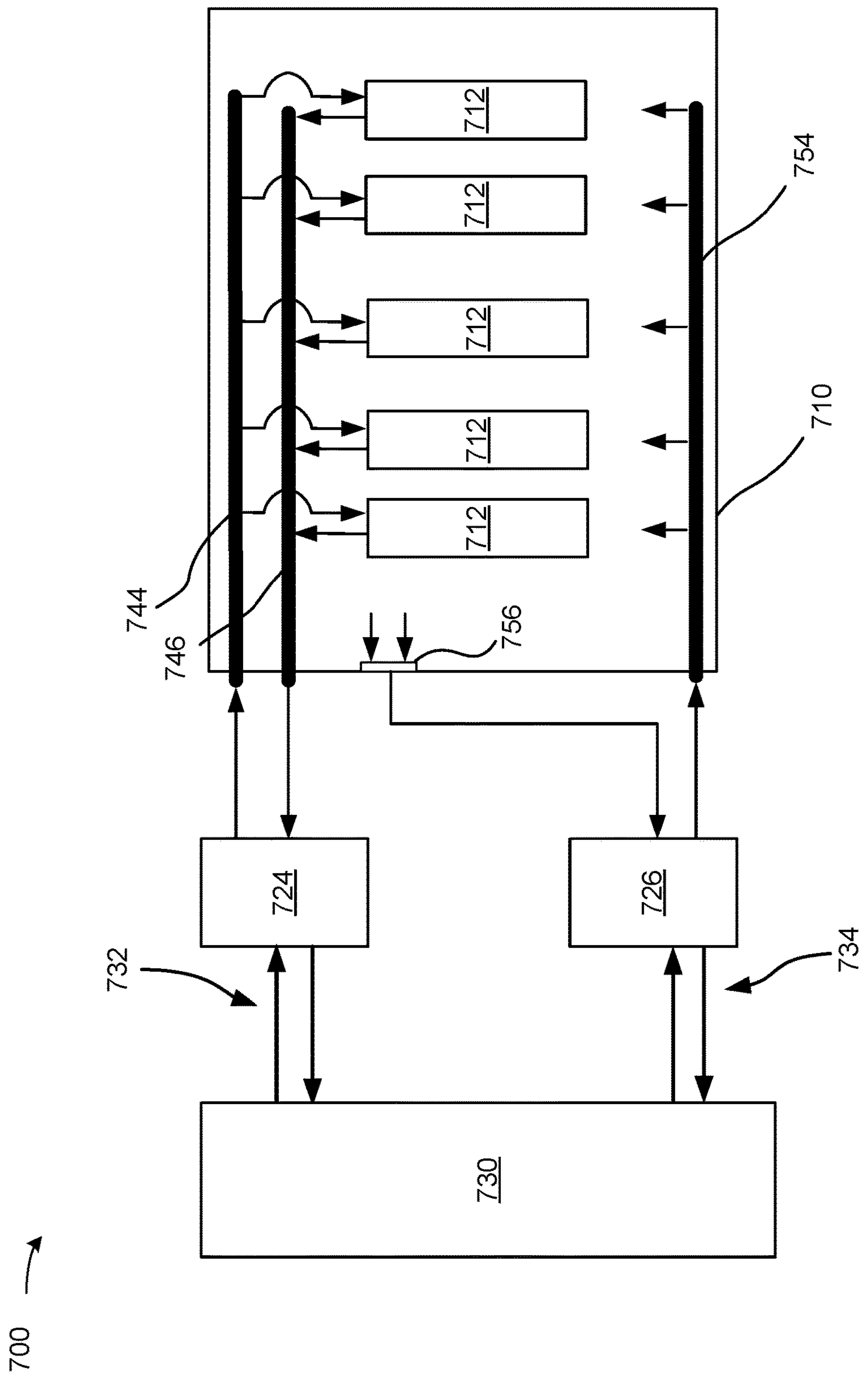
FIG. 7 illustrates a schematic diagram of a tank-based dual-mode datacenter cooling system, according to at least one embodiment.

FIG. 7 illustrates a schematic diagram of a tank-based dual-mode datacenter cooling system 700, according to at least one embodiment. Features illustrated in FIG. 7 having similar numbering to features shown in other figures may have similar functions.

In at least one embodiment, first coolant is flowed along one or more flow paths of one or more first cooling loops from first CDU 724 to servers 712. In at least one embodiment, first CDU 724 is disposed external to immersion coolant tank 710. In at least one embodiment, first coolant is flowed from first CDU 724 to servers 712 via first supply manifold 744 to cool one or more high-power server components. In at least one embodiment, first coolant flows from servers 712 to first CDU 724 via first return manifold 746 to carry heat away from servers 712. In at least one embodiment, first coolant exchanges heat with primary coolant of a third cooling loop 732 within a heat exchanger of first CDU 724. In at least one embodiment, third cooling loop 732 flows a primary coolant such as water between chiller 730 and first CDU 724 to cool first coolant.

In at least one embodiment, second coolant is flowed along one or more flow paths of one or more second cooling loops from second CDU 726 to servers 712. In at least one embodiment, second coolant is flowed from second CDU 726 to servers 712 via second supply manifold 754. In at least one embodiment, second coolant circulates within immersion tank 710 by convection. In at least one embodiment, second coolant cools one or more low-power components of servers 712. In at least one embodiment, second coolant returns to second CDU 726 via second coolant return opening 756. In at least one embodiment, second coolant exchanges heat with primary coolant of a fourth cooling loop 734 within a heat exchanger of second CDU 726. In at least one embodiment, fourth cooling loop 734 flows primary coolant between chiller 730 and second CDU 726 to cool second coolant.

Figure 8:
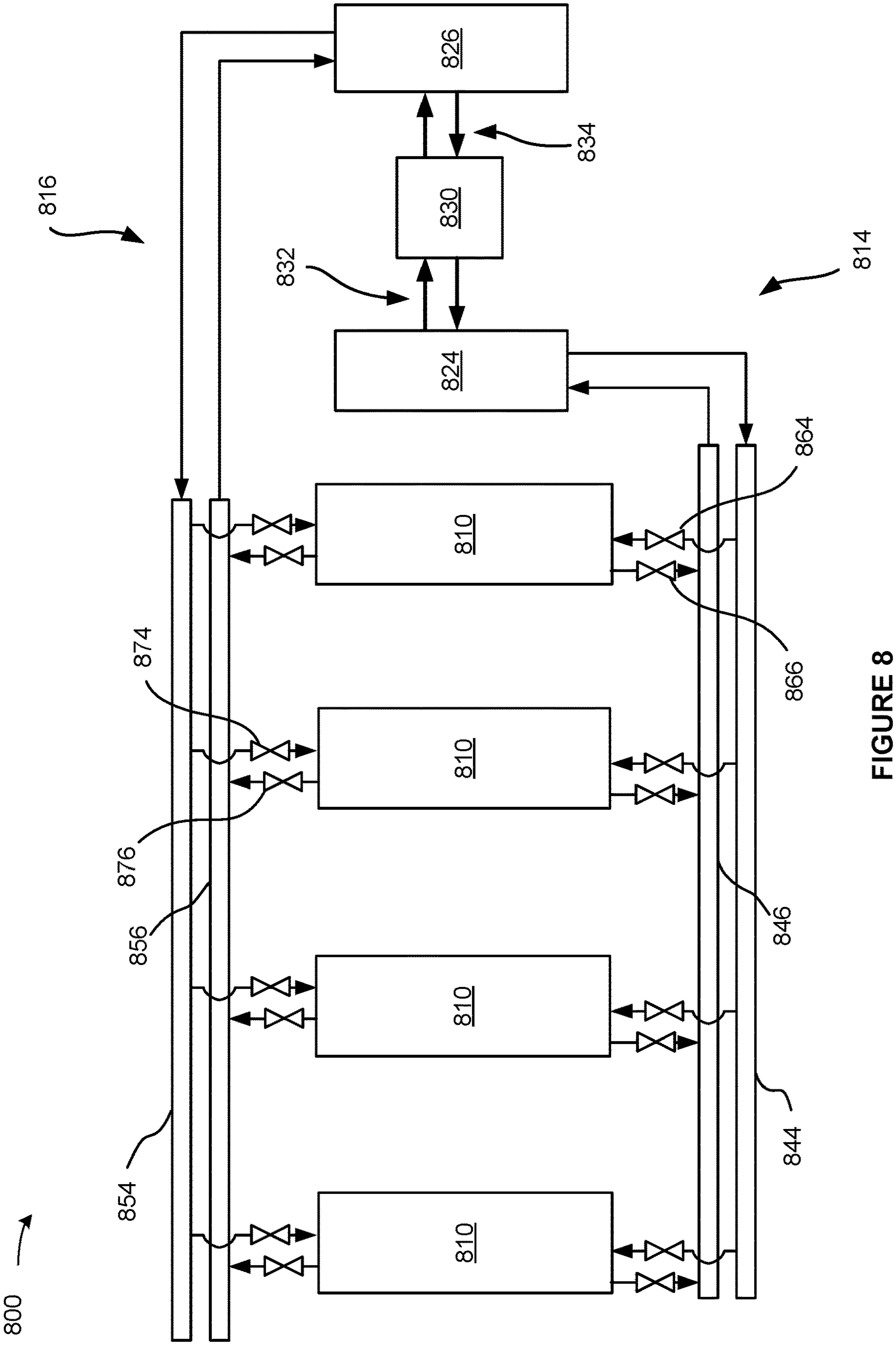
FIG. 8 illustrates a schematic diagram of a tank-based dual-mode datacenter cooling system, according to at least one embodiment.

FIG. 8 illustrates a schematic diagram of a tank-based dual-mode datacenter cooling system 800, according to at least one embodiment. Feature illustrated in FIG. 8 having similar numbering to features shown in other figures may have similar functions.

In at least one embodiment, first coolant is flowed from a first CDU 824 to one or more servers disposed in immersion coolant tanks 810. In at least one embodiment, tanks 810 are disposed in a row, forming a row of tanks 810. In at least one embodiment, a first row supply manifold 844 receives first coolant from first CDU 824 and distributes first coolant to one or more servers disposed within tanks 810. In at least one embodiment, first coolant may flow from first row supply manifold 844 to one or more first tank supply manifolds within a tank 810 through a first supply valve 864. In at least one embodiment, first supply valve 864 can be closed to stop flow of first coolant. In at least one embodiment, first supply valve 864 can be at least partially closed and/or opened to regulate flow of first coolant. In at least one embodiment, first tank supply manifolds disposed within tanks 810 may be fluidly coupled to first row supply manifold 844 via a quick-disconnecting coupler (e.g., a quick-disconnect, etc.). In at least one embodiment, a first supply valve 864 may be fluidly coupled to first row supply manifold 844 and/or a first tank supply manifold via one or more quick-disconnecting couplers. In at least one embodiment, a first supply valve 864 is coupled to (e.g., mounted on) first row supply manifold 844. In at least one embodiment, first coolant flows from a first tank supply manifold to one or more servers at least partially submerged in an immersion coolant tank 810. In at least one embodiment, first coolant may flow via one or more conduits, such as pipes or tubes, from a first tank supply manifold to servers in a tank 810.

In at least one embodiment, first coolant is flowed into one or more cold plates to cool one or more high-power server components such as a CPU or GPU. In at least one embodiment, first coolant removes heat from high-power server components and flows to a first tank return manifold. In at least one embodiment, first coolant flows through one or more conduits from cold plates of servers to a first tank return manifold disposed within an immersion coolant tank 810. In at least one embodiment, a first tank return manifold collects heated first coolant from one or more servers in a corresponding tank 810. In at least one embodiment, first coolant then flows from a first tank return manifold to first row return manifold 846. In at least one embodiment, first coolant may flow from a first tank return manifold to first row return manifold 846 through a first return valve 866. In at least one embodiment, first return valve 866 can be closed to stop flow of first coolant. In at least one embodiment, first return valve 866 can be at least partially closed and/or opened to regulate flow of first coolant. In at least one embodiment, one or more first tank return manifolds may be fluidly coupled to a first row return manifold 846 via a quick-disconnecting coupler. In at least one embodiment, first return valve 866 may be fluidly coupled to a first row return manifold 846 and/or one or more first tank return manifolds via one or more quick-disconnecting couplers. In at least one embodiment, a first return valve 866 is coupled to first row return manifold 846. In at least one embodiment, first row return manifold 846 collects first coolant from multiple first tank return manifolds. In at least one embodiment, first coolant flows from first row return manifold 846 to first CDU 824 where first coolant is cooled by cooled primary coolant of a third cooling loop 832 and returned to first row supply manifold 844. In at least one embodiment, primary coolant of a third cooling loop 832 is cooled by a chiller 830.

In at least one embodiment, second coolant is flowed from second CDU 826 to one or more servers disposed in coolant immersion tanks 810. In at least one embodiment, a second row supply manifold 854 receives second coolant from second CDU 826 and distributes second coolant to second tank supply manifolds disposed within immersion coolant tanks 810. In at least one embodiment, second coolant may flow from second row supply manifold 854 to second tank supply manifolds through one or more second supply valves 874. In at least one embodiment, a second supply valve 874 can be closed to stop flow of second coolant. In at least one embodiment, second supply valve 874 can be at least partially closed and/or opened to regulate flow of second coolant. In at least one embodiment, second tank supply manifolds may be fluidly coupled to second row supply manifold 854 via a quick-disconnecting coupler. In at least one embodiment, second supply valve 874 may be fluidly coupled to second row supply manifold 854 and/or one or more second tank supply manifolds via one or more quick-disconnecting couplers. In at least one embodiment, a second supply valve 874 is coupled to second row supply manifold 854. In at least one embodiment, second coolant flows from a second a tank supply manifold to fill an immersion coolant tank 810. In at least one embodiment, second coolant may flow to one or more servers in a tank 810 by convection.

In at least one embodiment, second coolant is circulated amongst one or more servers submerged in one or more immersion coolant tanks 810 to cool one or more low-power server components by immersion cooling and/or to provide secondary cooling of one or more high-power server components by immersion cooling. In at least one embodiment, after receiving heat from one or more low-power server components, heated second coolant flows from an immersion coolant tank through a second coolant return opening of a tank 810. In at least one embodiment, a second coolant return opening is an opening in a sidewall of an immersion coolant tank 810. In at least one embodiment, a second coolant return opening is disposed proximate a top of a tank 810. In at least one embodiment, second coolant flows from a second coolant return opening to second row return manifold 856. In at least one embodiment, second coolant may flow from a second coolant return opening to second row return manifold 856 through a second return valve 876. In at least one embodiment, second return valve 876 can be closed to stop flow of second coolant. In at least one embodiment, second return valve 876 can be at least partially closed and/or opened to regulate flow of second coolant. In at least one embodiment, a second coolant return opening may be fluidly coupled to a second row return manifold 856 via a quick-disconnecting coupler. In at least one embodiment, second return valve 876 may be fluidly coupled to second row return manifold 856 and/or a second coolant return opening via one or more quick-disconnecting couplers. In at least one embodiment, second return valve 876 is coupled to second row return manifold 856. In at least one embodiment, second row return manifold 856 collects second coolant from multiple second coolant return openings of multiple immersion coolant tanks 810. In at least one embodiment, second coolant flows from second row return manifold 856 to second CDU 826 where second coolant is cooled by cooled primary coolant of a fourth cooling loop 834 and returned to second row supply manifold 854. In at least one embodiment, primary coolant of a fourth cooling loop 834 is cooled by a chiller 830. In at least one embodiment, first coolant and second coolant are flowed so that first coolant and second coolant do not mix with each other nor with primary coolant of third or fourth cooling loops.

Figure 9:
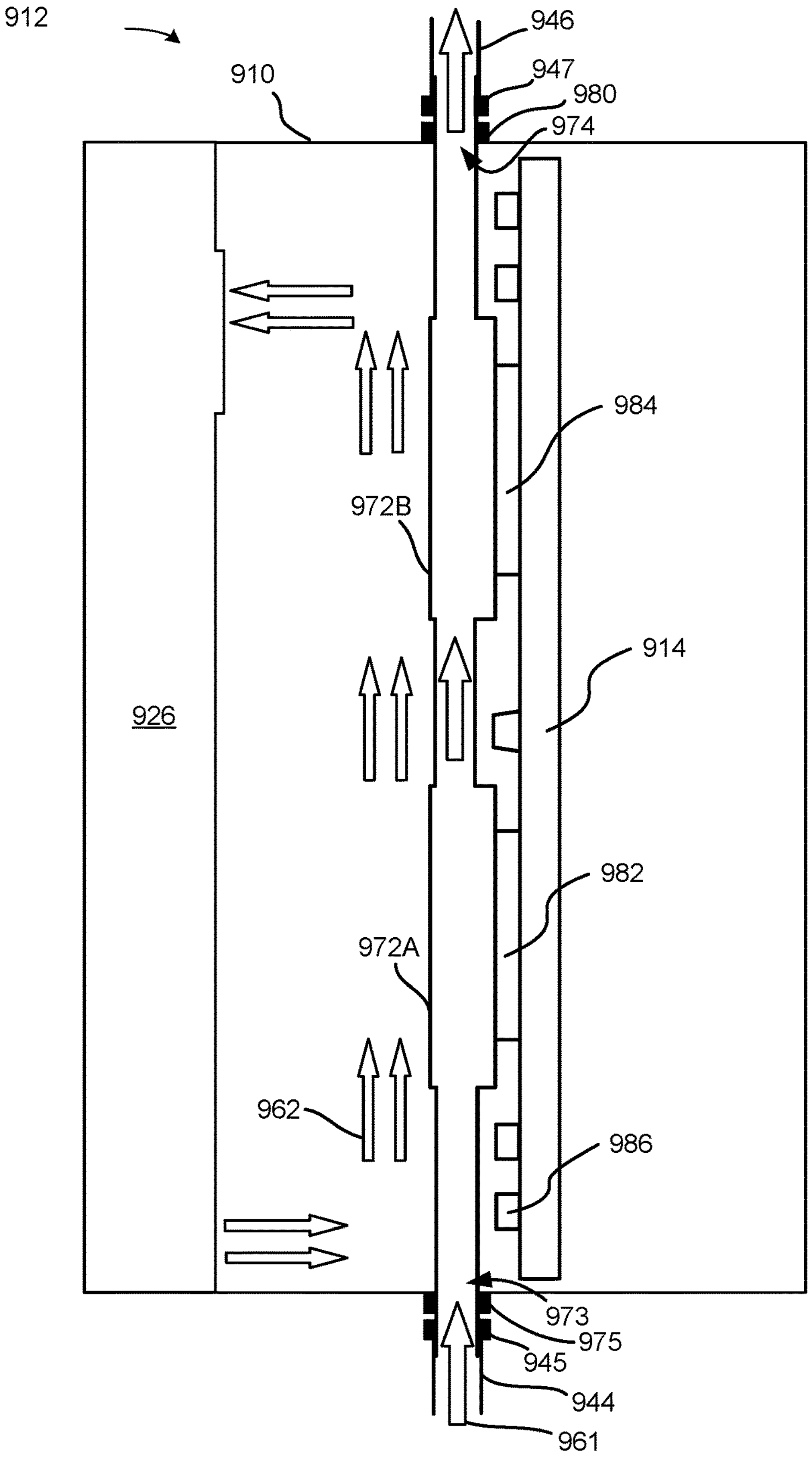
FIG. 9 illustrates an example server cooled by tank-based dual-mode cooling, according to at least one embodiment.

FIG. 9 illustrates an example server 912 cooled by tank-based dual-mode cooling, according to at least one embodiment. In at least one embodiment, server 912 is disposed within an immersion coolant tank 910. In at least one embodiment, server 912 is supported in an at least partially submerged state in dielectric immersion coolant. In at least one embodiment, server 912 may be supported substantially vertically in an immersion coolant tank 910. In at least one embodiment, server 912 may be supported substantially horizontally in an immersion coolant tank 910. In at least one embodiment, one or more server components may be coupled to a printed circuit board (PCB) 914. In at least one embodiment, PCB 914 may include connections to interconnect server components. In at least one embodiment, server 912 includes mounting brackets, mounting holes, and/or mounting slots so that server 912 can be accepted and supported in a datacenter immersion coolant tank.

In at least one embodiment, server 912 receives first coolant 961 through opening 973. In at least one embodiment, opening 973 is disposed proximate a bottom of server 912 while server 912 is supported in an immersion coolant tank 910 as shown in FIG. 9. In at least one embodiment, opening 973 may be disposed proximate a top of server 912 or a side of server 912. In at least one embodiment, opening 973 includes a quick-disconnect feature 975 that allows connection to a coolant supply manifold. In at least one embodiment, quick-disconnect feature 975 is a male quick-disconnect feature or a female quick-disconnect feature. In at least one embodiment, a conduit 944 having a quick-disconnect feature 945 is coupled to server 912 at opening 973 via quick-disconnect feature 975 (e.g., a female quick-disconnect feature if quick-disconnect feature 975 is a male quick-disconnect feature or a male quick-disconnect feature if quick disconnect feature 975 is a female quick-disconnect feature). In at least one embodiment, quick-disconnect feature 945 of conduit 944 and quick-disconnect feature 975 of opening 973 make up a quick-disconnecting coupler. In at least one embodiment, first coolant flows along a flow path of a first cooling loop, such as first cooling loop 214 of FIG. 2. In at least one embodiment, first coolant 961 flows through one or more conduits of server 912 to cold plates 972A and 972B. In at least one embodiment, cold plates 972A and 972B are associated with a first datacenter cooling loop. In at least one embodiment, each of cold plates 972A and 972B are coupled to high-power server components, such as server processing units. In at least one embodiment, cold plates 972A and 972B are coupled to CPU 982 and/or GPU 984 respectively.

In at least one embodiment, cold plates 972A and 972B are arranged in series with conduits connecting cold plates 972A and 972B. In at least one embodiment, one or more cold plates 972 are arranged in parallel. In at least one embodiment, where cold plates 972 are arranged in series, first coolant may first flow to a first cold plate 972A and then to a second cold plate 972B via a conduit connecting first cold plate 972A to second cold plate 972B, as illustrated in FIG. 9. In at least one embodiment, where cold plates 972 are arranged in parallel, a first portion of first coolant may flow to a first cold plate and a second portion of first coolant may flow to a second cold plate. In at least one embodiment, a first portion and a second portion of first coolant may rejoin after flowing through respective cold plates. In at least one embodiment, first coolant 961 flows vertically through cold plates 972A and 972B. In at least one embodiment, first coolant 961 flows horizontally through cold plates 972A and 972B. In at least one embodiment, first coolant 961 flows through cold plates 972A and 972B in a direction and/or orientation not illustrated in FIG. 9.

In at least one embodiment, while flowing through cold plates 972A and 972B, first coolant 961 receives heat from high-power server components such as heat from CPU 982 and/or heat from GPU 983. In at least one embodiment, first coolant 961 is expelled from server 912 through opening 974. In at least one embodiment, opening 974 is disposed proximate a top of server 912 while server 912 is supported in an immersion coolant tank 910. In at least one embodiment, opening 974 may be disposed proximate a bottom of server 912 or a side of server 912. In at least one embodiment, opening 974 includes a quick-disconnect feature 980 that allows connection to a coolant return manifold. In at least one embodiment, quick-disconnect feature 980 is a male quick-disconnect feature or a female quick-disconnect feature. In at least one embodiment, a conduit 946 having a quick-disconnect feature 947 is coupled to server 912 at opening 974 via quick-disconnect feature 980 (e.g., a female quick-disconnect feature if quick-disconnect feature 980 is a male quick-disconnect feature or a male quick-disconnect feature if quick disconnect feature 980 is a female quick-disconnect feature). In at least one embodiment, quick-disconnect feature 947 of conduit 946 and quick-disconnect feature 980 of opening 974 make up a quick-disconnecting coupler. In at least one embodiment, first coolant 961 is received by server 912 at a first temperature and leaves server 912 at a higher second temperature.

In at least one embodiment, server 912 is at least partially submerged in second coolant 962 within immersion coolant tank 910. In at least one embodiment, second coolant 962 is to cool one or more low-power server components 986. In at least one embodiment, low-power server components 986 can include components such as motherboards, power supplies, memory, solid state drives, disc drives, and so on. In at least one embodiment, because second coolant 962 directly contacts many server components, second coolant 962 is a dielectric coolant so as not to create electrical shorts between electrodes or conducting pins on server components. In at least one embodiment, because second coolant 962 is a dielectric coolant, second coolant 962 may have a lower heat capacity compared to first coolant 961. In at least one embodiment, second coolant 962 may be inefficient for cooling high-power server components via cold plate cooling. In at least one embodiment, second coolant 962 may have a higher heat capacity than air, making second coolant 962 used for immersion cooling a better cooling medium than air cooling. In at least one embodiment, second coolant 962 is output by a CDU 926. In at least one embodiment, cool second coolant output by CDU 926 is circulated in immersion coolant tank 910 to cool one or more low-power server components 986. In at least one embodiment, second coolant 962 carrying heat from one or more low-power server components 986 is circulated back to CDU 926. In at least one embodiment, heated second coolant 962 is cooled in CDU 926 by cool liquid coolant from a chiller unit or a cooling tower. In at least one embodiment, cooled second coolant 962 is then recirculated through immersion coolant tank 910. In at least one embodiment, second coolant 962 is output by CDU 926 at a third temperature and is received by CDU 926 at a higher fourth temperature. In at least one embodiment, second coolant 962 flows within immersion coolant tank 910 by convection. In at least one embodiment, second coolant 962 flows within immersion coolant tank 910 by forced convection. In at least one embodiment, CDU 926 and/or immersion coolant tank 910 include one or more pumps, agitators, and/or liquid fans, etc. to force circulation of second coolant 962.

In at least one embodiment, each of quick-disconnect features 975 and 980 may be disconnected from corresponding quick-disconnect features 945 and 947. In at least one embodiment, server 912 may then be removed from an immersion coolant tank 910 and/or may be opened for maintenance.

Figure 10:
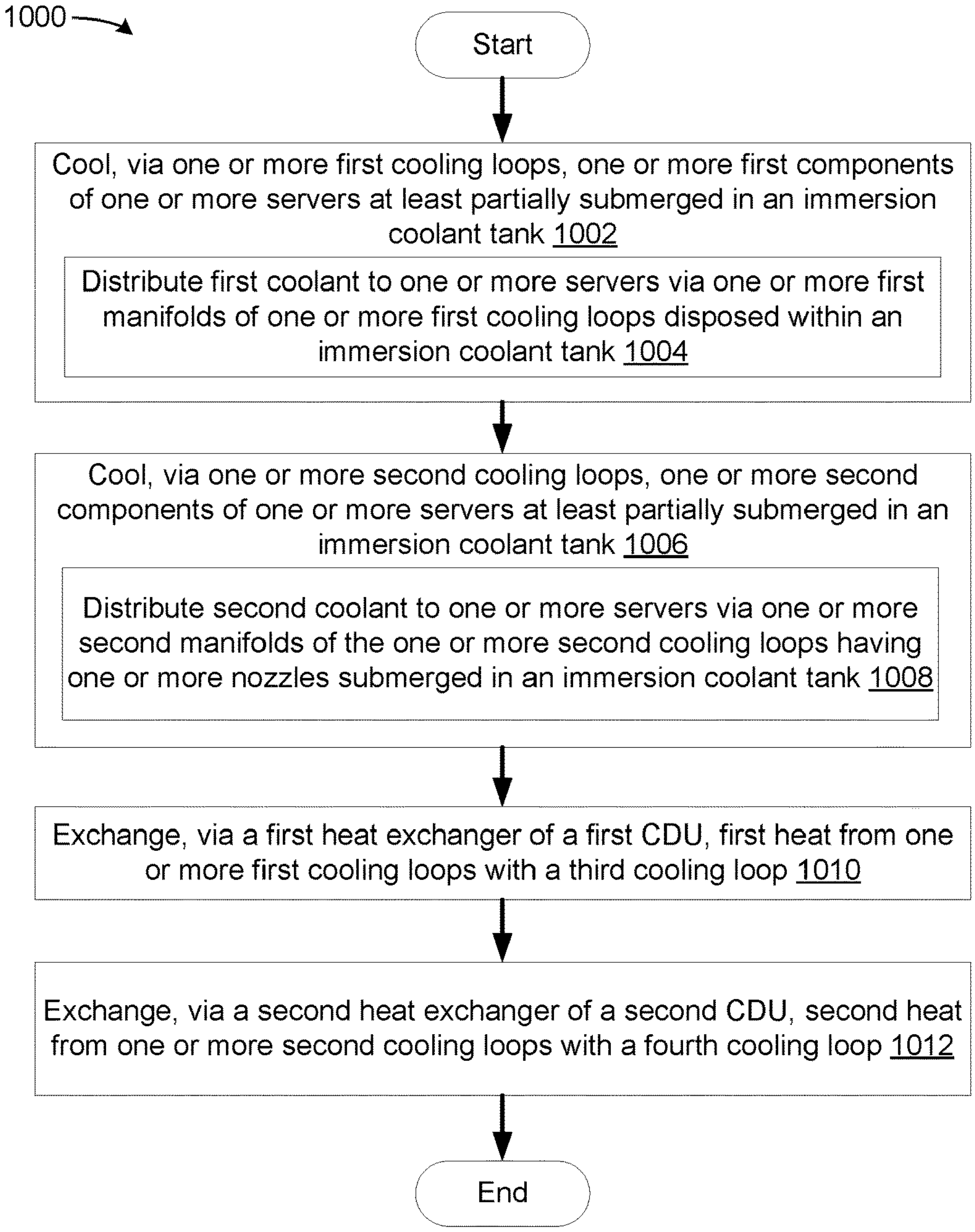
FIG. 10 illustrates a flow diagram of an example method for cooling a datacenter, according to at least one embodiment.

FIG. 10 illustrates a flow diagram of an example method 1000 for cooling a datacenter, according to at least one embodiment. In at least one embodiment, method 1000 can be performed by a tank-based dual mode data center cooling system. In at least one embodiment, method 1000 can be performed by one of systems 200, 300, 400, 500, 600, 700, or 800.

For simplicity of explanation, method 1000 is depicted and described as a series of operations. However, operations in accordance with this disclosure can occur in various orders and/or concurrently and with other operations not presented and described herein. Furthermore, not all illustrated operations may be performed to implement method 1000 in accordance with disclosed subject matter.

In at least one embodiment, at block 1002, a system cools, via one or more first cooling loops, one or more first components of one or more servers at least partially submerged in an immersion coolant tank. In at least one embodiment, one or more first components may have a first power density. In at least one embodiment, at block 1004, a system distributes first coolant to one or more servers via one or more first manifolds of one or more first cooling loops disposed within an immersion coolant tank. In at least one embodiment, first coolant is flowed along one or more first cooling loops to one or more cold plates that are coupled to one or more first components of servers submerged in immersion coolant in one or more immersion coolant tanks. In at least one embodiment, first server components have a first power density that is above a threshold power density.

In at least one embodiment, first server components output heat that is greater than a threshold amount of heat. In at least one embodiment, one or more first manifolds distribute first coolant to one or more datacenter immersion coolant tanks and/or rows of datacenter immersion coolant tanks. In at least one embodiment, each datacenter immersion coolant tank supports at least one server in an at least partially submerged state.

In at least one embodiment, at block 1006, a system cools, via one or more second cooling loops, one or more second components of one or more servers at least partially submerged in an immersion coolant tank. In at least one embodiment, one or more second components may have a second power density. In at least one embodiment, at block 1008, a system distributes second coolant to one or more servers via one or more second manifolds of one or more second coolant loops having one or more nozzles submerged in an immersion coolant tank. In at least one embodiment, second coolant is flowed along one or more second cooling loops to one or more servers in one or more immersion coolant tanks. In at least one embodiment, second coolant is flowed into an immersion coolant tank through a manifold having one or more nozzles submerged in second coolant in an immersion coolant tank to cool one or more second server components. In at least one embodiment, second coolant circulates within an immersion coolant tank by convection. In at least one embodiment, second coolant cools second server components by immersion cooling. In at least one embodiment, second coolant is a dielectric liquid coolant. In at least one embodiment, second server components have a second power density that is below a threshold power density. In at least one embodiment, second components output heat that is less than a threshold amount of heat. In at least one embodiment, one or more second manifolds distribute second coolant to one or more datacenter immersion coolant tanks and/or rows of datacenter immersion coolant tanks.

In at least one embodiment, at block 1010, a system exchanges, via a first heat exchanger of a first CDU, first heat from one or more first cooling loops with a third cooling loop. In at least one embodiment, one or more first cooling loops carry first heat away from one or more servers. In at least one embodiment, first coolant is flowed into a first CDU where a first heat exchanger exchanges heat between a first coolant and a primary coolant of a third cooling loop such as water or another coolant. In at least one embodiment, a first coolant is cooled by primary coolant which is in turn heated by first coolant. In at least one embodiment, primary coolant is flowed to a cooling tower or a chiller along a flow path of a third cooling loop where primary coolant is cooled, then returned back to a first CDU to receive heat from a first cooling loop.

In at least one embodiment, at block 1012, a system exchanges, via a second heat exchanger of a second CDU, second heat from one or more second cooling loops with a fourth cooling loop. In at least one embodiment, one or more second cooling loops carry second heat away from one or more servers. In at least one embodiment, second coolant is flowed into a second CDU where a heat exchanger exchanges heat between second coolant and primary coolant of a fourth cooling loop such as water or another coolant. In at least one embodiment, second coolant is cooled by primary coolant, which is in turn heated by second coolant. In at least one embodiment, primary coolant is flowed to a cooling tower or a chiller along a flow path of a fourth cooling loop where primary coolant is cooled, then returned back to a second CDU to receive heat from a second cooling loop. In at least one embodiment, primary coolant of a third cooling loop and primary coolant of a fourth cooling loop are a same coolant and may share at least a portion of a flow path.

Figure 11:
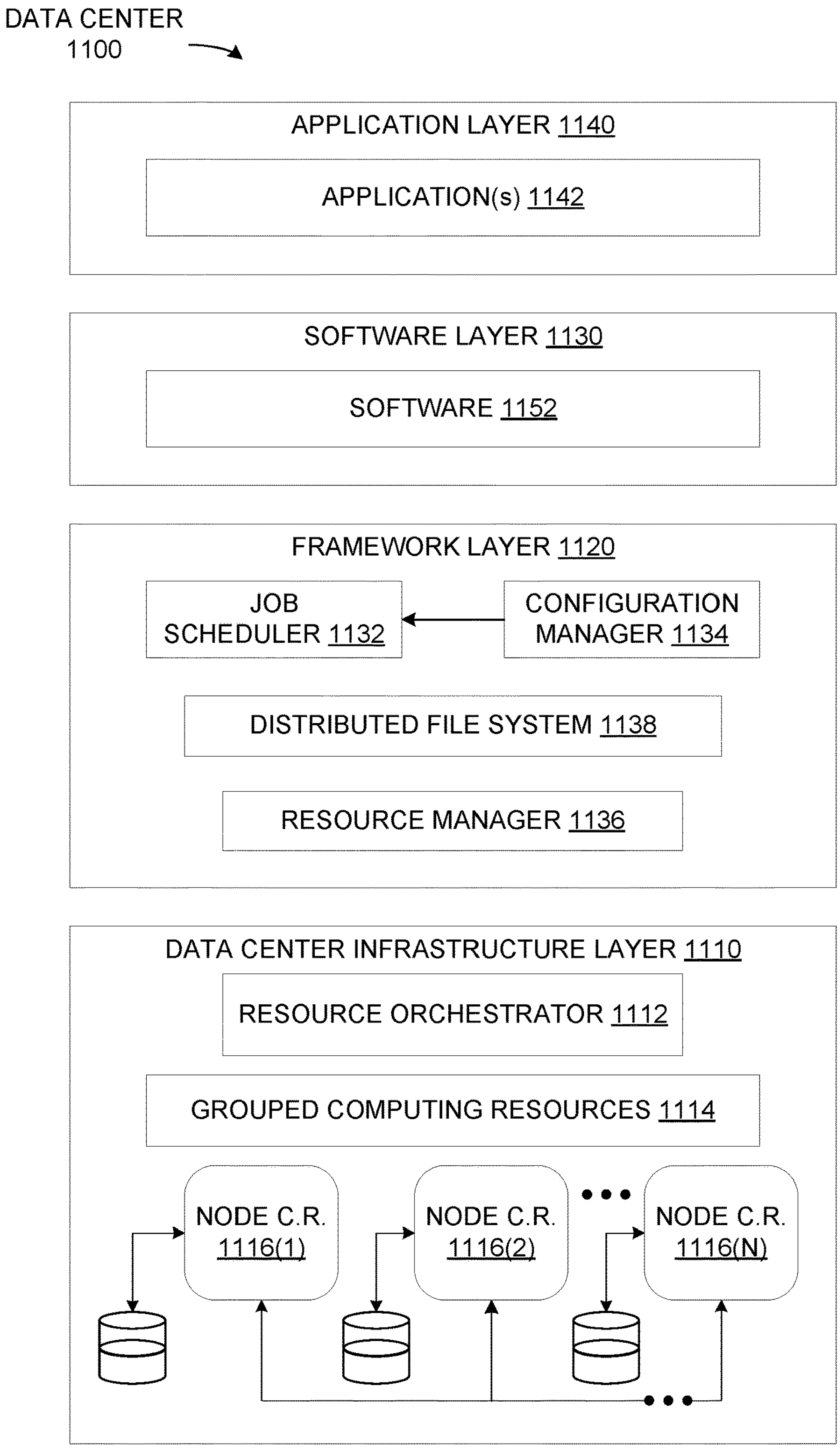
FIG. 11 illustrates an exemplary data center, in accordance with at least one embodiment.

FIG. 11 illustrates an exemplary data center 1100, in accordance with at least one embodiment. In at least one embodiment, data center 1100 includes, without limitation, a data center infrastructure layer 1110, a framework layer 1120, a software layer 1130 and an application layer 1140.

In at least one embodiment, as shown in FIG. 11, data center infrastructure layer 1110 may include a resource orchestrator 1112, grouped computing resources 1114, and node computing resources ("node C.R.s") 1116(1)-1116(N), where "N" represents any whole, positive integer. In at least one embodiment, node C.R.s 1116(1)-1116(N) may include, but are not limited to, any number of central processing units ("CPUs") or other processors (including accelerators, field programmable gate arrays ("FPGAs"), graphics processors, etc.), memory devices (e.g., dynamic read-only memory), storage devices (e.g., solid state or disk drives), network input/output ("NW I/O") devices, network switches, virtual machines ("VMs"), power modules, and cooling modules, etc. In at least one embodiment, one or more node C.R.s from among node C.R.s 1116(1)-1116(N) may be a server having one or more of above-mentioned computing resources.

In at least one embodiment, grouped computing resources 1114 may include separate groupings of node C.R.s housed within one or more racks or coolant tanks (not shown), or many racks or coolant tanks housed in data centers at various geographical locations (also not shown). Separate groupings of node C.R.s within grouped computing resources 1114 may include grouped compute, network, memory or storage resources that may be configured or allocated to support one or more workloads. In at least one embodiment, several node C.R.s including CPUs or processors may grouped within one or more racks or coolant tanks to provide computing resources to support one or more workloads. In at least one embodiment, one or more racks or coolant tanks may also include any number of power modules, cooling modules, and network switches, in any combination.

In at least one embodiment, resource orchestrator 1112 may configure or otherwise control one or more node C.R.s 1116(1)-1116(N) and/or grouped computing resources 1114. In at least one embodiment, resource orchestrator 1112 may include a software design infrastructure ("SDI") management entity for data center 1100. In at least one embodiment, resource orchestrator 1112 may include hardware, software or some combination thereof.

In at least one embodiment, as shown in FIG. 11, framework layer 1120 includes, without limitation, a job scheduler 1132, a configuration manager 1134, a resource manager 1136 and a distributed file system 1138. In at least one embodiment, framework layer 1120 may include a framework to support software 1152 of software layer 1130 and/or one or more application(s) 1142 of application layer 1140. In at least one embodiment, software 1152 or application(s) 1142 may respectively include web-based service software or applications, such as those provided by Amazon Web Services, Google Cloud and Microsoft Azure. In at least one embodiment, framework layer 1120 may be, but is not limited to, a type of free and open-source software web application framework such as Apache Spark™ (hereinafter "Spark") that may utilize distributed file system 1138 for large-scale data processing (e.g., "big data"). In at least one embodiment, job scheduler 1132 may include a Spark driver to facilitate scheduling of workloads supported by various layers of data center 1100. In at least one embodiment, configuration manager 1134 may be capable of configuring different layers such as software layer 1130 and framework layer 1120, including Spark and distributed file system 1138 for supporting large-scale data processing. In at least one embodiment, resource manager 1136 may be capable of managing clustered or grouped computing resources mapped to or allocated for support of distributed file system 1138 and job scheduler 1132. In at least one embodiment, clustered or grouped computing resources may include grouped computing resource 1114 at data center infrastructure layer 1110. In at least one embodiment, resource manager 1136 may coordinate with resource orchestrator 1112 to manage these mapped or allocated computing resources.

In at least one embodiment, software 1152 included in software layer 1130 may include software used by at least portions of node C.R.s 1116(1)-1116(N), grouped computing resources 1114, and/or distributed file system 1138 of framework layer 1120. One or more types of software may include, but are not limited to, Internet web page search software, e-mail virus scan software, database software, and streaming video content software.

In at least one embodiment, application(s) 1142 included in application layer 1140 may include one or more types of applications used by at least portions of node C.R.s 1116 (1)-1116 (N), grouped computing resources 1114, and/or distributed file system 1138 of framework layer 1120. In at least one or more types of applications may include, without limitation, CUDA applications, 5G network applications, artificial intelligence application, data center applications, and/or variations thereof.

In at least one embodiment, any of configuration manager 1134, resource manager 1136, and resource orchestrator 1112 may implement any number and type of self-modifying actions based on any amount and type of data acquired in any technically feasible fashion. In at least one embodiment, self-modifying actions may relieve a data center operator of data center 1100 from making possibly bad configuration decisions and possibly avoiding underutilized and/or poor performing portions of a data center.

Figure 12:
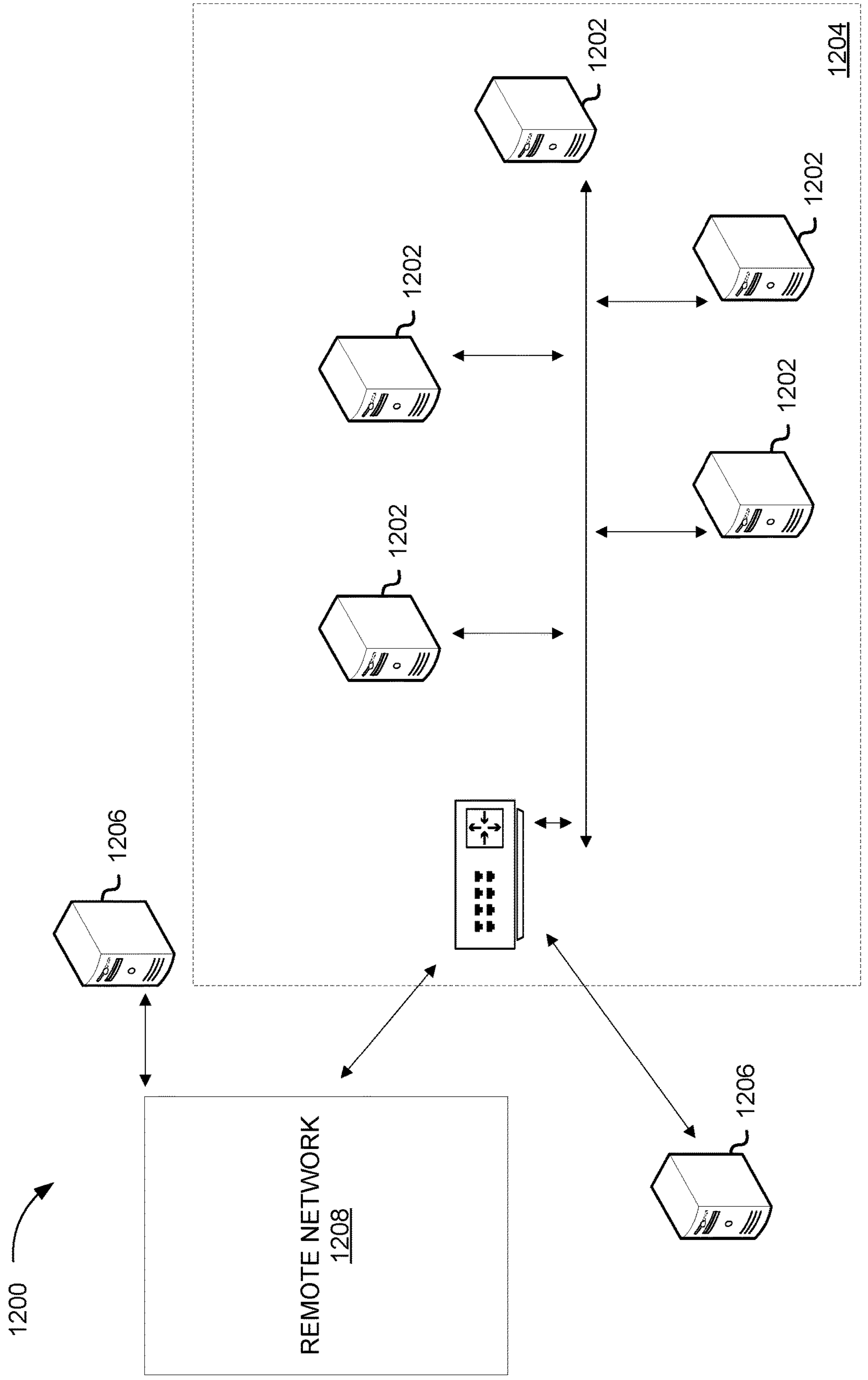
FIG. 12 illustrates a client-server network, in accordance with at least one embodiment.

FIG. 12 illustrates a client-server network 1204 formed by a plurality of network server computers 1202 which are interlinked, in accordance with at least one embodiment. In at least one embodiment, each network server computer 1202 stores data accessible to other network server computers 1202 and to client computers 1206 and networks 1208 which link into a wide area network 1204. In at least one embodiment, configuration of a client-server network 1204 may change over time as client computers 1206 and one or more networks 1208 connect and disconnect from a network 1204, and as one or more trunk line server computers 1202 are added or removed from a network 1204. In at least one embodiment, when a client computer 1206 and a network 1208 are connected with network server computers 1202, client-server network includes such client computer 1206 and network 1208. In at least one embodiment, the term computer includes any device or machine capable of accepting data, applying prescribed processes to data, and supplying results of processes.

In at least one embodiment, client-server network 1204 stores information which is accessible to network server computers 1202, remote networks 1208 and client computers 1206. In at least one embodiment, network server computers 1202 are formed by main frame computers minicomputers, and/or microcomputers having one or more processors each. In at least one embodiment, server computers 1202 are linked together by wired and/or wireless transfer media, such as conductive wire, fiber optic cable, and/or microwave transmission media, satellite transmission media or other conductive, optic or electromagnetic wave transmission media. In at least one embodiment, client computers 1206 access a network server computer 1202 by a similar wired or a wireless transfer medium. In at least one embodiment, a client computer 1206 may link into a client-server network 1204 using a modem and a standard telephone communication network. In at least one embodiment, alternative carrier systems such as cable and satellite communication systems also may be used to link into client-server network 1204. In at least one embodiment, other private or time-shared carrier systems may be used. In at least one embodiment, network 1204 is a global information network, such as the Internet. In at least one embodiment, network 1204 is a private intranet using similar protocols as the Internet, but with added security measures and restricted access controls. In at least one embodiment, network 1204 is a private, or semi-private network using proprietary communication protocols.

In at least one embodiment, client computer 1206 is any end user computer, and may also be a mainframe computer, mini-computer or microcomputer having one or more microprocessors. In at least one embodiment, server computer 1202 may at times function as a client computer accessing another server computer 1202. In at least one embodiment, remote network 1208 may be a local area network, a network added into a wide area network through an independent service provider (ISP) for the Internet, or another group of computers interconnected by wired or wireless transfer media having a configuration which is either fixed or changing over time. In at least one embodiment, client computers 1206 may link into and access a network 1204 independently or through a remote network 1208.

Figure 13:
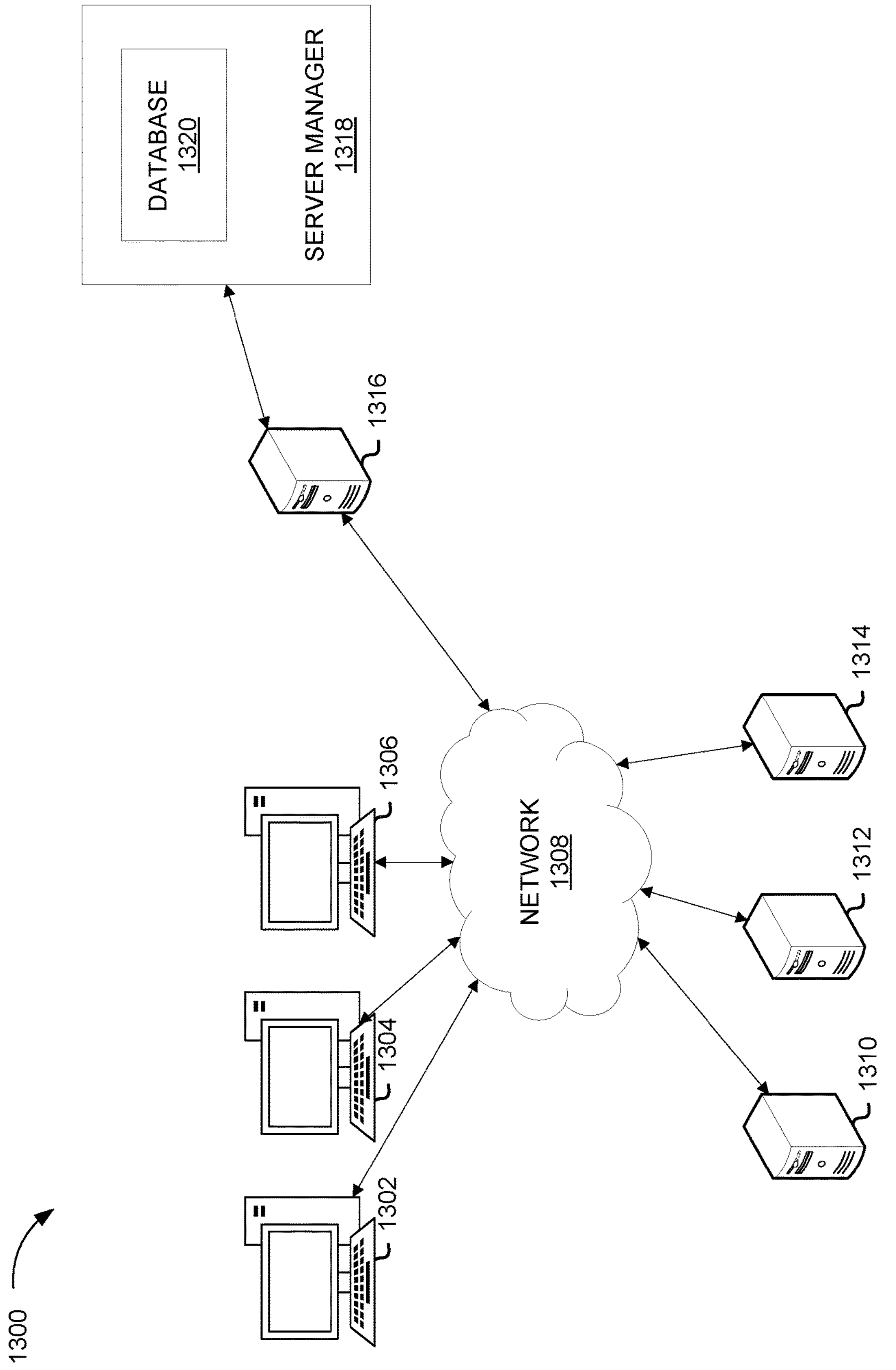
FIG. 13 illustrates a computer network, in accordance with at least one embodiment.

FIG. 13 illustrates a computer network 1308 connecting one or more computing machines, in accordance with at least one embodiment. In at least one embodiment, network 1308 may be any type of electronically connected group of computers including, for instance, the following networks: Internet, Intranet, Local Area Networks (LAN), Wide Area Networks (WAN) or an interconnected combination of these network types. In at least one embodiment, connectivity within a network 1308 may be a remote modem, Ethernet (IEEE 802.3), Token Ring (IEEE 802.5), Fiber Distributed Datalink Interface (FDDI), Asynchronous Transfer Mode (ATM), or any other communication protocol. In at least one embodiment, computing devices linked to a network may be desktop, server, portable, handheld, set-top box, personal digital assistant (PDA), a terminal, or any other desired type or configuration. In at least one embodiment, depending on their functionality, network connected devices may vary widely in processing power, internal memory, and other performance aspects. In at least one embodiment, communications within a network and to or from computing devices connected to a network may be either wired or wireless. In at least one embodiment, network 1308 may include, at least in part, the world-wide public Internet which generally connects a plurality of users in accordance with a client-server model in accordance with a transmission control protocol/internet protocol (TCP/IP) specification. In at least one embodiment, client-server network is a dominant model for communicating between two computers. In at least one embodiment, a client computer ("client") issues one or more commands to a server computer ("server"). In at least one embodiment, server fulfills client commands by accessing available network resources and returning information to a client pursuant to client commands. In at least one embodiment, client computer systems and network resources resident on network servers are assigned a network address for identification during communications between elements of a network. In at least one embodiment, communications from other network connected systems to servers will include a network address of a relevant server/network resource as part of communication so that an appropriate destination of a data/request is identified as a recipient. In at least one embodiment, when a network 1308 comprises the global Internet, a network address is an IP address in a TCP/IP format which may, at least in part, route data to an e-mail account, a website, or other Internet tool resident on a server. In at least one embodiment, information and services which are resident on network servers may be available to a web browser of a client computer through a domain name (e.g., www.site.com) which maps to an IP address of a network server.

In at least one embodiment, a plurality of clients 1302, 1304, and 1306 are connected to a network 1308 via respective communication links. In at least one embodiment, each of these clients may access a network 1308 via any desired form of communication, such as via a dial-up modem connection, cable link, a digital subscriber line (DSL), wireless or satellite link, or any other form of communication. In at least one embodiment, each client may communicate using any machine that is compatible with a network 1308, such as a personal computer (PC), work station, dedicated terminal, personal data assistant (PDA), or other similar equipment. In at least one embodiment, clients 1302, 1304, and 1306 may or may not be located in a same geographical area.

In at least one embodiment, a plurality of servers 1310, 1312, and 1314 are connected to a network 1308 to serve clients that are in communication with a network 1308. In at least one embodiment, each server is typically a powerful computer or device that manages network resources and responds to client commands. In at least one embodiment, servers include computer readable data storage media such as hard disk drives and RAM memory that store program instructions and data. In at least one embodiment, servers 1310, 1312, 1314 run application programs that respond to client commands. In at least one embodiment, server 1310 may run a web server application for responding to client requests for HTML pages and may also run a mail server application for receiving and routing electronic mail. In at least one embodiment, other application programs, such as an FTP server or a media server for streaming audio/video data to clients may also be running on a server 1310. In at least one embodiment, different servers may be dedicated to performing different tasks. In at least one embodiment, server 1310 may be a dedicated web server that manages resources relating to web sites for various users, whereas a server 1312 may be dedicated to provide electronic mail (email) management. In at least one embodiment, other servers may be dedicated for media (audio, video, etc.), file transfer protocol (FTP), or a combination of any two or more services that are typically available or provided over a network. In at least one embodiment, each server may be in a location that is the same as or different from that of other servers. In at least one embodiment, there may be multiple servers that perform mirrored tasks for users, thereby relieving congestion or minimizing traffic directed to and from a single server. In at least one embodiment, servers 1310, 1312, 1314 are under control of a web hosting provider in a business of maintaining and delivering third party content over a network 1308.

In at least one embodiment, web hosting providers deliver services to two different types of clients. In at least one embodiment, one type, which may be referred to as a browser, requests content from servers 1310, 1312, 1314 such as web pages, email messages, video clips, etc. In at least one embodiment, a second type, which may be referred to as a user, hires a web hosting provider to maintain a network resource such as a web site, and to make it available to browsers. In at least one embodiment, users contract with a web hosting provider to make memory space, processor capacity, and communication bandwidth available for their desired network resource in accordance with an amount of server resources a user desires to utilize.

In at least one embodiment, in order for a web hosting provider to provide services for both of these clients, application programs which manage a network resources hosted by servers must be properly configured. In at least one embodiment, program configuration process involves defining a set of parameters which control, at least in part, an application program's response to browser requests and which also define, at least in part, a server resource available to a particular user.

In one embodiment, an intranet server 1316 is in communication with a network 1308 via a communication link. In at least one embodiment, intranet server 1316 is in communication with a server manager 1318. In at least one embodiment, server manager 1318 comprises a database of an application program configuration parameters which are being utilized in servers 1310, 1312, 1314. In at least one embodiment, users modify a database 1320 via an intranet 1316, and a server manager 1318 interacts with servers 1310, 1312, 1314 to modify application program parameters so that they match a content of a database. In at least one embodiment, a user logs onto an intranet server 1316 by connecting to an intranet 1316 via computer 1302 and entering authentication information, such as a username and password.

In at least one embodiment, when a user wishes to sign up for new service or modify an existing service, an intranet server 1316 authenticates a user and provides a user with an interactive screen display/control panel that allows a user to access configuration parameters for a particular application program. In at least one embodiment, a user is presented with a number of modifiable text boxes that describe aspects of a configuration of a user's web site or other network resource. In at least one embodiment, if a user desires to increase memory space reserved on a server for its web site, a user is provided with a field in which a user specifies a desired memory space. In at least one embodiment, in response to receiving this information, an intranet server 1316 updates a database 1320. In at least one embodiment, server manager 1318 forwards this information to an appropriate server, and a new parameter is used during application program operation. In at least one embodiment, an intranet server 1316 is configured to provide users with access to configuration parameters of hosted network resources (e.g., web pages, email, FTP sites, media sites, etc.), for which a user has contracted with a web hosting service provider.

Figure 14A:
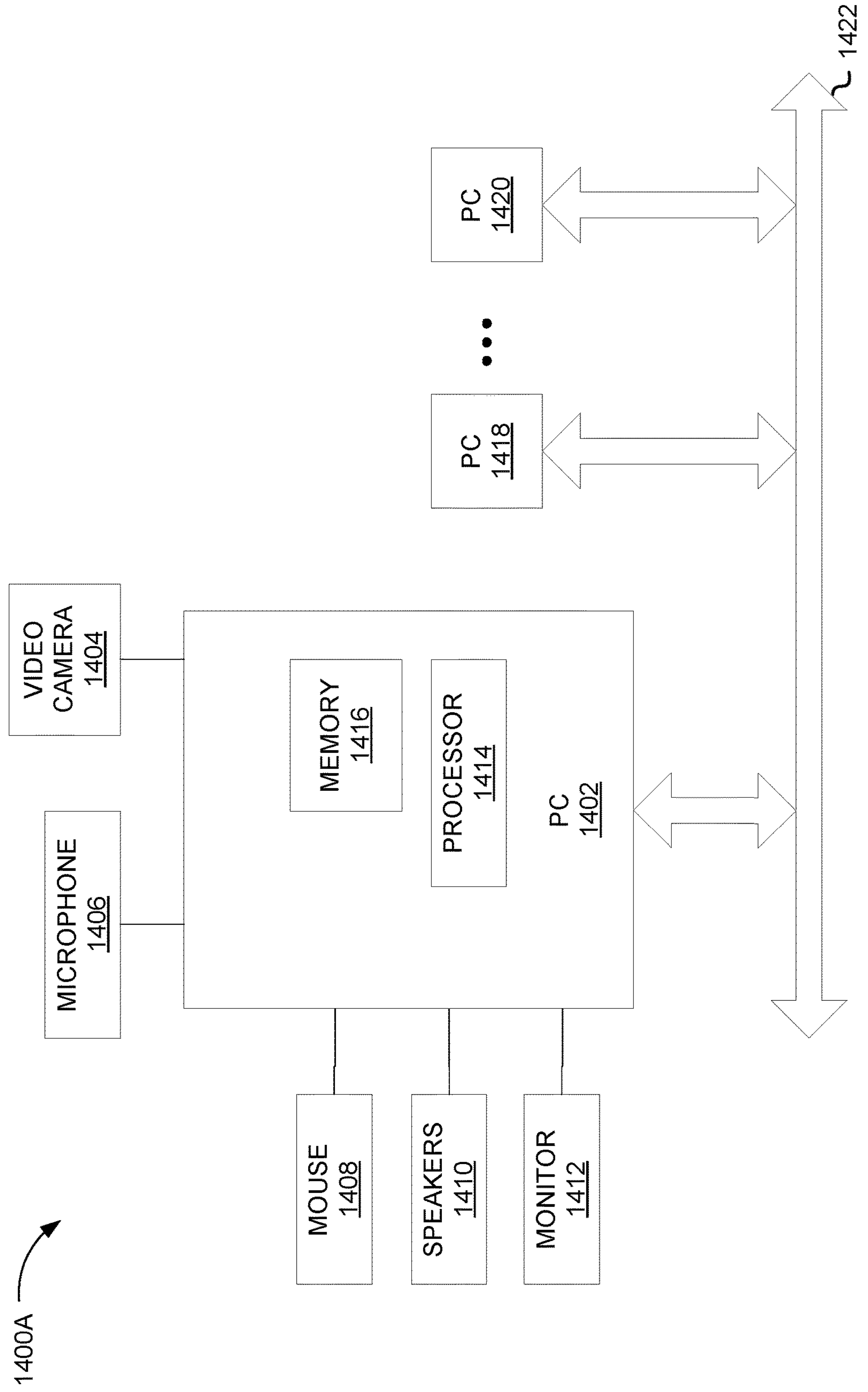
FIG. 14A illustrates a networked computer system, in accordance with at least one embodiment.

FIG. 14A illustrates a networked computer system 1400A, in accordance with at least one embodiment. In at least one embodiment, networked computer system 1400A comprises a plurality of nodes or personal computers ("PCs") 1402, 1418, 1420. In at least one embodiment, personal computer or node 1402 comprises a processor 1414, memory 1416, video camera 1404, microphone 1406, mouse 1408, speakers 1410, and monitor 1412. In at least one embodiment, PCs 1402, 1418, 1420 may each run one or more desktop servers of an internal network within a given company, for instance, or may be servers of a general network not limited to a specific environment. In at least one embodiment, there is one server per PC node of a network, so that each PC node of a network represents a particular network server, having a particular network URL address. In at least one embodiment, each server defaults to a default web page for that server's user, which may itself contain embedded URLs pointing to further subpages of that user on that server, or to other servers or pages on other servers on a network.

In at least one embodiment, nodes 1402, 1418, 1420 and other nodes of a network are interconnected via medium 1422. In at least one embodiment, medium 1422 may be, a communication channel such as an Integrated Services Digital Network ("ISDN"). In at least one embodiment, various nodes of a networked computer system may be connected through a variety of communication media, including local area networks ("LANs"), plain-old telephone lines ("POTS"), sometimes referred to as public switched telephone networks ("PSTN"), and/or variations thereof. In at least one embodiment, various nodes of a network may also constitute computer system users inter-connected via a network such as the Internet. In at least one embodiment, each server on a network (running from a particular node of a network at a given instance) has a unique address or identification within a network, which may be specifiable in terms of an URL.

In at least one embodiment, a plurality of multi-point conferencing units ("MCUs") may thus be utilized to transmit data to and from various nodes or "endpoints" of a conferencing system. In at least one embodiment, nodes and/or MCUs may be interconnected via an ISDN link or through a local area network ("LAN"), in addition to various other communications media such as nodes connected through the Internet. In at least one embodiment, nodes of a conferencing system may, in general, be connected directly to a communications medium such as a LAN or through an MCU, and that a conferencing system may comprise other nodes or elements such as routers, servers, and/or variations thereof.

In at least one embodiment, processor 1414 is a general-purpose programmable processor. In at least one embodiment, processors of nodes of networked computer system 1400A may also be special-purpose video processors. In at least one embodiment, various peripherals and components of a node such as those of node 1402 may vary from those of other nodes. In at least one embodiment, node 1418 and node 1420 may be configured identically to or differently than node 1402. In at least one embodiment, a node may be implemented on any suitable computer system in addition to PC systems.

Figure 14B:
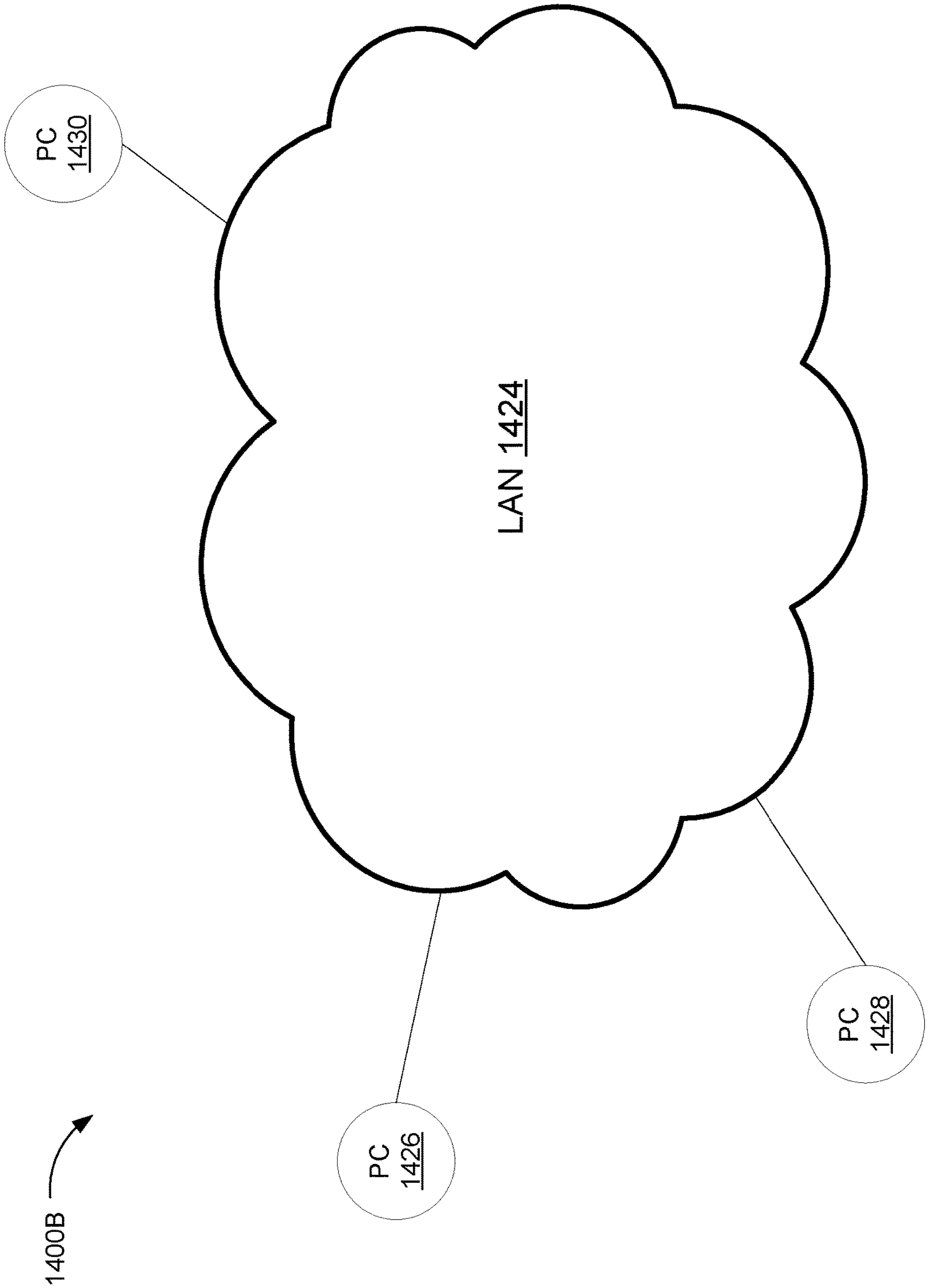
FIG. 14B illustrates a networked computer system, in accordance with at least one embodiment.

FIG. 14B illustrates a networked computer system 1400B, in accordance with at least one embodiment. In at least one embodiment, system 1400B illustrates a network such as LAN 1424, which may be used to interconnect a variety of nodes that may communicate with each other. In at least one embodiment, attached to LAN 1424 are a plurality of nodes such as PC nodes 1426, 1428, 1430. In at least one embodiment, a node may also be connected to the LAN via a network server or other means. In at least one embodiment, system 1400B comprises other types of nodes or elements, for example including routers, servers, and nodes.

Figure 14C:
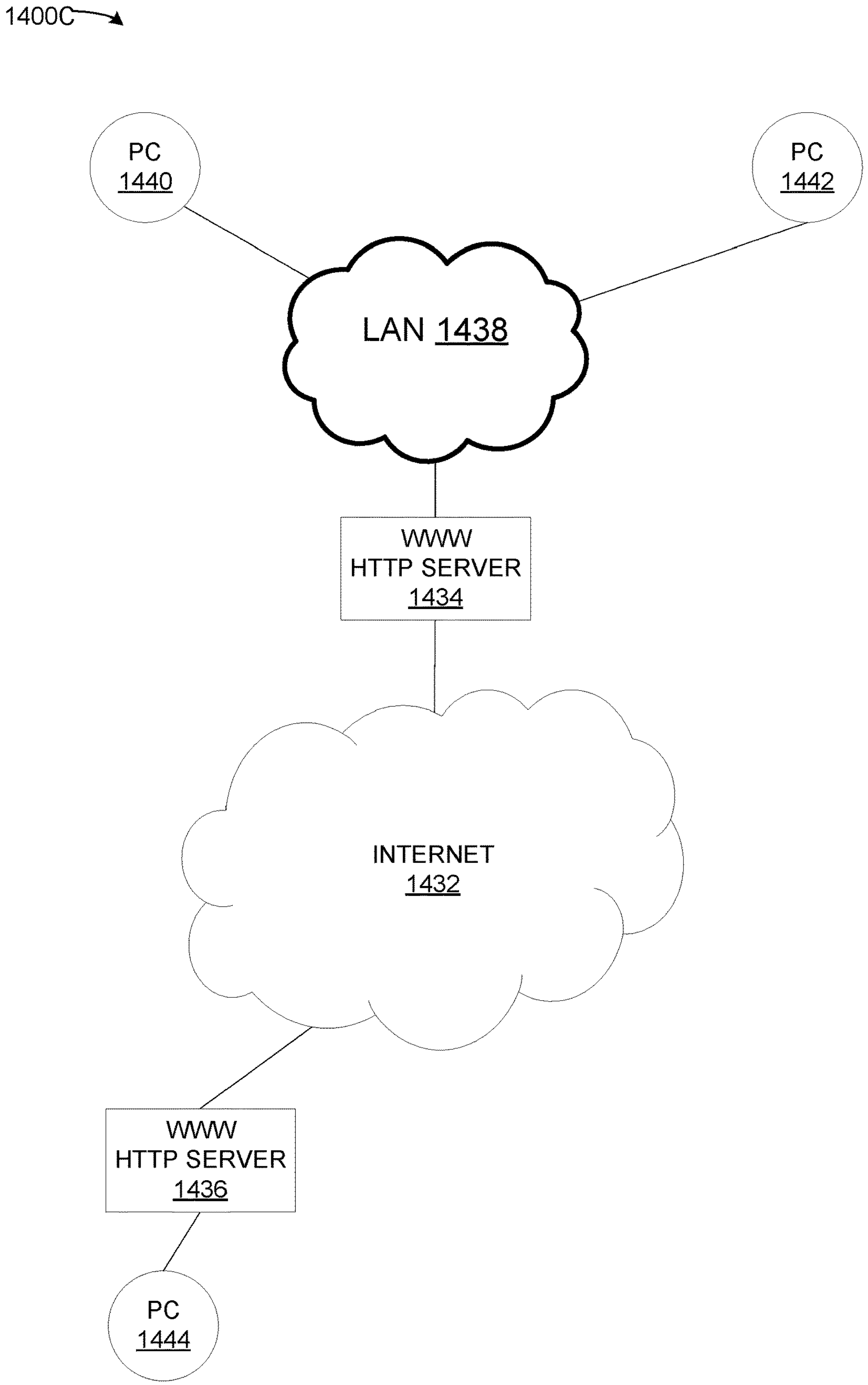
FIG. 14C illustrates a networked computer system, in accordance with at least one embodiment.

FIG. 14C illustrates a networked computer system 1400C, in accordance with at least one embodiment. In at least one embodiment, system 1400C illustrates a WWW system having communications across a backbone communications network such as Internet 1432, which may be used to interconnect a variety of nodes of a network. In at least one embodiment, WWW is a set of protocols operating on top of the Internet, and allows a graphical interface system to operate thereon for accessing information through the Internet. In at least one embodiment, attached to Internet 1432 in WWW are a plurality of nodes such as PCs 1440, 1442, 1444. In at least one embodiment, a node is interfaced to other nodes of WWW through a WWW HTTP server such as servers 1434, 1436. In at least one embodiment, PC 1444 may be a PC forming a node of network 1432 and itself running its server 1436, although PC 1444 and server 1436 are illustrated separately in FIG. 14C for illustrative purposes.

In at least one embodiment, WWW is a distributed type of application, characterized by WWW HTTP, WWW's protocol, which runs on top of the Internet's transmission control protocol/Internet protocol ("TCP/IP"). In at least one embodiment, WWW may thus be characterized by a set of protocols (i.e., HTTP) running on the Internet as its "backbone."

In at least one embodiment, a web browser is an application running on a node of a network that, in WWW-compatible type network systems, allows users of a particular server or node to view such information and thus allows a user to search graphical and text-based files that are linked together using hypertext links that are embedded in documents or files available from servers on a network that understand HTTP. In at least one embodiment, when a given web page of a first server associated with a first node is retrieved by a user using another server on a network such as the Internet, a document retrieved may have various hypertext links embedded therein and a local copy of a page is created local to a retrieving user. In at least one embodiment, when a user clicks on a hypertext link, locally-stored information related to a selected hypertext link is typically sufficient to allow a user's machine to open a connection across the Internet to a server indicated by a hypertext link.

In at least one embodiment, more than one user may be coupled to each HTTP server, for example through a LAN such as LAN 1438 as illustrated with respect to WWW HTTP server 1434. In at least one embodiment, system 1400C may also comprise other types of nodes or elements. In at least one embodiment, a WWW HTTP server is an application running on a machine, such as a PC. In at least one embodiment, each user may be considered to have a unique "server," as illustrated with respect to PC 1444. In at least one embodiment, a server may be considered to be a server such as WWW HTTP server 1434, which provides access to a network for a LAN or plurality of nodes or plurality of LANs. In at least one embodiment, there are a plurality of users, each having a desktop PC or node of a network, each desktop PC potentially establishing a server for a user thereof. In at least one embodiment, each server is associated with a particular network address or URL, which, when accessed, provides a default web page for that user. In at least one embodiment, a web page may contain further links (embedded URLs) pointing to further subpages of that user on that server, or to other servers on a network or to pages on other servers on a network.

Cloud Computing and Services

The following figures set forth, without limitation, exemplary cloud-based systems that can be used to implement at least one embodiment.

In at least one embodiment, cloud computing is a style of computing in which dynamically scalable and often virtualized resources are provided as a service over the Internet. In at least one embodiment, users need not have knowledge of, expertise in, or control over technology infrastructure, which can be referred to as "in the cloud," that supports them. In at least one embodiment, cloud computing incorporates infrastructure as a service, platform as a service, software as a service, and other variations that have a common theme of reliance on the Internet for satisfying computing needs of users. In at least one embodiment, a typical cloud deployment, such as in a private cloud (e.g., enterprise network), or a data center (DC) in a public cloud (e.g., Internet) can consist of thousands of servers (or alternatively, VMs), hundreds of Ethernet, Fiber Channel or Fiber Channel over Ethernet (FCoE) ports, switching and storage infrastructure, etc. In at least one embodiment, cloud can also consist of network services infrastructure like IPsec VPN hubs, firewalls, load balancers, wide area network (WAN) optimizers etc. In at least one embodiment, remote subscribers can access cloud applications and services securely by connecting via a VPN tunnel, such as an IPsec VPN tunnel.

In at least one embodiment, cloud computing is a model for enabling convenient, on-demand network access to a shared pool of configurable computing resources (e.g., networks, servers, storage, applications, and services) that can be rapidly provisioned and released with minimal management effort or service provider interaction.

In at least one embodiment, cloud computing is characterized by on-demand self-service, in which a consumer can unilaterally provision computing capabilities, such as server time and network storage, as needed automatically without requiring human inter-action with each service's provider. In at least one embodiment, cloud computing is characterized by broad network access, in which capabilities are available over a network and accessed through standard mechanisms that promote use by heterogeneous thin or thick client platforms (e.g., mobile phones, laptops, and PDAs). In at least one embodiment, cloud computing is characterized by resource pooling, in which a provider's computing resources are pooled to serve multiple consumers using a multi-tenant model, with different physical and virtual resources dynamically as-signed and reassigned according to consumer demand. In at least one embodiment, there is a sense of location independence in that a customer generally has no control or knowledge over an exact location of provided resources, but may be able to specify location at a higher level of abstraction (e.g., country, state, or datacenter). In at least one embodiment, examples of resources include storage, processing, memory, network bandwidth, and virtual machines. In at least one embodiment, cloud computing is characterized by rapid elasticity, in which capabilities can be rapidly and elastically provisioned, in some cases automatically, to quickly scale out and rapidly released to quickly scale in. In at least one embodiment, to a consumer, capabilities available for provisioning often appear to be unlimited and can be purchased in any quantity at any time. In at least one embodiment, cloud computing is characterized by measured service, in which cloud systems automatically control and optimize resource use by leveraging a metering capability at some level of abstraction appropriate to a type of service (e.g., storage, processing, bandwidth, and active user accounts). In at least one embodiment, resource usage can be monitored, controlled, and reported providing transparency for both a provider and consumer of a utilized service.

In at least one embodiment, cloud computing may be associated with various services. In at least one embodiment, cloud Software as a Service (SaaS) may refer to as service in which a capability provided to a consumer is to use a provider's applications running on a cloud infrastructure. In at least one embodiment, applications are accessible from various client devices through a thin client interface such as a web browser (e.g., web-based email). In at least one embodiment, consumer does not manage or control underlying cloud infrastructure including network, servers, operating systems, storage, or even individual application capabilities, with a possible exception of limited user-specific application configuration settings.

In at least one embodiment, cloud Platform as a Service (PaaS) may refer to a service in which a capability provided to a consumer is to deploy onto cloud infrastructure consumer-created or acquired applications created using programming languages and tools supported by a provider. In at least one embodiment, consumer does not manage or control underlying cloud infrastructure including networks, servers, operating systems, or storage, but has control over deployed applications and possibly application hosting environment configurations.

In at least one embodiment, cloud Infrastructure as a Service (IaaS) may refer to a service in which a capability provided to a consumer is to provision processing, storage, networks, and other fundamental computing resources where a consumer is able to deploy and run arbitrary software, which can include operating systems and applications. In at least one embodiment, consumer does not manage or control underlying cloud infrastructure, but has control over operating systems, storage, deployed applications, and possibly limited control of select networking components (e.g., host firewalls).

In at least one embodiment, cloud computing may be deployed in various ways. In at least one embodiment, a private cloud may refer to a cloud infrastructure that is operated solely for an organization. In at least one embodiment, a private cloud may be managed by an organization or a third party and may exist on-premises or off-premises. In at least one embodiment, a community cloud may refer to a cloud infrastructure that is shared by several organizations and supports a specific community that has shared concerns (e.g., mission, security requirements, policy, and compliance considerations). In at least one embodiment, a community cloud may be managed by organizations or a third party and may exist on-premises or off-premises. In at least one embodiment, a public cloud may refer to a cloud infrastructure that is made available to a general public or a large industry group and is owned by an organization providing cloud services. In at least one embodiment, a hybrid cloud may refer to a cloud infrastructure is a composition of two or more clouds (private, community, or public) that remain unique entities, but are bound together by standardized or proprietary technology that enables data and application portability (e.g., cloud bursting for load-balancing between clouds). In at least one embodiment, a cloud computing environment is service oriented with a focus on statelessness, low coupling, modularity, and semantic interoperability.

Figure 15:
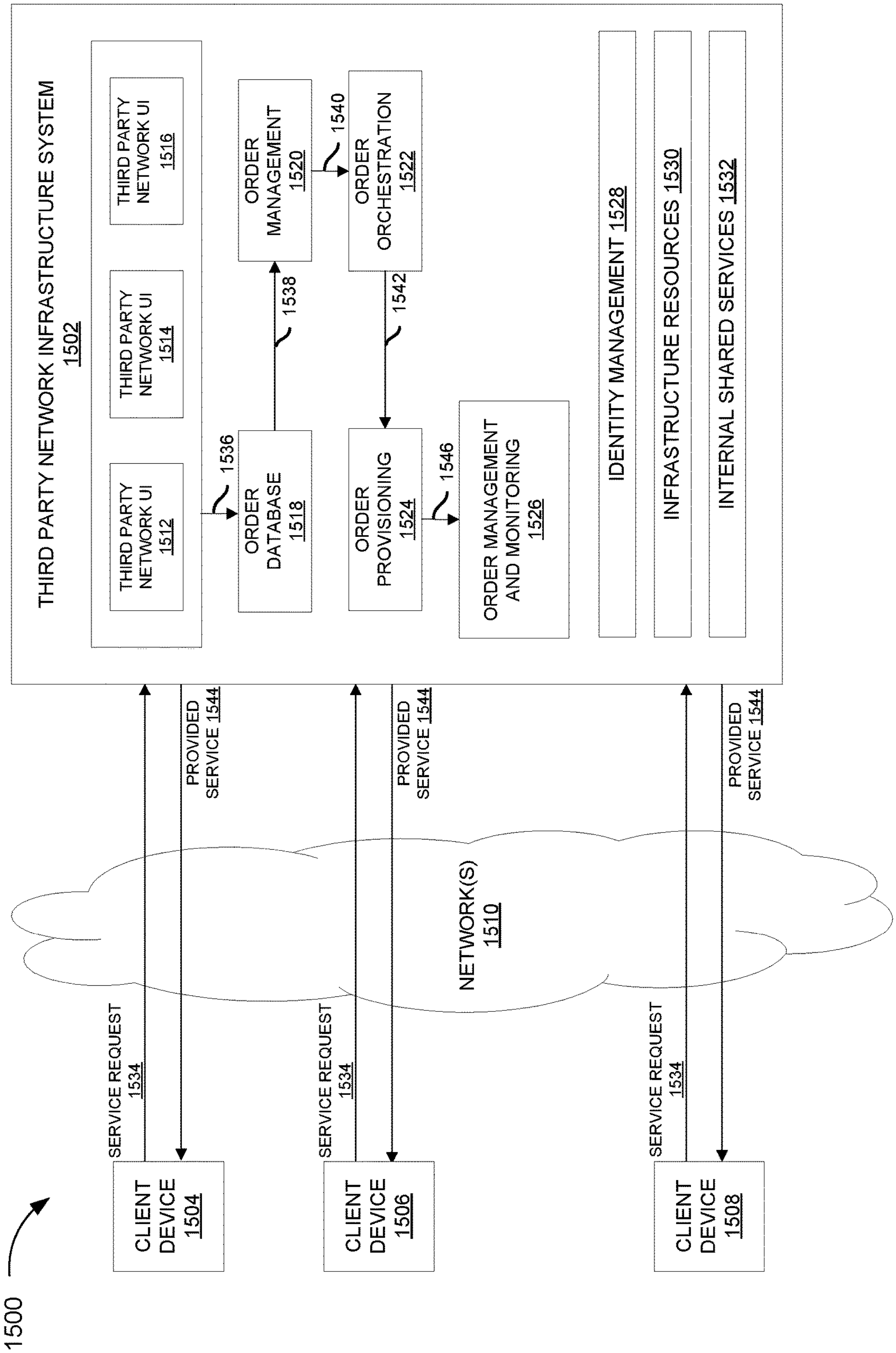
FIG. 15 illustrates one or more components of a system environment in which services may be offered as third party network services, in accordance with at least one embodiment.

FIG. 15 illustrates one or more components of a system environment 1500 in which services may be offered as third party network services, in accordance with at least one embodiment. In at least one embodiment, a third party network may be referred to as a cloud, cloud network, cloud computing network, and/or variations thereof. In at least one embodiment, system environment 1500 includes one or more client computing devices 1504, 1506, and 1508 that may be used by users to interact with a third party network infrastructure system 1502 that provides third party network services, which may be referred to as cloud computing services. In at least one embodiment, third party network infrastructure system 1502 may comprise one or more computers and/or servers.

It should be appreciated that third party network infrastructure system 1502 depicted in FIG. 15 may have other components than those depicted. Further, FIG. 15 depicts an embodiment of a third party network infrastructure system. In at least one embodiment, third party network infrastructure system 1502 may have more or fewer components than depicted in FIG. 15, may combine two or more components, or may have a different configuration or arrangement of components.

In at least one embodiment, client computing devices 1504, 1506, and 1508 may be configured to operate a client application such as a web browser, a proprietary client application, or some other application, which may be used by a user of a client computing device to interact with third party network infrastructure system 1502 to use services provided by third party network infrastructure system 1502. Although exemplary system environment 1500 is shown with three client computing devices, any number of client computing devices may be supported. In at least one embodiment, other devices such as devices with sensors, etc. may interact with third party network infrastructure system 1502. In at least one embodiment, network(s) 1510 may facilitate communications and exchange of data between client computing devices 1504, 1506, and 1508 and third party network infrastructure system 1502.

In at least one embodiment, services provided by third party network infrastructure system 1502 may include a host of services that are made available to users of a third party network infrastructure system on demand. In at least one embodiment, various services may also be offered including without limitation online data storage and backup solutions, Web-based e-mail services, hosted office suites and document collaboration services, database management and processing, managed technical support services, and/or variations thereof. In at least one embodiment, services provided by a third party network infrastructure system can dynamically scale to meet needs of its users.

In at least one embodiment, a specific instantiation of a service provided by third party network infrastructure system 1502 may be referred to as a "service instance." In at least one embodiment, in general, any service made available to a user via a communication network, such as the Internet, from a third party network service provider's system is referred to as a "third party network service." In at least one embodiment, in a public third party network environment, servers and systems that make up a third party network service provider's system are different from a customer's own on-premises servers and systems. In at least one embodiment, a third party network service provider's system may host an application, and a user may, via a communication network such as the Internet, on demand, order and use an application.

In at least one embodiment, a service in a computer network third party network infrastructure may include protected computer network access to storage, a hosted database, a hosted web server, a software application, or other service provided by a third party network vendor to a user. In at least one embodiment, a service can include password-protected access to remote storage on a third party network through the Internet. In at least one embodiment, a service can include a web service-based hosted relational database and a script-language middleware engine for private use by a networked developer. In at least one embodiment, a service can include access to an email software application hosted on a third party network vendor's web site.

In at least one embodiment, third party network infrastructure system 1502 may include a suite of applications, middleware, and database service offerings that are delivered to a customer in a self-service, subscription-based, elastically scalable, reliable, highly available, and secure manner. In at least one embodiment, third party network infrastructure system 1502 may also provide "big data" related computation and analysis services. In at least one embodiment, term "big data" is generally used to refer to extremely large data sets that can be stored and manipulated by analysts and researchers to visualize large amounts of data, detect trends, and/or otherwise interact with data. In at least one embodiment, big data and related applications can be hosted and/or manipulated by an infrastructure system on many levels and at different scales. In at least one embodiment, tens, hundreds, or thousands of processors linked in parallel can act upon such data in order to present it or simulate external forces on data or what it represents. In at least one embodiment, these data sets can involve structured data, such as that organized in a database or otherwise according to a structured model, and/or unstructured data (e.g., emails, images, data blobs (binary large objects), web pages, complex event processing). In at least one embodiment, by leveraging an ability of an embodiment to relatively quickly focus more (or fewer) computing resources upon an objective, a third party network infrastructure system may be better available to carry out tasks on large data sets based on demand from a business, government agency, research organization, private individual, group of like-minded individuals or organizations, or other entity.

In at least one embodiment, third party network infrastructure system 1502 may be adapted to automatically provision, manage and track a customer's subscription to services offered by third party network infrastructure system 1502. In at least one embodiment, third party network infrastructure system 1502 may provide third party network services via different deployment models. In at least one embodiment, services may be provided under a public third party network model in which third party network infrastructure system 1502 is owned by an organization selling third party network services and services are made available to a general public or different industry enterprises. In at least one embodiment, services may be provided under a private third party network model in which third party network infrastructure system 1502 is operated solely for a single organization and may provide services for one or more entities within an organization. In at least one embodiment, third party network services may also be provided under a community third party network model in which third party network infrastructure system 1502 and services provided by third party network infrastructure system 1502 are shared by several organizations in a related community. In at least one embodiment, third party network services may also be provided under a hybrid third party network model, which is a combination of two or more different models.

In at least one embodiment, services provided by third party network infrastructure system 1502 may include one or more services provided under Software as a Service (Saas) category, Platform as a Service (PaaS) category, Infrastructure as a Service (IaaS) category, or other categories of services including hybrid services. In at least one embodiment, a customer, via a subscription order, may order one or more services provided by third party network infrastructure system 1502. In at least one embodiment, third party network infrastructure system 1502 then performs processing to provide services in a customer's subscription order.

In at least one embodiment, services provided by third party network infrastructure system 1502 may include, without limitation, application services, platform services and infrastructure services. In at least one embodiment, application services may be provided by a third party network infrastructure system via a SaaS platform. In at least one embodiment, SaaS platform may be configured to provide third party network services that fall under a SaaS category. In at least one embodiment, SaaS platform may provide capabilities to build and deliver a suite of on-demand applications on an integrated development and deployment platform. In at least one embodiment, SaaS platform may manage and control underlying software and infrastructure for providing SaaS services. In at least one embodiment, by utilizing services provided by a SaaS platform, customers can utilize applications executing on a third party network infrastructure system. In at least one embodiment, customers can acquire an application services without a need for customers to purchase separate licenses and support. In at least one embodiment, various different SaaS services may be provided. In at least one embodiment, examples include, without limitation, services that provide solutions for sales performance management, enterprise integration, and business flexibility for large organizations.

In at least one embodiment, platform services may be provided by third party network infrastructure system 1502 via a PaaS platform. In at least one embodiment, PaaS platform may be configured to provide third party network services that fall under a PaaS category. In at least one embodiment, examples of platform services may include without limitation services that enable organizations to consolidate existing applications on a shared, common architecture, as well as an ability to build new applications that leverage shared services provided by a platform. In at least one embodiment, PaaS platform may manage and control underlying software and infrastructure for providing PaaS services. In at least one embodiment, customers can acquire PaaS services provided by third party network infrastructure system 1502 without a need for customers to purchase separate licenses and support.

In at least one embodiment, by utilizing services provided by a PaaS platform, customers can employ programming languages and tools supported by a third party network infrastructure system and also control deployed services. In at least one embodiment, platform services provided by a third party network infrastructure system may include database third party network services, middleware third party network services and third party network services. In at least one embodiment, database third party network services may support shared service deployment models that enable organizations to pool database resources and offer customers a Database as a Service in a form of a database third party network. In at least one embodiment, middleware third party network services may provide a platform for customers to develop and deploy various business applications, and third party network services may provide a platform for customers to deploy applications, in a third party network infrastructure system.

In at least one embodiment, various different infrastructure services may be provided by an IaaS platform in a third party network infrastructure system. In at least one embodiment, infrastructure services facilitate management and control of underlying computing resources, such as storage, networks, and other fundamental computing resources for customers utilizing services provided by a SaaS platform and a PaaS platform.

In at least one embodiment, third party network infrastructure system 1502 may also include infrastructure resources 1530 for providing resources used to provide various services to customers of a third party network infrastructure system. In at least one embodiment, infrastructure resources 1530 may include pre-integrated and optimized combinations of hardware, such as servers, storage, and networking resources to execute services provided by a Paas platform and a Saas platform, and other resources.

In at least one embodiment, resources in third party network infrastructure system 1502 may be shared by multiple users and dynamically re-allocated per demand. In at least one embodiment, resources may be allocated to users in different time zones. In at least one embodiment, third party network infrastructure system 1502 may enable a first set of users in a first time zone to utilize resources of a third party network infrastructure system for a specified number of hours and then enable a re-allocation of same resources to another set of users located in a different time zone, thereby maximizing utilization of resources.

In at least one embodiment, a number of internal shared services 1532 may be provided that are shared by different components or modules of third party network infrastructure system 1502 to enable provision of services by third party network infrastructure system 1502. In at least one embodiment, these internal shared services may include, without limitation, a security and identity service, an integration service, an enterprise repository service, an enterprise manager service, a virus scanning and white list service, a high availability, backup and recovery service, service for enabling third party network support, an email service, a notification service, a file transfer service, and/or variations thereof.

In at least one embodiment, third party network infrastructure system 1502 may provide comprehensive management of third party network services (e.g., SaaS, PaaS, and IaaS services) in a third party network infrastructure system. In at least one embodiment, third party network management functionality may include capabilities for provisioning, managing and tracking a customer's subscription received by third party network infrastructure system 1502, and/or variations thereof.

In at least one embodiment, as depicted in FIG. 15, third party network management functionality may be provided by one or more modules, such as an order management module 1520, an order orchestration module 1522, an order provisioning module 1524, an order management and monitoring module 1526, and an identity management module 1528. In at least one embodiment, these modules may include or be provided using one or more computers and/or servers, which may be general purpose computers, specialized server computers, server farms, server clusters, or any other appropriate arrangement and/or combination.

In at least one embodiment, at step 1534, a customer using a client device, such as client computing devices 1504, 1506 or 1508, may interact with third party network infrastructure system 1502 by requesting one or more services provided by third party network infrastructure system 1502 and placing an order for a subscription for one or more services offered by third party network infrastructure system 1502. In at least one embodiment, a customer may access a third party network User Interface (UI) such as third party network UI 1512, third party network UI 1514 and/or third party network UI 1516 and place a subscription order via these UIs.

In at least one embodiment, order information received by third party network infrastructure system 1502 in response to a customer placing an order may include information identifying a customer and one or more services offered by a third party network infrastructure system 1502 that a customer intends to subscribe to.

In at least one embodiment, at step 1536, an order information received from a customer may be stored in an order database 1518. In at least one embodiment, if this is a new order, a new record may be created for an order. In at least one embodiment, order database 1518 can be one of several databases operated by third party network infrastructure system 1518 and operated in conjunction with other system elements.

In at least one embodiment, at step 1538, an order information may be forwarded to an order management module 1520 that may be configured to perform billing and accounting functions related to an order, such as verifying an order, and upon verification, booking an order.

In at least one embodiment, at step 1540, information regarding an order may be communicated to an order orchestration module 1522 that is configured to orchestrate provisioning of services and resources for an order placed by a customer. In at least one embodiment, order orchestration module 1522 may use services of order provisioning module 1524 for provisioning. In at least one embodiment, order orchestration module 1522 enables management of business processes associated with each order and applies business logic to determine whether an order should proceed to provisioning.

In at least one embodiment, at step 1542, upon receiving an order for a new subscription, order orchestration module 1522 sends a request to order provisioning module 1524 to allocate resources and configure resources needed to fulfill a subscription order. In at least one embodiment, order provisioning module 1524 enables an allocation of resources for services ordered by a customer. In at least one embodiment, order provisioning module 1524 provides a level of abstraction between third party network services provided by third party network infrastructure system 1500 and a physical implementation layer that is used to provision resources for providing requested services. In at least one embodiment, this enables order orchestration module 1522 to be isolated from implementation details, such as whether or not services and resources are actually provisioned in real-time or pre-provisioned and only allocated/assigned upon request.

In at least one embodiment, at step 1544, once services and resources are provisioned, a notification may be sent to subscribing customers indicating that a requested service is now ready for use. In at least one embodiment, information (e.g., a link) may be sent to a customer that enables a customer to start using requested services.

In at least one embodiment, at step 1546, a customer's subscription order may be managed and tracked by an order management and monitoring module 1526. In at least one embodiment, order management and monitoring module 1526 may be configured to collect usage statistics regarding a customer use of subscribed services. In at least one embodiment, statistics may be collected for an amount of storage used, an amount data transferred, a number of users, and an amount of system up time and system down time, and/or variations thereof.

In at least one embodiment, third party network infrastructure system 1500 may include an identity management module 1528 that is configured to provide identity services, such as access management and authorization services in third party network infrastructure system 1500. In at least one embodiment, identity management module 1528 may control information about customers who wish to utilize services provided by third party network infrastructure system 1502. In at least one embodiment, such information can include information that authenticates identities of such customers and information that describes which actions those customers are authorized to perform relative to various system resources (e.g., files, directories, applications, communication ports, memory segments, etc.). In at least one embodiment, identity management module 1528 may also include management of descriptive information about each customer and about how and by whom that descriptive information can be accessed and modified.

Figure 16:
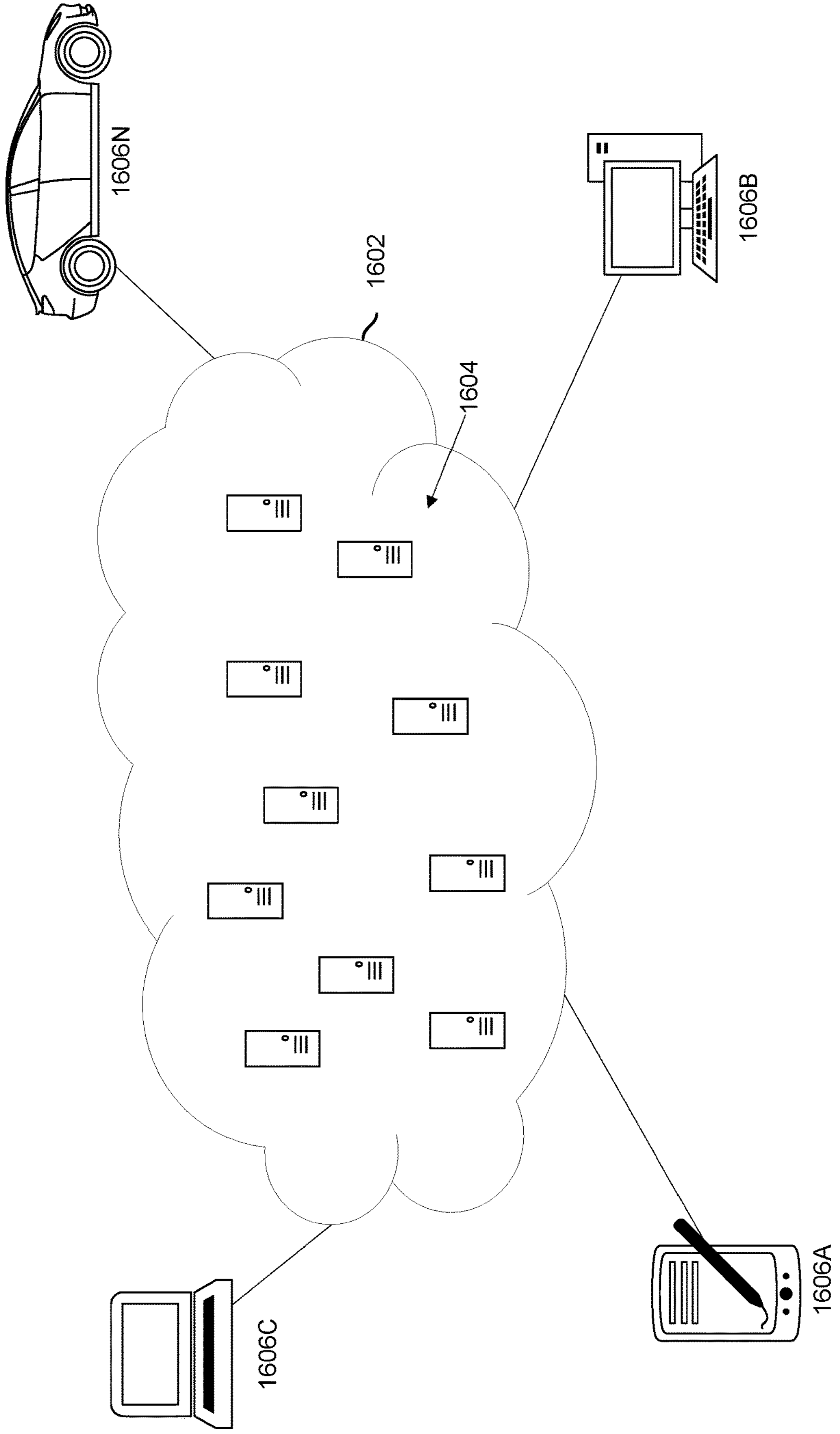
FIG. 16 illustrates a cloud computing environment, in accordance with at least one embodiment.

FIG. 16 illustrates a cloud computing environment 1602, in accordance with at least one embodiment. In at least one embodiment, cloud computing environment 1602 comprises one or more computer system/servers 1604 with which computing devices such as, personal digital assistant (PDA) or cellular telephone 1606A, desktop computer 1606B, laptop computer 1606C, and/or automobile computer system 1606N communicate. In at least one embodiment, this allows for infrastructure, platforms and/or software to be offered as services from cloud computing environment 1602, so as to not require each client to separately maintain such resources. It is understood that types of computing devices 1606A-N shown in FIG. 16 are intended to be illustrative only and that cloud computing environment 1602 can communicate with any type of computerized device over any type of network and/or network/addressable connection (e.g., using a web browser).

In at least one embodiment, a computer system/server 1604, which can be denoted as a cloud computing node, is operational with numerous other general purpose or special purpose computing system environments or configurations. In at least one embodiment, examples of computing systems, environments, and/or configurations that may be suitable for use with computer system/server 1604 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and/or variations thereof.

In at least one embodiment, computer system/server 1604 may be described in a general context of computer system-executable instructions, such as program modules, being executed by a computer system. In at least one embodiment, program modules include routines, programs, objects, components, logic, data structures, and so on, that perform particular tasks or implement particular abstract data types. In at least one embodiment, exemplary computer system/server 1604 may be practiced in distributed loud computing environments where tasks are performed by remote processing devices that are linked through a communications network. In at least one embodiment, in a distributed cloud computing environment, program modules may be located in both local and remote computer system storage media including memory storage devices.

Figure 17:
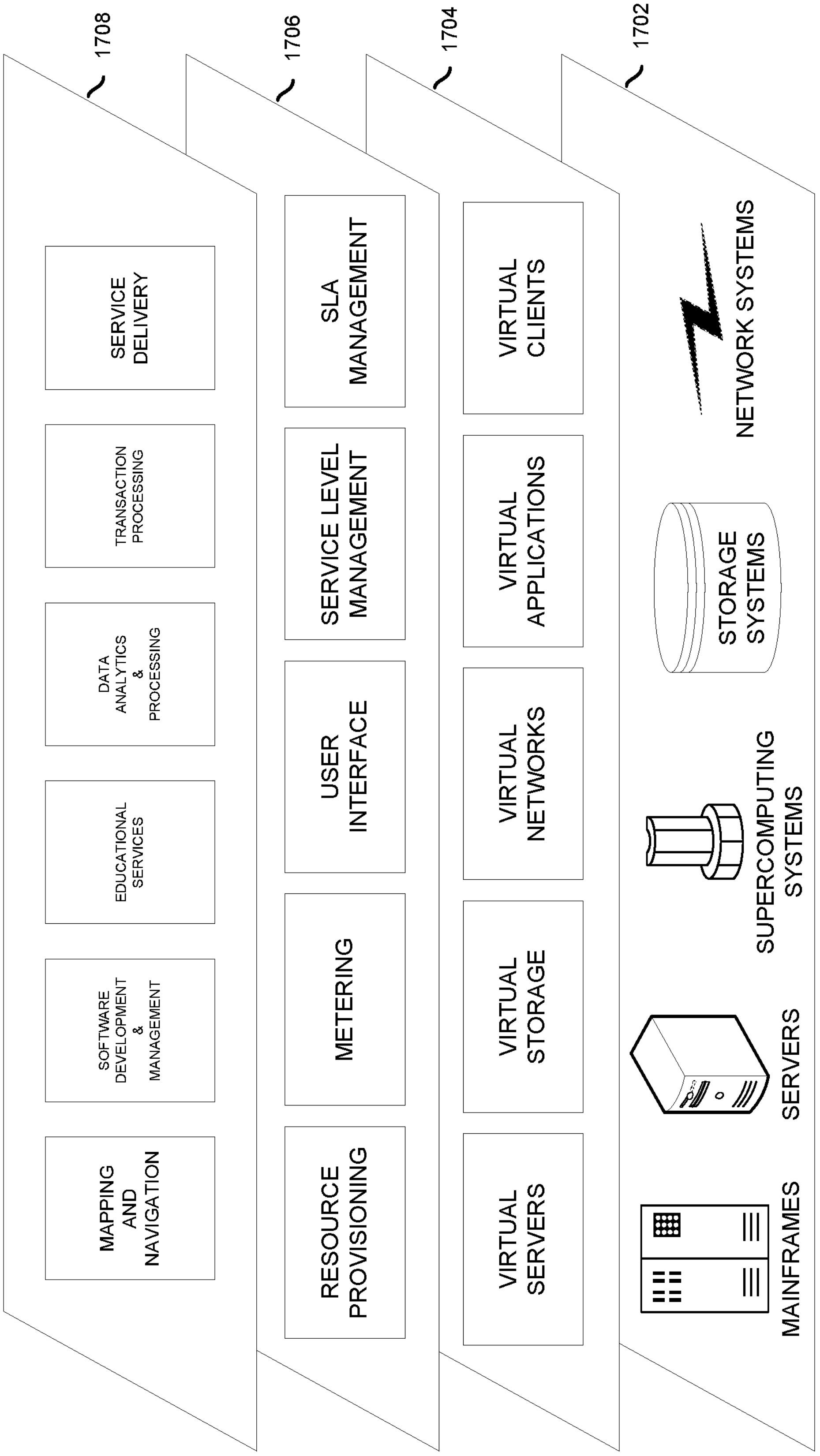
FIG. 17 illustrates a set of functional abstraction layers provided by a cloud computing environment, in accordance with at least one embodiment.

FIG. 17 illustrates a set of functional abstraction layers provided by cloud computing environment 1602 (FIG. 16), in accordance with at least one embodiment. It should be understood in advance that components, layers, and functions shown in FIG. 17 are intended to be illustrative only, and components, layers, and functions may vary.

In at least one embodiment, hardware and software layer 1702 includes hardware and software components. In at least one embodiment, examples of hardware components include mainframes, various RISC (Reduced Instruction Set Computer) architecture based servers, various computing systems, supercomputing systems, storage devices, networks, networking components, and/or variations thereof. In at least one embodiment, examples of software components include network application server software, various application server software, various database software, and/or variations thereof.

In at least one embodiment, virtualization layer 1704 provides an abstraction layer from which following exemplary virtual entities may be provided: virtual servers, virtual storage, virtual networks, including virtual private networks, virtual applications, virtual clients, and/or variations thereof.

In at least one embodiment, management layer 1706 provides various functions. In at least one embodiment, resource provisioning provides dynamic procurement of computing resources and other resources that are utilized to perform tasks within a cloud computing environment. In at least one embodiment, metering provides usage tracking as resources are utilized within a cloud computing environment, and billing or invoicing for consumption of these resources. In at least one embodiment, resources may comprise application software licenses. In at least one embodiment, security provides identity verification for users and tasks, as well as protection for data and other resources. In at least one embodiment, user interface provides access to a cloud computing environment for both users and system administrators. In at least one embodiment, service level management provides cloud computing resource allocation and management such that required service levels are met. In at least one embodiment, Service Level Agreement (SLA) management provides pre-arrangement for, and procurement of, cloud computing resources for which a future requirement is anticipated in accordance with an SLA.

In at least one embodiment, workloads layer 1708 provides functionality for which a cloud computing environment is utilized. In at least one embodiment, examples of workloads and functions which may be provided from this layer include: mapping and navigation, software development and management, educational services, data analytics and processing, transaction processing, and service delivery.

Supercomputing

The following figures set forth, without limitation, exemplary supercomputer-based systems that can be used to implement at least one embodiment.

In at least one embodiment, a supercomputer may refer to a hardware system exhibiting substantial parallelism and comprising at least one chip, where chips in a system are interconnected by a network and are placed in hierarchically organized enclosures. In at least one embodiment, a large hardware system filling a machine room, with several racks or coolant tanks, each containing several boards/rack modules, each containing several chips, all interconnected by a scalable network, is one particular example of a supercomputer. In at least one embodiment, a single rack or coolant tank of such a large hardware system is another example of a supercomputer. In at least one embodiment, a single chip exhibiting substantial parallelism and containing several hardware components can equally be considered to be a supercomputer, since as feature sizes may decrease, an amount of hardware that can be incorporated in a single chip may also increase.

Figure 18:
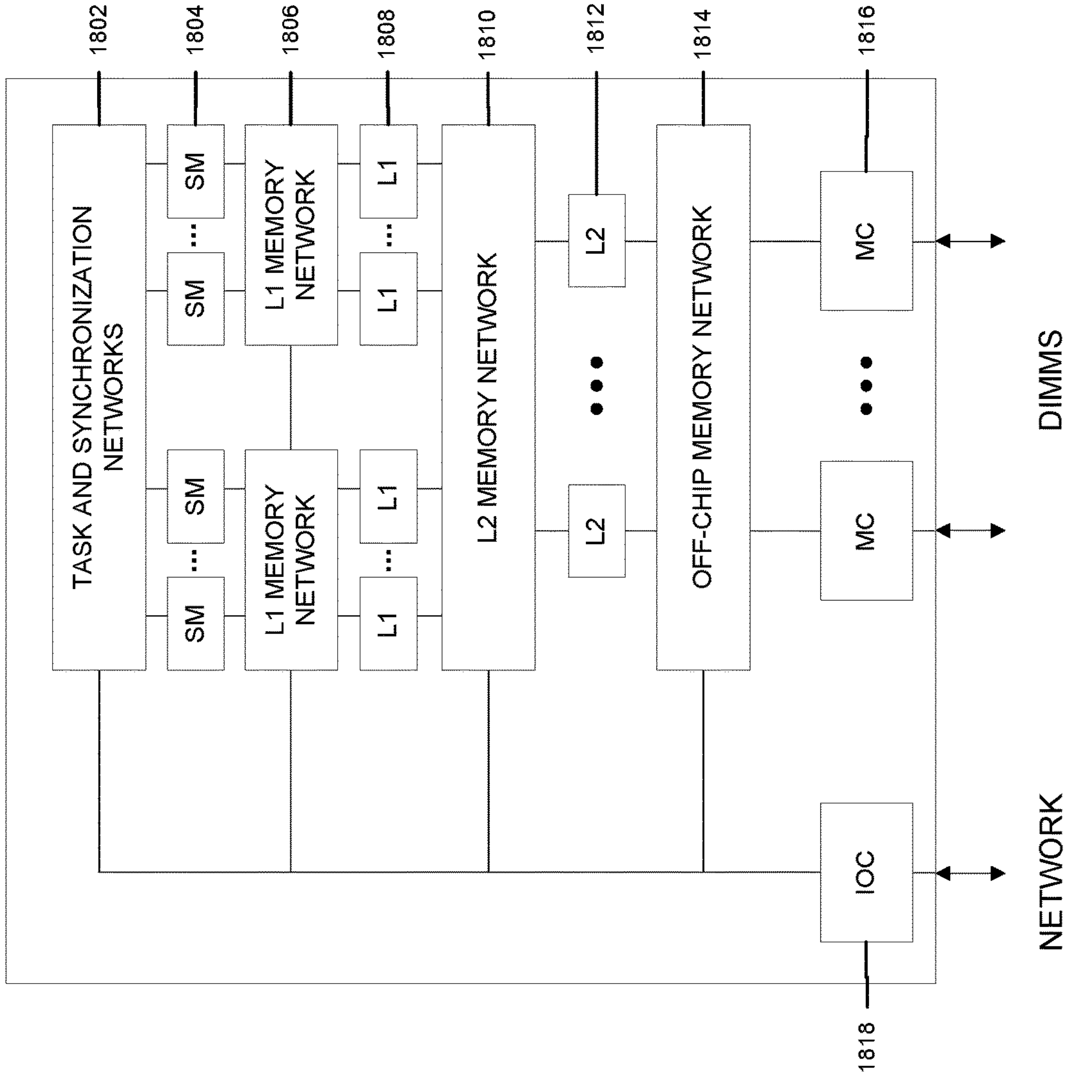
FIG. 18 illustrates a supercomputer at a chip level, in accordance with at least one embodiment.

FIG. 18 illustrates a supercomputer at a chip level, in accordance with at least one embodiment. In at least one embodiment, inside an FPGA or ASIC chip, main computation is performed within finite state machines (1804) called thread units. In at least one embodiment, task and synchronization networks (1802) connect finite state machines and are used to dispatch threads and execute operations in correct order. In at least one embodiment, a multi-level partitioned on-chip cache hierarchy (1808, 1812) is accessed using memory networks (1806, 1810). In at least one embodiment, off-chip memory is accessed using memory controllers (1816) and an off-chip memory network (1814). In at least one embodiment, I/O controller (1818) is used for cross-chip communication when a design does not fit in a single logic chip.

Figure 19:
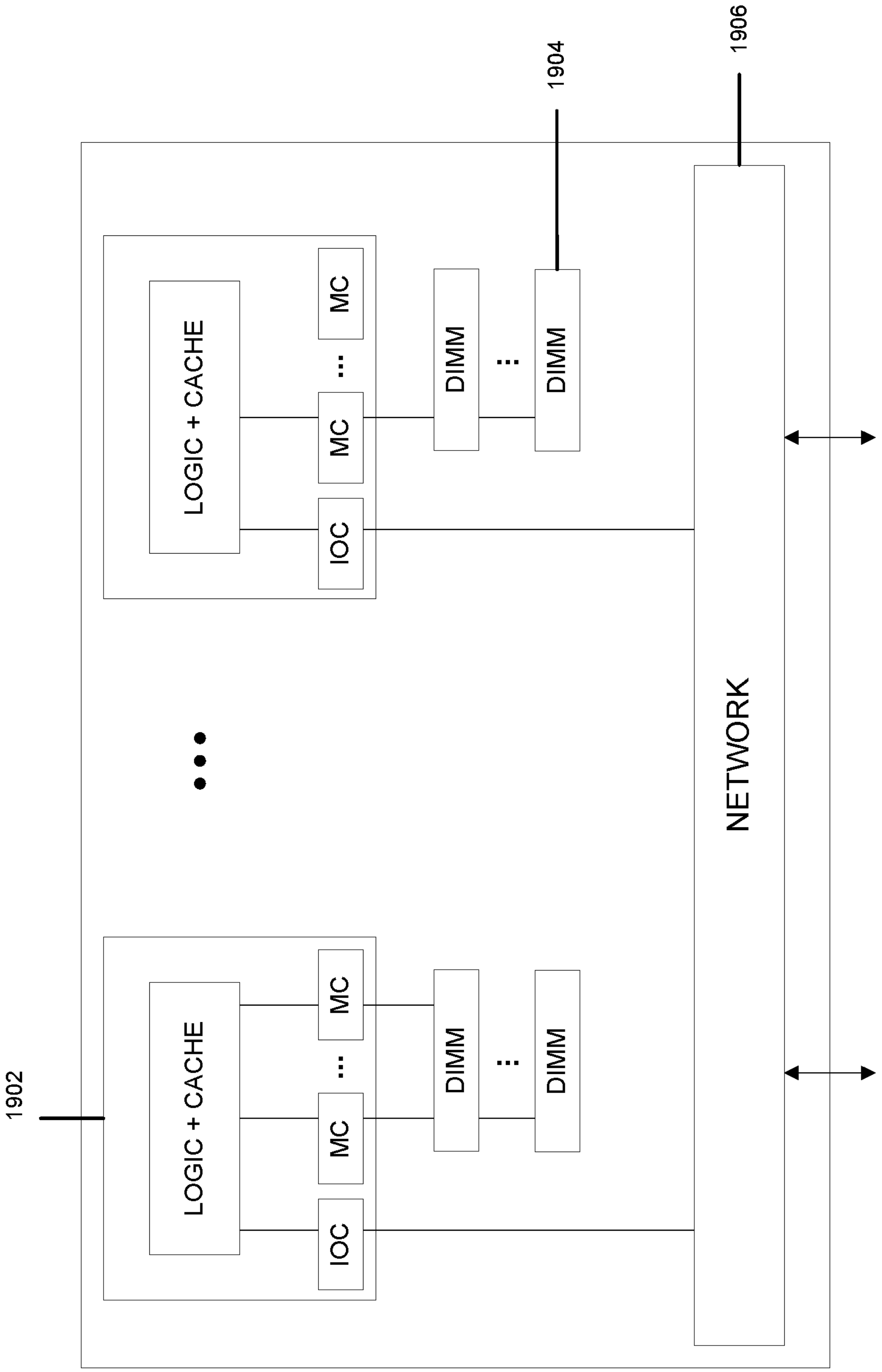
FIG. 19 illustrates a supercomputer at a rack module level, in accordance with at least one embodiment.

FIG. 19 illustrates a supercomputer at a rack module level, in accordance with at least one embodiment. In at least one embodiment, within a rack module, there are multiple FPGA or ASIC chips (1902) that are connected to one or more DRAM units (1904) which constitute main accelerator memory. In at least one embodiment, each FPGA/ASIC chip is connected to its neighbor FPGA/ASIC chip using wide busses on a board, with differential high speed signaling (1906). In at least one embodiment, each FPGA/ASIC chip is also connected to at least one high-speed serial communication cable.

Figure 20:
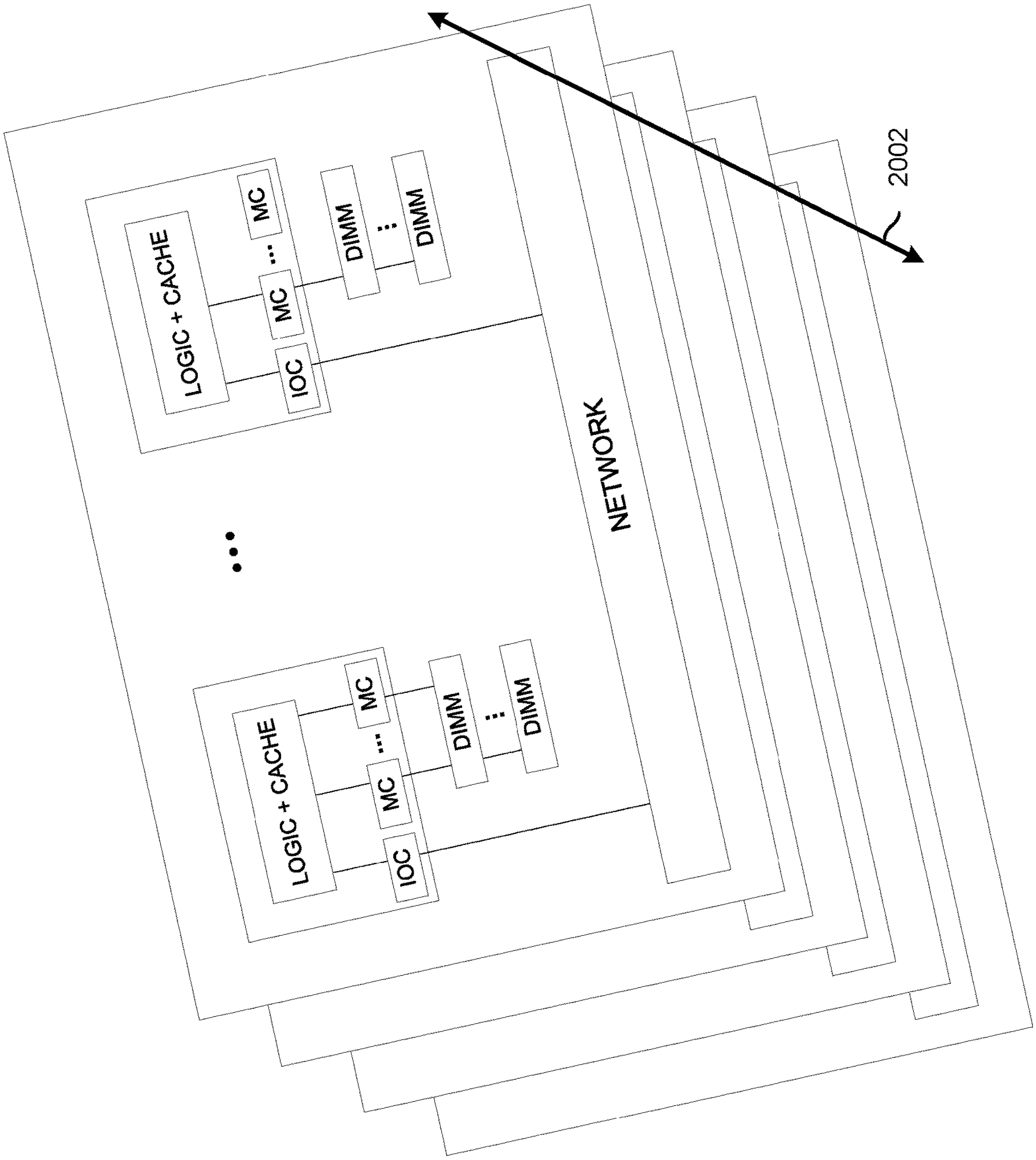
FIG. 20 illustrates a supercomputer at a rack level, in accordance with at least one embodiment.
Figure 21:
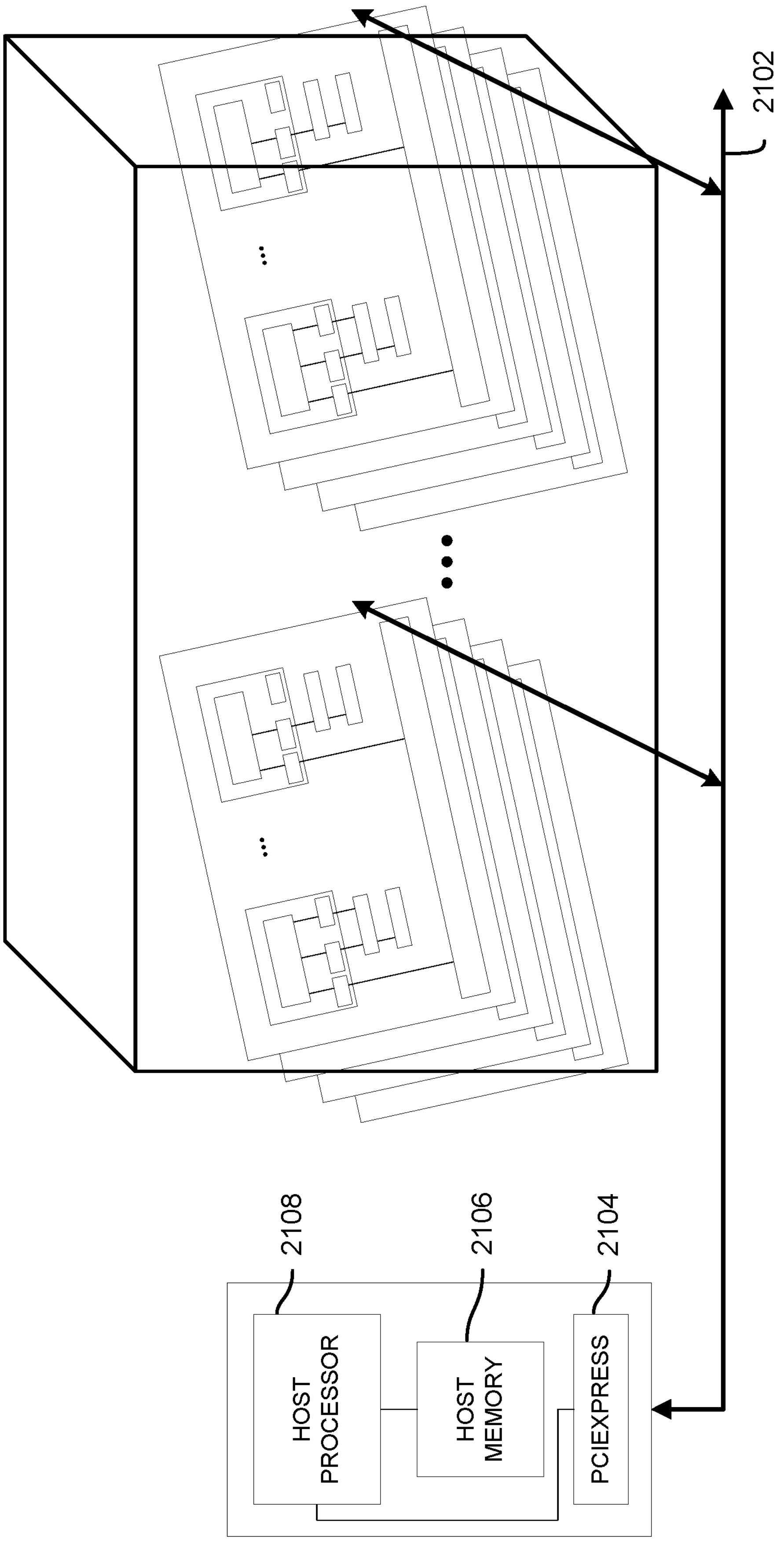
FIG. 21 illustrates a supercomputer at a whole system level, in accordance with at least one embodiment.

FIG. 20 illustrates a supercomputer at a rack level, in accordance with at least one embodiment. FIG. 21 illustrates a supercomputer at a whole system level, in accordance with at least one embodiment. In at least one embodiment, referring to FIG. 20 and FIG. 21, between rack modules in a rack and across racks throughout an entire system, high-speed serial optical or copper cables (2002, 2102) are used to realize a scalable, possibly incomplete hypercube network. In at least one embodiment, one of FPGA/ASIC chips of an accelerator is connected to a host system through a PCI-Express connection (2104). In at least one embodiment, host system comprises a host microprocessor (2108) that a software part of an application runs on and a memory consisting of one or more host memory DRAM units (2106) that is kept coherent with memory on an accelerator. In at least one embodiment, host system can be a separate module on one of racks, or can be integrated with one of a supercomputer's modules. In at least one embodiment, cube-connected cycles topology provide communication links to create a hypercube network for a large supercomputer. In at least one embodiment, a small group of FPGA/ASIC chips on a rack module can act as a single hypercube node, such that a total number of external links of each group is increased, compared to a single chip. In at least one embodiment, a group contains chips A, B, C and D on a rack module with internal wide differential busses connecting A, B, C and D in a torus organization. In at least one embodiment, there are 12 serial communication cables connecting a rack module to an outside world. In at least one embodiment, chip A on a rack module connects to serial communication cables 0, 1, 2. In at least one embodiment, chip B connects to cables 3, 4, 5. In at least one embodiment, chip C connects to 6, 7, 8. In at least one embodiment, chip D connects to 9, 10, 11. In at least one embodiment, an entire group {A, B, C, D} constituting a rack module can form a hypercube node within a supercomputer system, with up to 212=4096 rack modules (16384 FPGA/ASIC chips). In at least one embodiment, for chip A to send a message out on link 4 of group {A, B, C, D}, a message has to be routed first to chip B with an on-board differential wide bus connection. In at least one embodiment, a message arriving into a group {A, B, C, D} on link 4 (i.e., arriving at B) destined to chip A, also has to be routed first to a correct destination chip (A) internally within a group {A, B, C, D}. In at least one embodiment, parallel supercomputer systems of other sizes may also be implemented.

5G Networks

The following figures set forth, without limitation, exemplary 5G network-based systems that can be used to implement at least one embodiment.

Figure 22:
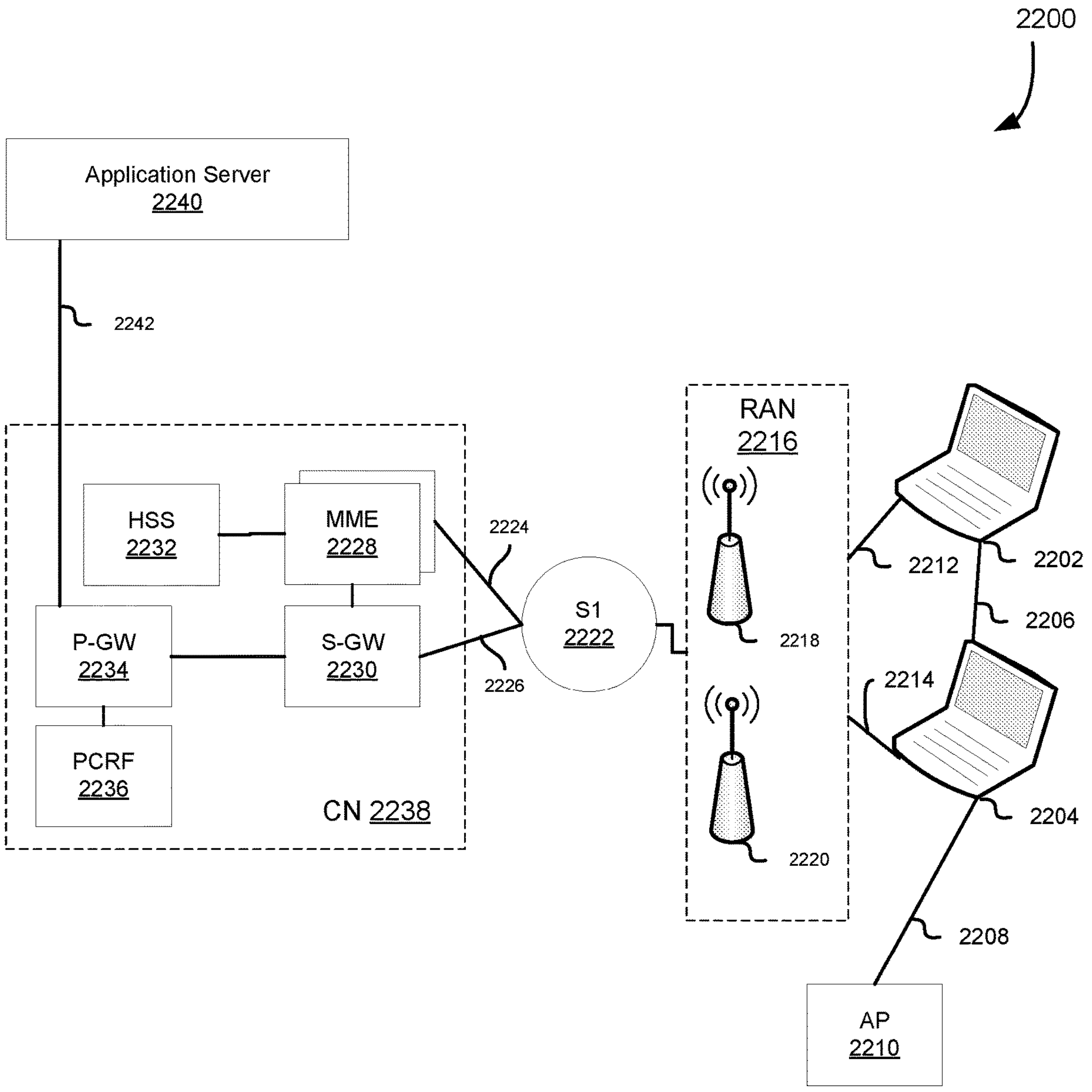
FIG. 22 illustrates an architecture of a system of a network, in accordance with at least one embodiment.

FIG. 22 illustrates an architecture of a system 2200 of a network, in accordance with at least one embodiment. In at least one embodiment, system 2200 is shown to include a user equipment (UE) 2202 and a UE 2204. In at least one embodiment, UEs 2202 and 2204 are illustrated as smartphones (e.g., handheld touchscreen mobile computing devices connectable to one or more cellular networks) but may also comprise any mobile or non-mobile computing device, such as Personal Data Assistants (PDAs), pagers, laptop computers, desktop computers, wireless handsets, or any computing device including a wireless communications interface.

In at least one embodiment, any of Ues 2202 and 2204 can comprise an Internet of Things (IoT) UE, which can comprise a network access layer designed for low-power IoT applications utilizing short-lived UE connections. In at least one embodiment, an IoT UE can utilize technologies such as machine-to-machine (M2M) or machine-type communications (MTC) for exchanging data with an MTC server or device via a public land mobile network (PLMN), Proximity-Based Service (ProSe) or device-to-device (D2D) communication, sensor networks, or IoT networks. In at least one embodiment, a M2M or MTC exchange of data may be a machine-initiated exchange of data. In at least one embodiment, an IoT network describes interconnecting IoT Ues, which may include uniquely identifiable embedded computing devices (within Internet infrastructure), with short-lived connections. In at least one embodiment, an IoT Ues may execute background applications (e.g., keep alive messages, status updates, etc.) to facilitate connections of an IoT network.

In at least one embodiment, Ues 2202 and 2204 may be configured to connect, e.g., communicatively couple, with a radio access network (RAN) 2216. In at least one embodiment, RAN 2216 may be, for example, an Evolved Universal Mobile Telecommunications System (UMTS) Terrestrial Radio Access Network (E-UTRAN), a NextGen RAN (NG RAN), or some other type of RAN. In at least one embodiment, Ues 2202 and 2204 utilize connections 2212 and 2214, respectively, each of which comprises a physical communications interface or layer. In at least one embodiment, connections 2212 and 2214 are illustrated as an air interface to enable communicative coupling, and can be consistent with cellular communications protocols, such as a Global System for Mobile Communications (GSM) protocol, a code-division multiple access (CDMA) network protocol, a Push-to-Talk (PTT) protocol, a PTT over Cellular (POC) protocol, a Universal Mobile Telecommunications System (UMTS) protocol, a 3GPP Long Term Evolution (LTE) protocol, a fifth generation (5G) protocol, a New Radio (NR) protocol, and variations thereof.

In at least one embodiment, Ues 2202 and 2204 may further directly exchange communication data via a ProSe interface 2206. In at least one embodiment, ProSe interface 2206 may alternatively be referred to as a sidelink interface comprising one or more logical channels, including but not limited to a Physical Sidelink Control Channel (PSCCH), a Physical Sidelink Shared Channel (PSSCH), a Physical Sidelink Discovery Channel (PSDCH), and a Physical Sidelink Broadcast Channel (PSBCH).

In at least one embodiment, UE 2204 is shown to be configured to access an access point (AP) 2210 via connection 2208. In at least one embodiment, connection 2208 can comprise a local wireless connection, such as a connection consistent with any IEEE 802.11 protocol, wherein AP 2210 would comprise a wireless fidelity (WiFi®) router. In at least one embodiment, AP 2210 is shown to be connected to an Internet without connecting to a core network of a wireless system.

In at least one embodiment, RAN 2216 can include one or more access nodes that enable connections 2212 and 2214. In at least one embodiment, these access nodes (Ans) can be referred to as base stations (BSs), NodeBs, evolved NodeBs (eNBs), next Generation NodeBs (gNB), RAN nodes, and so forth, and can comprise ground stations (e.g., terrestrial access points) or satellite stations providing coverage within a geographic area (e.g., a cell). In at least one embodiment, RAN 2216 may include one or more RAN nodes for providing macrocells, e.g., macro RAN node 2218, and one or more RAN nodes for providing femtocells or picocells (e.g., cells having smaller coverage areas, smaller user capacity, or higher bandwidth compared to macrocells), e.g., low power (LP) RAN node 2220.

In at least one embodiment, any of RAN nodes 2218 and 2220 can terminate an air interface protocol and can be a first point of contact for Ues 2202 and 2204. In at least one embodiment, any of RAN nodes 2218 and 2220 can fulfill various logical functions for RAN 2216 including, but not limited to, radio network controller (RNC) functions such as radio bearer management, uplink and downlink dynamic radio resource management and data packet scheduling, and mobility management.

In at least one embodiment, Ues 2202 and 2204 can be configured to communicate using Orthogonal Frequency-Division Multiplexing (OFDM) communication signals with each other or with any of RAN nodes 2218 and 2220 over a multi-carrier communication channel in accordance various communication techniques, such as, but not limited to, an Orthogonal Frequency Division Multiple Access (OFDMA) communication technique (e.g., for downlink communications) or a Single Carrier Frequency Division Multiple Access (SC-FDMA) communication technique (e.g., for uplink and ProSe or sidelink communications), and/or variations thereof. In at least one embodiment, OFDM signals can comprise a plurality of orthogonal subcarriers.

In at least one embodiment, a downlink resource grid can be used for downlink transmissions from any of RAN nodes 2218 and 2220 to Ues 2202 and 2204, while uplink transmissions can utilize similar techniques. In at least one embodiment, a grid can be a time frequency grid, called a resource grid or time-frequency resource grid, which is a physical resource in a downlink in each slot. In at least one embodiment, such a time frequency plane representation is a common practice for OFDM systems, which makes it intuitive for radio resource allocation. In at least one embodiment, each column and each row of a resource grid corresponds to one OFDM symbol and one OFDM subcarrier, respectively. In at least one embodiment, a duration of a resource grid in a time domain corresponds to one slot in a radio frame. In at least one embodiment, a smallest time-frequency unit in a resource grid is denoted as a resource element. In at least one embodiment, each resource grid comprises a number of resource blocks, which describe a mapping of certain physical channels to resource elements. In at least one embodiment, each resource block comprises a collection of resource elements. In at least one embodiment, in a frequency domain, this may represent a smallest quantity of resources that currently can be allocated. In at least one embodiment, there are several different physical downlink channels that are conveyed using such resource blocks.

In at least one embodiment, a physical downlink shared channel (PDSCH) may carry user data and higher-layer signaling to Ues 2202 and 2204. In at least one embodiment, a physical downlink control channel (PDCCH) may carry information about a transport format and resource allocations related to PDSCH channel, among other things. In at least one embodiment, it may also inform Ues 2202 and 2204 about a transport format, resource allocation, and HARQ (Hybrid Automatic Repeat Request) information related to an uplink shared channel. In at least one embodiment, typically, downlink scheduling (assigning control and shared channel resource blocks to UE 2202 within a cell) may be performed at any of RAN nodes 2218 and 2220 based on channel quality information fed back from any of Ues 2202 and 2204. In at least one embodiment, downlink resource assignment information may be sent on a PDCCH used for (e.g., assigned to) each of Ues 2202 and 2204.

In at least one embodiment, a PDCCH may use control channel elements (CCEs) to convey control information. In at least one embodiment, before being mapped to resource elements, PDCCH complex valued symbols may first be organized into quadruplets, which may then be permuted using a sub-block interleaver for rate matching. In at least one embodiment, each PDCCH may be transmitted using one or more of these CCEs, where each CCE may correspond to nine sets of four physical resource elements known as resource element groups (REGs). In at least one embodiment, four Quadrature Phase Shift Keying (QPSK) symbols may be mapped to each REG. In at least one embodiment, PDCCH can be transmitted using one or more CCEs, depending on a size of a downlink control information (DCI) and a channel condition. In at least one embodiment, there can be four or more different PDCCH formats defined in LTE with different numbers of CCEs (e.g., aggregation level, L=1, 2, 4, or 8).

In at least one embodiment, an enhanced physical downlink control channel (EPDCCH) that uses PDSCH resources may be utilized for control information transmission. In at least one embodiment, EPDCCH may be transmitted using one or more enhanced control channel elements (ECCEs). In at least one embodiment, each ECCE may correspond to nine sets of four physical resource elements known as an enhanced resource element groups (EREGs). In at least one embodiment, an ECCE may have other numbers of EREGs in some situations.

In at least one embodiment, RAN 2216 is shown to be communicatively coupled to a core network (CN) 2238 via an S1 interface 2222. In at least one embodiment, CN 2238 may be an evolved packet core (EPC) network, a NextGen Packet Core (NPC) network, or some other type of CN. In at least one embodiment, S1 interface 2222 is split into two parts: S1-U interface 2226, which carries traffic data between RAN nodes 2218 and 2220 and serving gateway (S-GW) 2230, and a S1-mobility management entity (MME) interface 2224, which is a signaling interface between RAN nodes 2218 and 2220 and MMEs 2228.

In at least one embodiment, CN 2238 comprises MMEs 2228, S-GW 2230, Packet Data Network (PDN) Gateway (P-GW) 2234, and a home subscriber server (HSS) 2232. In at least one embodiment, MMEs 2228 may be similar in function to a control plane of legacy Serving General Packet Radio Service (GPRS) Support Nodes (SGSN). In at least one embodiment, MMEs 2228 may manage mobility aspects in access such as gateway selection and tracking area list management. In at least one embodiment, HSS 2232 may comprise a database for network users, including subscription related information to support a network entities' handling of communication sessions. In at least one embodiment, CN 2238 may comprise one or several HSSs 2232, depending on a number of mobile subscribers, on a capacity of an equipment, on an organization of a network, etc. In at least one embodiment, HSS 2232 can provide support for routing/roaming, authentication, authorization, naming/addressing resolution, location dependencies, etc.

In at least one embodiment, S-GW 2230 may terminate a S1 interface 2222 towards RAN 2216, and routes data packets between RAN 2216 and CN 2238. In at least one embodiment, S-GW 2230 may be a local mobility anchor point for inter-RAN node handovers and also may provide an anchor for inter-3GPP mobility. In at least one embodiment, other responsibilities may include lawful intercept, charging, and some policy enforcement.

In at least one embodiment, P-GW 2234 may terminate an Sgi interface toward a PDN. In at least one embodiment, P-GW 2234 may route data packets between an EPC network 2238 and external networks such as a network including application server 2240 (alternatively referred to as application function (AF)) via an Internet Protocol (IP) interface 2242. In at least one embodiment, application server 2240 may be an element offering applications that use IP bearer resources with a core network (e.g., UMTS Packet Services (PS) domain, LTE PS data services, etc.). In at least one embodiment, P-GW 2234 is shown to be communicatively coupled to an application server 2240 via an IP communications interface 2242. In at least one embodiment, application server 2240 can also be configured to support one or more communication services (e.g., Voice-over-Internet Protocol (VOIP) sessions, PTT sessions, group communication sessions, social networking services, etc.) for Ues 2202 and 2204 via CN 2238.

In at least one embodiment, P-GW 2234 may further be a node for policy enforcement and charging data collection. In at least one embodiment, policy and Charging Enforcement Function (PCRF) 2236 is a policy and charging control element of CN 2238. In at least one embodiment, in a non-roaming scenario, there may be a single PCRF in a Home Public Land Mobile Network (HPLMN) associated with a UE's Internet Protocol Connectivity Access Network (IP-CAN) session. In at least one embodiment, in a roaming scenario with local breakout of traffic, there may be two PCRFs associated with a UE's IP-CAN session: a Home PCRF (H-PCRF) within a HPLMN and a Visited PCRF (V-PCRF) within a Visited Public Land Mobile Network (VPLMN). In at least one embodiment, PCRF 2236 may be communicatively coupled to application server 2240 via P-GW 2234. In at least one embodiment, application server 2240 may signal PCRF 2236 to indicate a new service flow and select an appropriate Quality of Service (QoS) and charging parameters. In at least one embodiment, PCRF 2236 may provision this rule into a Policy and Charging Enforcement Function (PCEF) (not shown) with an appropriate traffic flow template (TFT) and QoS class of identifier (QCI), which commences a QoS and charging as specified by application server 2240.

Figure 23:
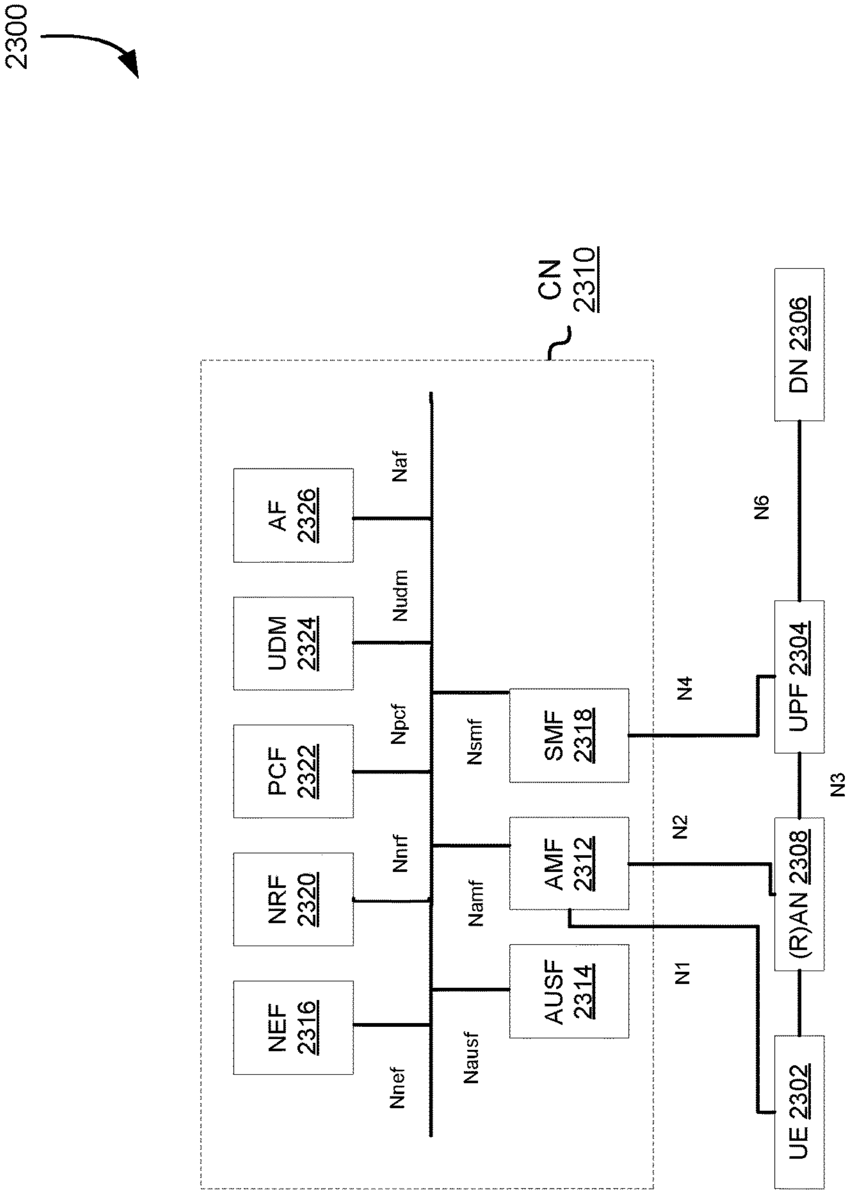
FIG. 23 illustrates an architecture of a system of a network, in accordance with at least one embodiment.

FIG. 23 illustrates an architecture of a system 2300 of a network in accordance with some embodiments. In at least one embodiment, system 2300 is shown to include a UE 2302, a 5G access node or RAN node (shown as (R)AN node 2308), a User Plane Function (shown as UPF 2304), a Data Network (DN 2306), which may be, for example, operator services, Internet access or 3rd party services, and a 5G Core Network (5GC) (shown as CN 2310).

In at least one embodiment, CN 2310 includes an Authentication Server Function (AUSF 2314); a Core Access and Mobility Management Function (AMF 2312); a Session Management Function (SMF 2318); a Network Exposure Function (NEF 2316); a Policy Control Function (PCF 2322); a Network Function (NF) Repository Function (NRF 2320); a Unified Data Management (UDM 2324); and an Application Function (AF 2326). In at least one embodiment, CN 2310 may also include other elements that are not shown, such as a Structured Data Storage network function (SDSF), an Unstructured Data Storage network function (UDSF), and variations thereof.

In at least one embodiment, UPF 2304 may act as an anchor point for intra-RAT and inter-RAT mobility, an external PDU session point of interconnect to DN 2306, and a branching point to support multi-homed PDU session. In at least one embodiment, UPF 2304 may also perform packet routing and forwarding, packet inspection, enforce user plane part of policy rules, lawfully intercept packets (UP collection); traffic usage reporting, perform QoS handling for user plane (e.g., packet filtering, gating, UL/DL rate enforcement), perform Uplink Traffic verification (e.g., SDF to QoS flow mapping), transport level packet marking in uplink and downlink, and downlink packet buffering and downlink data notification triggering. In at least one embodiment, UPF 2304 may include an uplink classifier to support routing traffic flows to a data network. In at least one embodiment, DN 2306 may represent various network operator services, Internet access, or third party services.

In at least one embodiment, AUSF 2314 may store data for authentication of UE 2302 and handle authentication related functionality. In at least one embodiment, AUSF 2314 may facilitate a common authentication framework for various access types.

In at least one embodiment, AMF 2312 may be responsible for registration management (e.g., for registering UE 2302, etc.), connection management, reachability management, mobility management, and lawful interception of AMF-related events, and access authentication and authorization. In at least one embodiment, AMF 2312 may provide transport for SM messages for SMF 2318, and act as a transparent proxy for routing SM messages. In at least one embodiment, AMF 2312 may also provide transport for short message service (SMS) messages between UE 2302 and an SMS function (SMSF) (not shown by FIG. 23). In at least one embodiment, AMF 2312 may act as Security Anchor Function (SEA), which may include interaction with AUSF 2314 and UE 2302 and receipt of an intermediate key that was established as a result of UE 2302 authentication process. In at least one embodiment, where USIM based authentication is used, AMF 2312 may retrieve security material from AUSF 2314. In at least one embodiment, AMF 2312 may also include a Security Context Management (SCM) function, which receives a key from SEA that it uses to derive access-network specific keys. In at least one embodiment, furthermore, AMF 2312 may be a termination point of RAN CP interface (N2 reference point), a termination point of NAS (NI) signaling, and perform NAS ciphering and integrity protection.

In at least one embodiment, AMF 2312 may also support NAS signaling with a UE 2302 over an N3 interworking-function (IWF) interface. In at least one embodiment, N3IWF may be used to provide access to untrusted entities. In at least one embodiment, N3IWF may be a termination point for N2 and N3 interfaces for control plane and user plane, respectively, and as such, may handle N2 signaling from SMF and AMF for PDU sessions and QoS, encapsulate/de-encapsulate packets for IPSec and N3 tunneling, mark N3 user-plane packets in uplink, and enforce QoS corresponding to N3 packet marking taking into account QoS requirements associated to such marking received over N2. In at least one embodiment, N3IWF may also relay uplink and downlink control-plane NAS (NI) signaling between UE 2302 and AMF 2312, and relay uplink and downlink user-plane packets between UE 2302 and UPF 2304. In at least one embodiment, N3IWF also provides mechanisms for IPsec tunnel establishment with UE 2302.

In at least one embodiment, SMF 2318 may be responsible for session management (e.g., session establishment, modify and release, including tunnel maintain between UPF and AN node); UE IP address allocation & management (including optional Authorization); Selection and control of UP function; Configures traffic steering at UPF to route traffic to proper destination; termination of interfaces towards Policy control functions; control part of policy enforcement and QoS; lawful intercept (for SM events and interface to LI System); termination of SM parts of NAS messages; downlink Data Notification; initiator of AN specific SM information, sent via AMF over N2 to AN; determine SSC mode of a session. In at least one embodiment, SMF 2318 may include following roaming functionality: handle local enforcement to apply QoS SLAB (VPLMN); charging data collection and charging interface (VPLMN); lawful intercept (in VPLMN for SM events and interface to LI System); support for interaction with external DN for transport of signaling for PDU session authorization/authentication by external DN.

In at least one embodiment, NEF 2316 may provide means for securely exposing services and capabilities provided by 3GPP network functions for third party, internal exposure/re-exposure, Application Functions (e.g., AF 2326), edge computing or fog computing systems, etc. In at least one embodiment, NEF 2316 may authenticate, authorize, and/or throttle AFs. In at least one embodiment, NEF 2316 may also translate information exchanged with AF 2326 and information exchanged with internal network functions. In at least one embodiment, NEF 2316 may translate between an AF-Service-Identifier and an internal 5GC information. In at least one embodiment, NEF 2316 may also receive information from other network functions (NFs) based on exposed capabilities of other network functions. In at least one embodiment, this information may be stored at NEF 2316 as structured data, or at a data storage NF using a standardized interfaces. In at least one embodiment, stored information can then be re-exposed by NEF 2316 to other NFs and AFs, and/or used for other purposes such as analytics.

In at least one embodiment, NRF 2320 may support service discovery functions, receive NF Discovery Requests from NF instances, and provide information of discovered NF instances to NF instances. In at least one embodiment, NRF 2320 also maintains information of available NF instances and their supported services.

In at least one embodiment, PCF 2322 may provide policy rules to control plane function(s) to enforce them, and may also support unified policy framework to govern network behavior. In at least one embodiment, PCF 2322 may also implement a front end (FE) to access subscription information relevant for policy decisions in a UDR of UDM 2324.

In at least one embodiment, UDM 2324 may handle subscription-related information to support a network entities' handling of communication sessions, and may store subscription data of UE 2302. In at least one embodiment, UDM 2324 may include two parts, an application FE and a User Data Repository (UDR). In at least one embodiment, UDM may include a UDM FE, which is in charge of processing of credentials, location management, subscription management and so on. In at least one embodiment, several different front ends may serve a same user in different transactions. In at least one embodiment, UDM-FE accesses subscription information stored in an UDR and performs authentication credential processing; user identification handling; access authorization; registration/mobility management; and subscription management. In at least one embodiment, UDR may interact with PCF 2322. In at least one embodiment, UDM 2324 may also support SMS management, wherein an SMS-FE implements a similar application logic as discussed previously.

In at least one embodiment, AF 2326 may provide application influence on traffic routing, access to a Network Capability Exposure (NCE), and interact with a policy framework for policy control. In at least one embodiment, NCE may be a mechanism that allows a 5GC and AF 2326 to provide information to each other via NEF 2316, which may be used for edge computing implementations. In at least one embodiment, network operator and third party services may be hosted close to UE 2302 access point of attachment to achieve an efficient service delivery through a reduced end-to-end latency and load on a transport network. In at least one embodiment, for edge computing implementations, 5GC may select a UPF 2304 close to UE 2302 and execute traffic steering from UPF 2304 to DN 2306 via N6 interface. In at least one embodiment, this may be based on UE subscription data, UE location, and information provided by AF 2326. In at least one embodiment, AF 2326 may influence UPF (re) selection and traffic routing. In at least one embodiment, based on operator deployment, when AF 2326 is considered to be a trusted entity, a network operator may permit AF 2326 to interact directly with relevant NFs.

In at least one embodiment, CN 2310 may include an SMSF, which may be responsible for SMS subscription checking and verification, and relaying SM messages to/from UE 2302 to/from other entities, such as an SMS-GMSC/IWMSC/SMS-router. In at least one embodiment, SMS may also interact with AMF 2312 and UDM 2324 for notification procedure that UE 2302 is available for SMS transfer (e.g., set a UE not reachable flag, and notifying UDM 2324 when UE 2302 is available for SMS).

In at least one embodiment, system 2300 may include following service-based interfaces: Namf: Service-based interface exhibited by AMF; Nsmf: Service-based interface exhibited by SMF; Nnef: Service-based interface exhibited by NEF; Npcf: Service-based interface exhibited by PCF; Nudm: Service-based interface exhibited by UDM; Naf: Service-based interface exhibited by AF; Nnrf: Service-based interface exhibited by NRF; and Nausf: Service-based interface exhibited by AUSF.

In at least one embodiment, system 2300 may include following reference points: N1: Reference point between UE and AMF; N2: Reference point between (R)AN and AMF; N3: Reference point between (R)AN and UPF; N4: Reference point between SMF and UPF; and N6: Reference point between UPF and a Data Network. In at least one embodiment, there may be many more reference points and/or service-based interfaces between a NF services in NFs, however, these interfaces and reference points have been omitted for clarity. In at least one embodiment, an NS reference point may be between a PCF and AF; an N7 reference point may be between PCF and SMF; an N11 reference point between AMF and SMF; etc. In at least one embodiment, CN 2310 may include an Nx interface, which is an inter-CN interface between MME and AMF 2312 in order to enable interworking between CN 2310 and CN 2316.

In at least one embodiment, system 2300 may include multiple RAN nodes (such as (R)AN node 2308) wherein an Xn interface is defined between two or more (R)AN node 2308 (e.g., gNBs) that connecting to 5GC 410, between a (R)AN node 2308 (e.g., gNB) connecting to CN 2310 and an eNB (e.g., a macro RAN node), and/or between two eNBs connecting to CN 2310.

In at least one embodiment, Xn interface may include an Xn user plane (Xn-U) interface and an Xn control plane (Xn-C) interface. In at least one embodiment, Xn-U may provide non-guaranteed delivery of user plane PDUs and support/provide data forwarding and flow control functionality. In at least one embodiment, Xn-C may provide management and error handling functionality, functionality to manage a Xn-C interface; mobility support for UE 2302 in a connected mode (e.g., CM-CONNECTED) including functionality to manage UE mobility for connected mode between one or more (R)AN node 2308. In at least one embodiment, mobility support may include context transfer from an old (source) serving (R)AN node 2308 to new (target) serving (R)AN node 2308; and control of user plane tunnels between old (source) serving (R)AN node 2308 to new (target) serving (R)AN node 2308.

In at least one embodiment, a protocol stack of a Xn-U may include a transport network layer built on Internet Protocol (IP) transport layer, and a GTP-U layer on top of a UDP and/or IP layer(s) to carry user plane PDUs. In at least one embodiment, Xn-C protocol stack may include an application layer signaling protocol (referred to as Xn Application Protocol (Xn-AP)) and a transport network layer that is built on an SCTP layer. In at least one embodiment, SCTP layer may be on top of an IP layer. In at least one embodiment, SCTP layer provides a guaranteed delivery of application layer messages. In at least one embodiment, in a transport IP layer point-to-point transmission is used to deliver signaling PDUs. In at least one embodiment, Xn-U protocol stack and/or a Xn-C protocol stack may be same or similar to an user plane and/or control plane protocol stack(s) shown and described herein.

Figure 24:
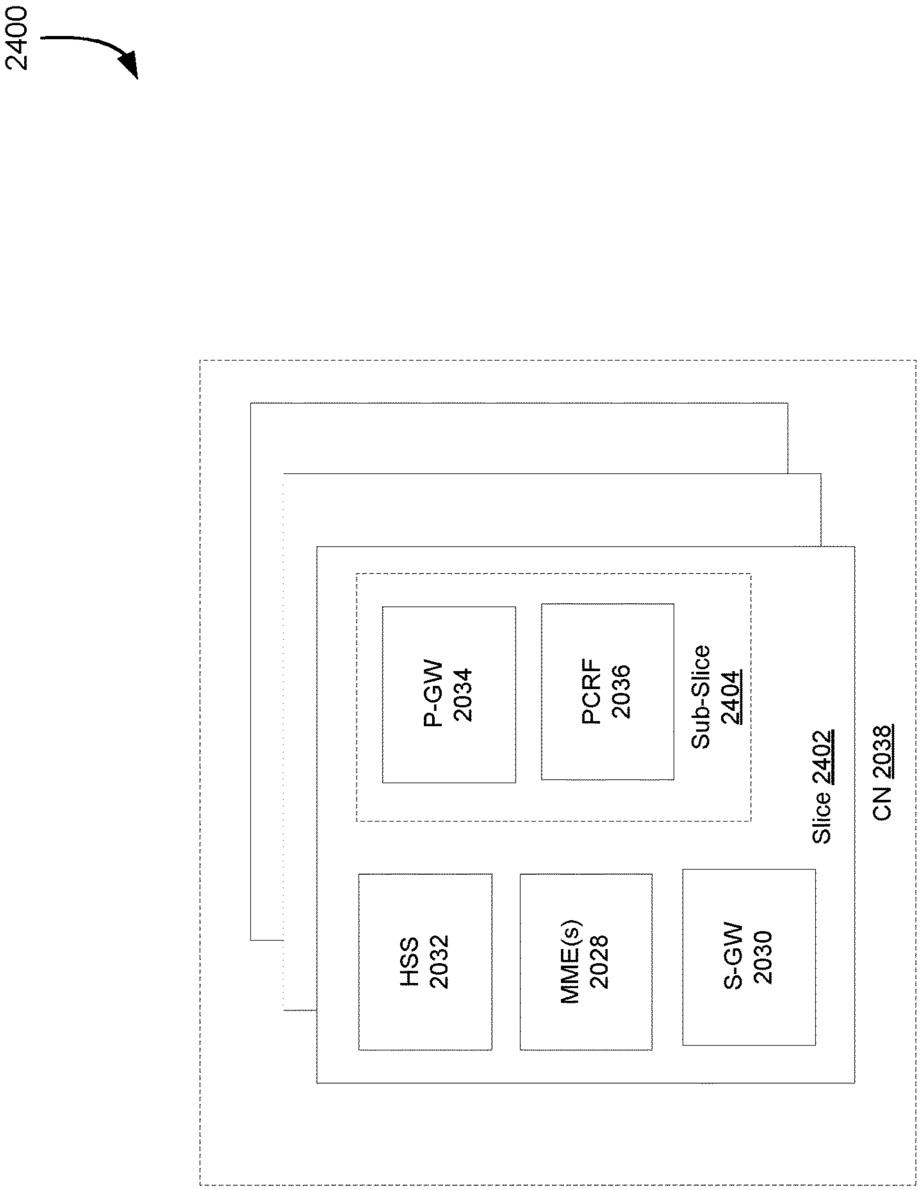
FIG. 24 illustrates components of a core network, in accordance with at least one embodiment.

FIG. 24 illustrates components 2400 of a core network in accordance with at least one embodiment. In at least one embodiment, components of CN 2038 may be implemented in one physical node or separate physical nodes including components to read and execute instructions from a machine-readable or computer-readable medium (e.g., a non-transitory machine-readable storage medium). In at least one embodiment, Network Functions Virtualization (NFV) is utilized to virtualize any or all of above described network node functions via executable instructions stored in one or more computer readable storage mediums (described in further detail below). In at least one embodiment, a logical instantiation of CN 2038 may be referred to as a network slice 2402 (e.g., network slice 2402 is shown to include HSS 2032, MME(s) 2028, and S-GW 2030). In at least one embodiment, a logical instantiation of a portion of CN 2038 may be referred to as a network sub-slice 2404 (e.g., network sub-slice 2404 is shown to include P-GW 2034 and PCRF 2036).

In at least one embodiment, NFV architectures and infrastructures may be used to virtualize one or more network functions, alternatively performed by proprietary hardware, onto physical resources comprising a combination of industry-standard server hardware, storage hardware, or switches. In at least one embodiment, NFV systems can be used to execute virtual or reconfigurable implementations of one or more EPC components/functions.

Figure 25:
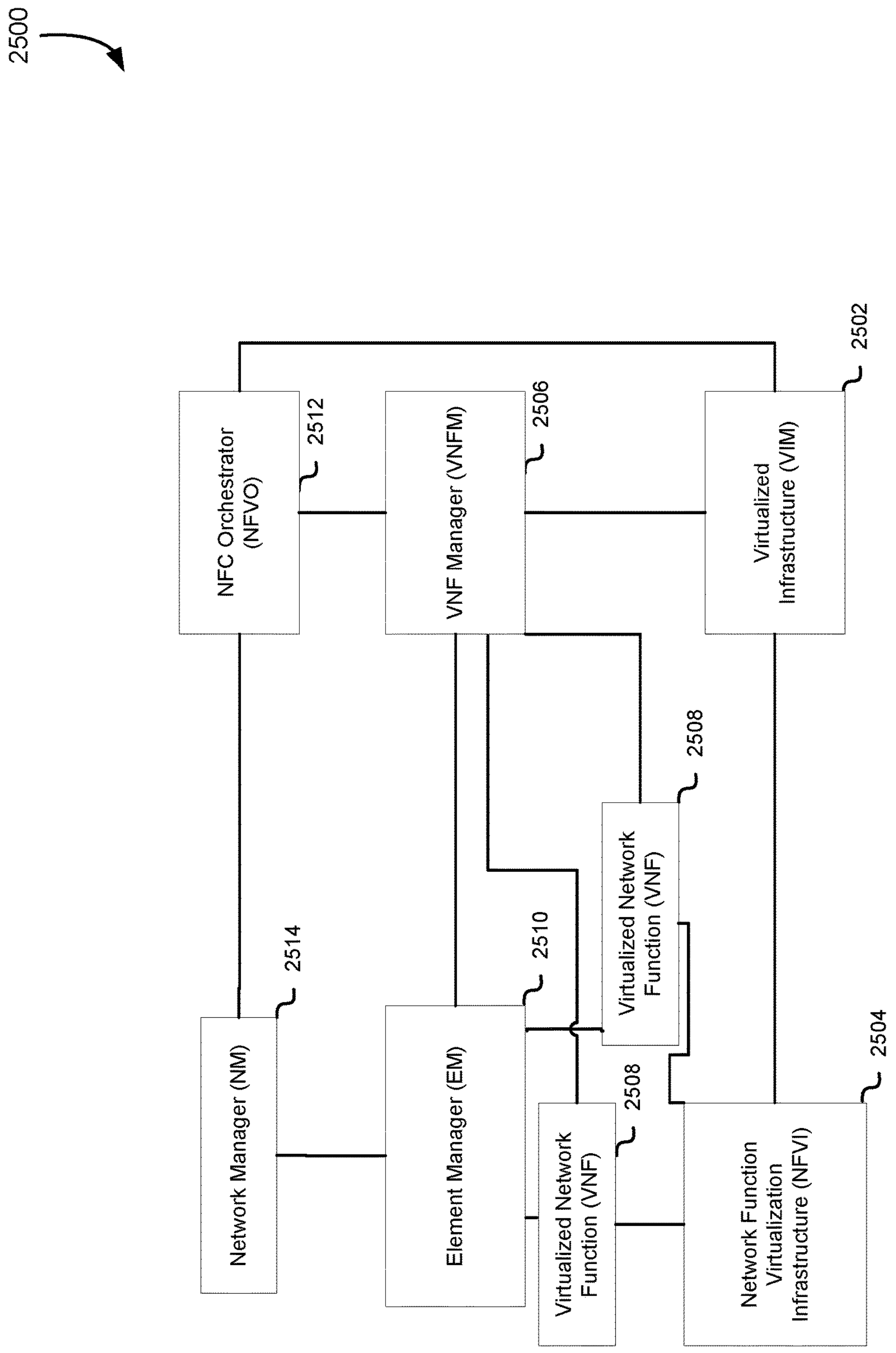
FIG. 25 illustrates components of a system to support network function virtualization (NFV), in accordance with at least one embodiment.

FIG. 25 is a block diagram illustrating components, according to at least one embodiment, of a system 2500 to support network function virtualization (NFV). In at least one embodiment, system 2500 is illustrated as including a virtualized infrastructure manager (shown as VIM 2502), a network function virtualization infrastructure (shown as NFVI 2504), a VNF manager (shown as VNFM 2506), virtualized network functions (shown as VNF 2508), an element manager (shown as EM 2510), an NFV Orchestrator (shown as NFVO 2512), and a network manager (shown as NM 2514).

In at least one embodiment, VIM 2502 manages resources of NFVI 2504. In at least one embodiment, NFVI 2504 can include physical or virtual resources and applications (including hypervisors) used to execute system 2500. In at least one embodiment, VIM 2502 may manage a life cycle of virtual resources with NFVI 2504 (e.g., creation, maintenance, and tear down of virtual machines (VMs) associated with one or more physical resources), track VM instances, track performance, fault and security of VM instances and associated physical resources, and expose VM instances and associated physical resources to other management systems.

In at least one embodiment, VNFM 2506 may manage VNF 2508. In at least one embodiment, VNF 2508 may be used to execute EPC components/functions. In at least one embodiment, VNFM 2506 may manage a life cycle of VNF 2508 and track performance, fault and security of virtual aspects of VNF 2508. In at least one embodiment, EM 2510 may track performance, fault and security of functional aspects of VNF 2508. In at least one embodiment, tracking data from VNFM 2506 and EM 2510 may comprise, for example, performance measurement (PM) data used by VIM 2502 or NFVI 2504. In at least one embodiment, both VNFM 2506 and EM 2510 can scale up/down a quantity of VNFs of system 2500.

In at least one embodiment, NFVO 2512 may coordinate, authorize, release and engage resources of NFVI 2504 in order to provide a requested service (e.g., to execute an EPC function, component, or slice). In at least one embodiment, NM 2514 may provide a package of end-user functions with responsibility for a management of a network, which may include network elements with VNFs, non-virtualized network functions, or both (management of VNFs may occur via an EM 2510).

Computer-Based Systems

The following figures set forth, without limitation, exemplary computer-based systems that can be used to implement at least one embodiment.

Figure 26:
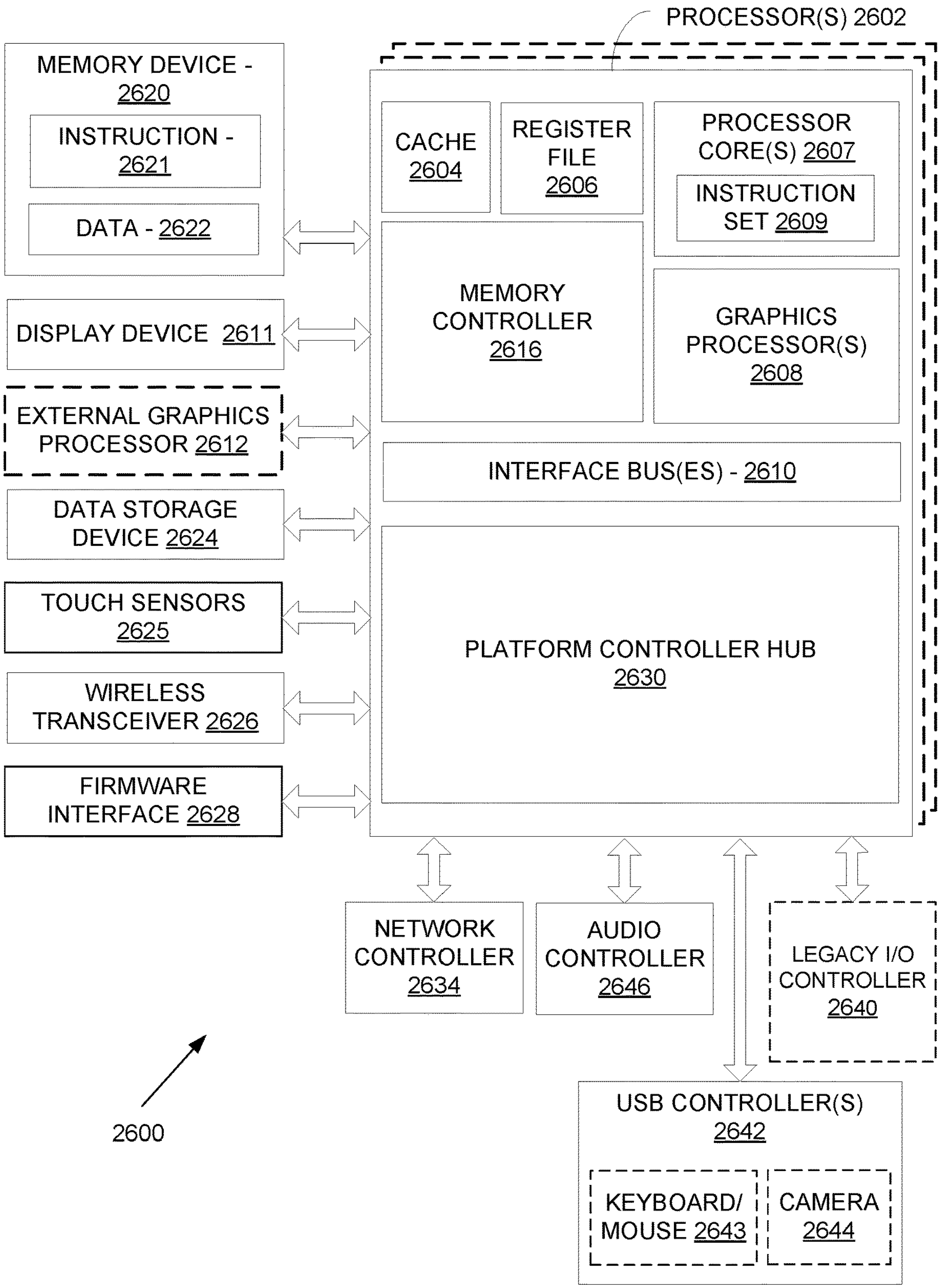
FIG. 26 illustrates a processing system, in accordance with at least one embodiment.

FIG. 26 illustrates a processing system 2600, in accordance with at least one embodiment. In at least one embodiment, processing system 2600 includes one or more processors 2602 and one or more graphics processors 2608, and may be a single processor desktop system, a multiprocessor workstation system, or a server system having a large number of processors 2602 or processor cores 2607. In at least one embodiment, processing system 2600 is a processing platform incorporated within a system-on-a-chip ("SoC") integrated circuit for use in mobile, handheld, or embedded devices.

In at least one embodiment, processing system 2600 can include, or be incorporated within a server-based gaming platform, a game console, a media console, a mobile gaming console, a handheld game console, or an online game console. In at least one embodiment, processing system 2600 is a mobile phone, smart phone, tablet computing device or mobile Internet device. In at least one embodiment, processing system 2600 can also include, couple with, or be integrated within a wearable device, such as a smart watch wearable device, smart eyewear device, augmented reality device, or virtual reality device. In at least one embodiment, processing system 2600 is a television or set top box device having one or more processors 2602 and a graphical interface generated by one or more graphics processors 2608.

In at least one embodiment, one or more processors 2602 each include one or more processor cores 2607 to process instructions which, when executed, perform operations for system and user software. In at least one embodiment, each of one or more processor cores 2607 is configured to process a specific instruction set 2609. In at least one embodiment, instruction set 2609 may facilitate Complex Instruction Set Computing ("CISC"), Reduced Instruction Set Computing ("RISC"), or computing via a Very Long Instruction Word ("VLIW"). In at least one embodiment, processor cores 2607 may each process a different instruction set 2609, which may include instructions to facilitate emulation of other instruction sets. In at least one embodiment, processor core 2607 may also include other processing devices, such as a digital signal processor ("DSP").

In at least one embodiment, processor 2602 includes cache memory ('cache") 2604. In at least one embodiment, processor 2602 can have a single internal cache or multiple levels of internal cache. In at least one embodiment, cache memory is shared among various components of processor 2602. In at least one embodiment, processor 2602 also uses an external cache (e.g., a Level 3 ("L3") cache or Last Level Cache ("LLC")) (not shown), which may be shared among processor cores 2607 using known cache coherency techniques. In at least one embodiment, register file 2606 is additionally included in processor 2602 which may include different types of registers for storing different types of data (e.g., integer registers, floating point registers, status registers, and an instruction pointer register). In at least one embodiment, register file 2606 may include general-purpose registers or other registers.

In at least one embodiment, one or more processor(s) 2602 are coupled with one or more interface bus(es) 2610 to transmit communication signals such as address, data, or control signals between processor 2602 and other components in processing system 2600. In at least one embodiment interface bus 2610, in one embodiment, can be a processor bus, such as a version of a Direct Media Interface ("DMI") bus. In at least one embodiment, interface bus 2610 is not limited to a DMI bus, and may include one or more Peripheral Component Interconnect buses (e.g., "PCI," PCI Express ("PCIe")), memory buses, or other types of interface buses. In at least one embodiment processor(s) 2602 include an integrated memory controller 2616 and a platform controller hub 2630. In at least one embodiment, memory controller 2616 facilitates communication between a memory device and other components of processing system 2600, while platform controller hub ("PCH") 2630 provides connections to Input/Output ("I/O") devices via a local I/O bus.

In at least one embodiment, memory device 2620 can be a dynamic random access memory ("DRAM") device, a static random access memory ("SRAM") device, flash memory device, phase-change memory device, or some other memory device having suitable performance to serve as processor memory. In at least one embodiment memory device 2620 can operate as system memory for processing system 2600, to store data 2622 and instructions 2621 for use when one or more processors 2602 executes an application or process. In at least one embodiment, memory controller 2616 also couples with an optional external graphics processor 2612, which may communicate with one or more graphics processors 2608 in processors 2602 to perform graphics and media operations. In at least one embodiment, a display device 2611 can connect to processor(s) 2602. In at least one embodiment display device 2611 can include one or more of an internal display device, as in a mobile electronic device or a laptop device or an external display device attached via a display interface (e.g., DisplayPort, etc.). In at least one embodiment, display device 2611 can include a head mounted display ("HMD") such as a stereoscopic display device for use in virtual reality ("VR") applications or augmented reality ("AR") applications.

In at least one embodiment, platform controller hub 2630 enables peripherals to connect to memory device 2620 and processor 2602 via a high-speed I/O bus. In at least one embodiment, I/O peripherals include, but are not limited to, an audio controller 2646, a network controller 2634, a firmware interface 2628, a wireless transceiver 2626, touch sensors 2625, a data storage device 2624 (e.g., hard disk drive, flash memory, etc.). In at least one embodiment, data storage device 2624 can connect via a storage interface (e.g., SATA) or via a peripheral bus, such as PCI, or PCIe. In at least one embodiment, touch sensors 2625 can include touch screen sensors, pressure sensors, or fingerprint sensors. In at least one embodiment, wireless transceiver 2626 can be a Wi-Fi transceiver, a Bluetooth transceiver, or a mobile network transceiver such as a 3G, 4G, or Long Term Evolution ("LTE") transceiver. In at least one embodiment, firmware interface 2628 enables communication with system firmware, and can be, for example, a unified extensible firmware interface ("UEFI"). In at least one embodiment, network controller 2634 can enable a network connection to a wired network. In at least one embodiment, a high-performance network controller (not shown) couples with interface bus 2610. In at least one embodiment, audio controller 2646 is a multi-channel high definition audio controller. In at least one embodiment, processing system 2600 includes an optional legacy I/O controller 2640 for coupling legacy (e.g., Personal System 2 ("PS/2")) devices to processing system 2600. In at least one embodiment, platform controller hub 2630 can also connect to one or more Universal Serial Bus ("USB") controllers 2642 connect input devices, such as keyboard and mouse 2643 combinations, a camera 2644, or other USB input devices.

In at least one embodiment, an instance of memory controller 2616 and platform controller hub 2630 may be integrated into a discreet external graphics processor, such as external graphics processor 2612. In at least one embodiment, platform controller hub 2630 and/or memory controller 2616 may be external to one or more processor(s) 2602. For example, in at least one embodiment, processing system 2600 can include an external memory controller 2616 and platform controller hub 2630, which may be configured as a memory controller hub and peripheral controller hub within a system chipset that is in communication with processor(s) 2602.

Figure 27:
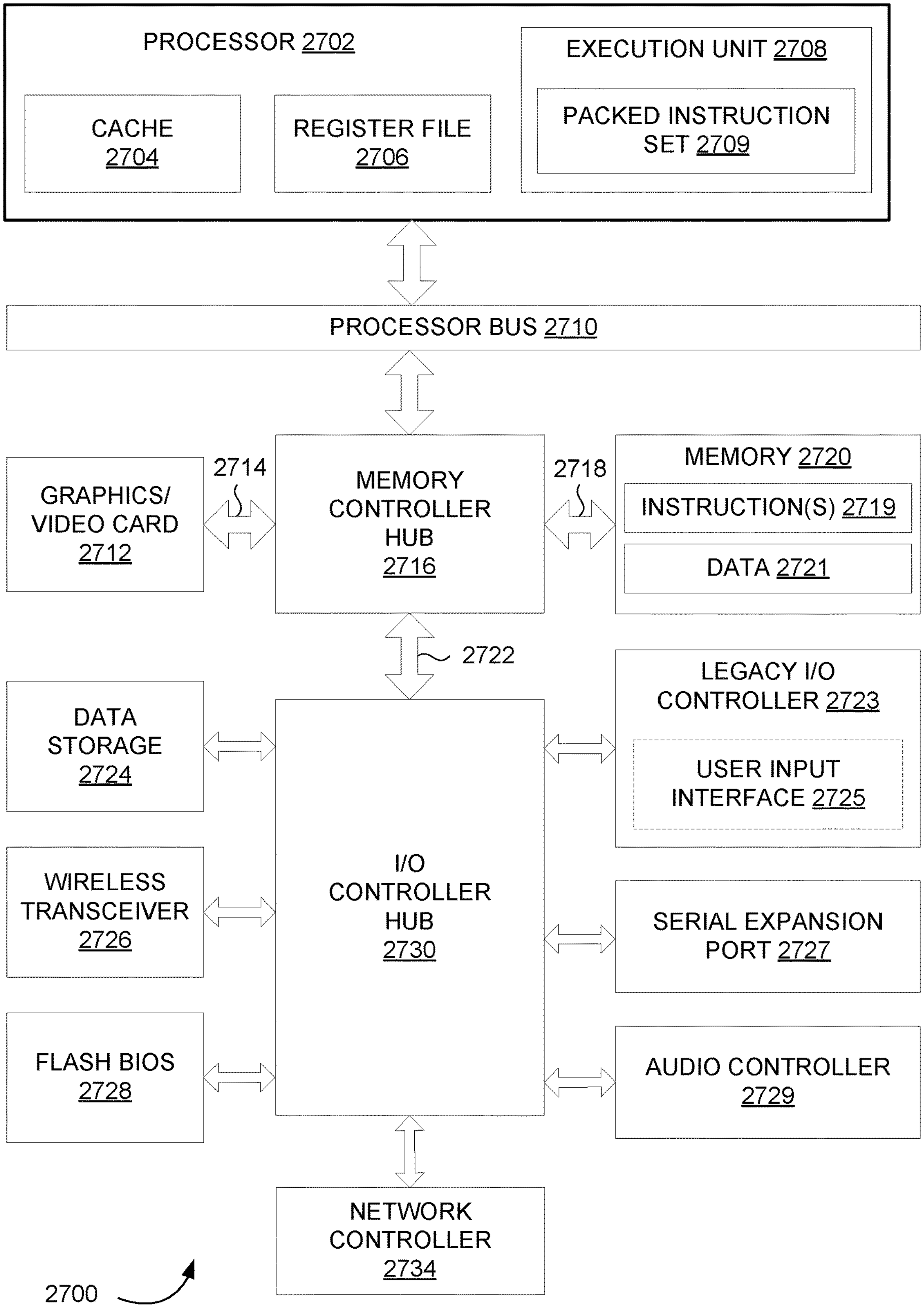
FIG. 27 illustrates a computer system, in accordance with at least one embodiment.

FIG. 27 illustrates a computer system 2700, in accordance with at least one embodiment. In at least one embodiment, computer system 2700 may be a system with interconnected devices and components, an SOC, or some combination. In at least one embodiment, computer system 2700 is formed with a processor 2702 that may include execution units to execute an instruction. In at least one embodiment, computer system 2700 may include, without limitation, a component, such as processor 2702 to employ execution units including logic to perform algorithms for processing data. In at least one embodiment, computer system 2700 may include processors, such as PENTIUM® Processor family, Xeon™, Itanium®, XScale™ and/or StrongARM™, Intel® Core™, or Intel® Nervana™ microprocessors available from Intel Corporation of Santa Clara, California, although other systems (including PCs having other microprocessors, engineering workstations, set-top boxes and like) may also be used. In at least one embodiment, computer system 2700 may execute a version of WINDOWS' operating system available from Microsoft Corporation of Redmond, Wash., although other operating systems (UNIX and Linux for example), embedded software, and/or graphical user interfaces, may also be used.

In at least one embodiment, computer system 2700 may be used in other devices such as handheld devices and embedded applications. Some examples of handheld devices include cellular phones, Internet Protocol devices, digital cameras, personal digital assistants ("PDAs"), and handheld PCs. In at least one embodiment, embedded applications may include a microcontroller, a digital signal processor (DSP), an SoC, network computers ("NetPCs"), set-top boxes, network hubs, wide area network ("WAN") switches, or any other system that may perform one or more instructions.

In at least one embodiment, computer system 2700 may include, without limitation, processor 2702 that may include, without limitation, one or more execution units 2708 that may be configured to execute a Compute Unified Device Architecture ("CUDA") (CUDA® is developed by NVIDIA Corporation of Santa Clara, CA) program. In at least one embodiment, a CUDA program is at least a portion of a software application written in a CUDA programming language. In at least one embodiment, computer system 2700 is a single processor desktop or server system. In at least one embodiment, computer system 2700 may be a multiprocessor system. In at least one embodiment, processor 2702 may include, without limitation, a CISC microprocessor, a RISC microprocessor, a VLIW microprocessor, a processor implementing a combination of instruction sets, or any other processor device, such as a digital signal processor, for example. In at least one embodiment, processor 2702 may be coupled to a processor bus 2710 that may transmit data signals between processor 2702 and other components in computer system 2700.

In at least one embodiment, processor 2702 may include, without limitation, a Level 1 ("L1") internal cache memory ("cache") 2704. In at least one embodiment, processor 2702 may have a single internal cache or multiple levels of internal cache. In at least one embodiment, cache memory may reside external to processor 2702. In at least one embodiment, processor 2702 may also include a combination of both internal and external caches. In at least one embodiment, a register file 2706 may store different types of data in various registers including, without limitation, integer registers, floating point registers, status registers, and instruction pointer register.

In at least one embodiment, execution unit 2708, including, without limitation, logic to perform integer and floating point operations, also resides in processor 2702. Processor 2702 may also include a microcode ("ucode") read only memory ("ROM") that stores microcode for certain macro instructions. In at least one embodiment, execution unit 2708 may include logic to handle a packed instruction set 2709. In at least one embodiment, by including packed instruction set 2709 in an instruction set of a general-purpose processor 2702, along with associated circuitry to execute instructions, operations used by many multimedia applications may be performed using packed data in a general-purpose processor 2702. In at least one embodiment, many multimedia applications may be accelerated and executed more efficiently by using full width of a processor's data bus for performing operations on packed data, which may eliminate a need to transfer smaller units of data across a processor's data bus to perform one or more operations one data element at a time.

In at least one embodiment, execution unit 2708 may also be used in microcontrollers, embedded processors, graphics devices, DSPs, and other types of logic circuits. In at least one embodiment, computer system 2700 may include, without limitation, a memory 2720. In at least one embodiment, memory 2720 may be implemented as a DRAM device, an SRAM device, flash memory device, or other memory device. Memory 2720 may store instruction(s) 2719 and/or data 2721 represented by data signals that may be executed by processor 2702.

In at least one embodiment, a system logic chip may be coupled to processor bus 2710 and memory 2720. In at least one embodiment, a system logic chip may include, without limitation, a memory controller hub ("MCH") 2716, and processor 2702 may communicate with MCH 2716 via processor bus 2710. In at least one embodiment, MCH 2716 may provide a high bandwidth memory path 2718 to memory 2720 for instruction and data storage and for storage of graphics commands, data and textures. In at least one embodiment, MCH 2716 may direct data signals between processor 2702, memory 2720, and other components in computer system 2700 and to bridge data signals between processor bus 2710, memory 2720, and a system I/O 2722. In at least one embodiment, system logic chip may provide a graphics port for coupling to a graphics controller. In at least one embodiment, MCH 2716 may be coupled to memory 2720 through high bandwidth memory path 2718 and graphics/video card 2712 may be coupled to MCH 2716 through an Accelerated Graphics Port ("AGP") interconnect 2714.

In at least one embodiment, computer system 2700 may use system I/O 2722 that is a proprietary hub interface bus to couple MCH 2716 to I/O controller hub ("ICH") 2730. In at least one embodiment, ICH 2730 may provide direct connections to some I/O devices via a local I/O bus. In at least one embodiment, local I/O bus may include, without limitation, a high-speed I/O bus for connecting peripherals to memory 2720, a chipset, and processor 2702. Examples may include, without limitation, an audio controller 2729, a firmware hub ("flash BIOS") 2728, a wireless transceiver 2726, a data storage 2724, a legacy I/O controller 2723 containing a user input interface 2725 and a keyboard interface, a serial expansion port 2727, such as a USB, and a network controller 2734. Data storage 2724 may comprise a hard disk drive, a floppy disk drive, a CD-ROM device, a flash memory device, or other mass storage device.

In at least one embodiment, FIG. 27 illustrates a system, which includes interconnected hardware devices or "chips." In at least one embodiment, FIG. 27 may illustrate an exemplary SoC. In at least one embodiment, devices illustrated in FIG. 27 may be interconnected with proprietary interconnects, standardized interconnects (e.g., PCIe), or some combination thereof. In at least one embodiment, one or more components of system 2700 are interconnected using compute express link ("CXL") interconnects.

Figure 28:
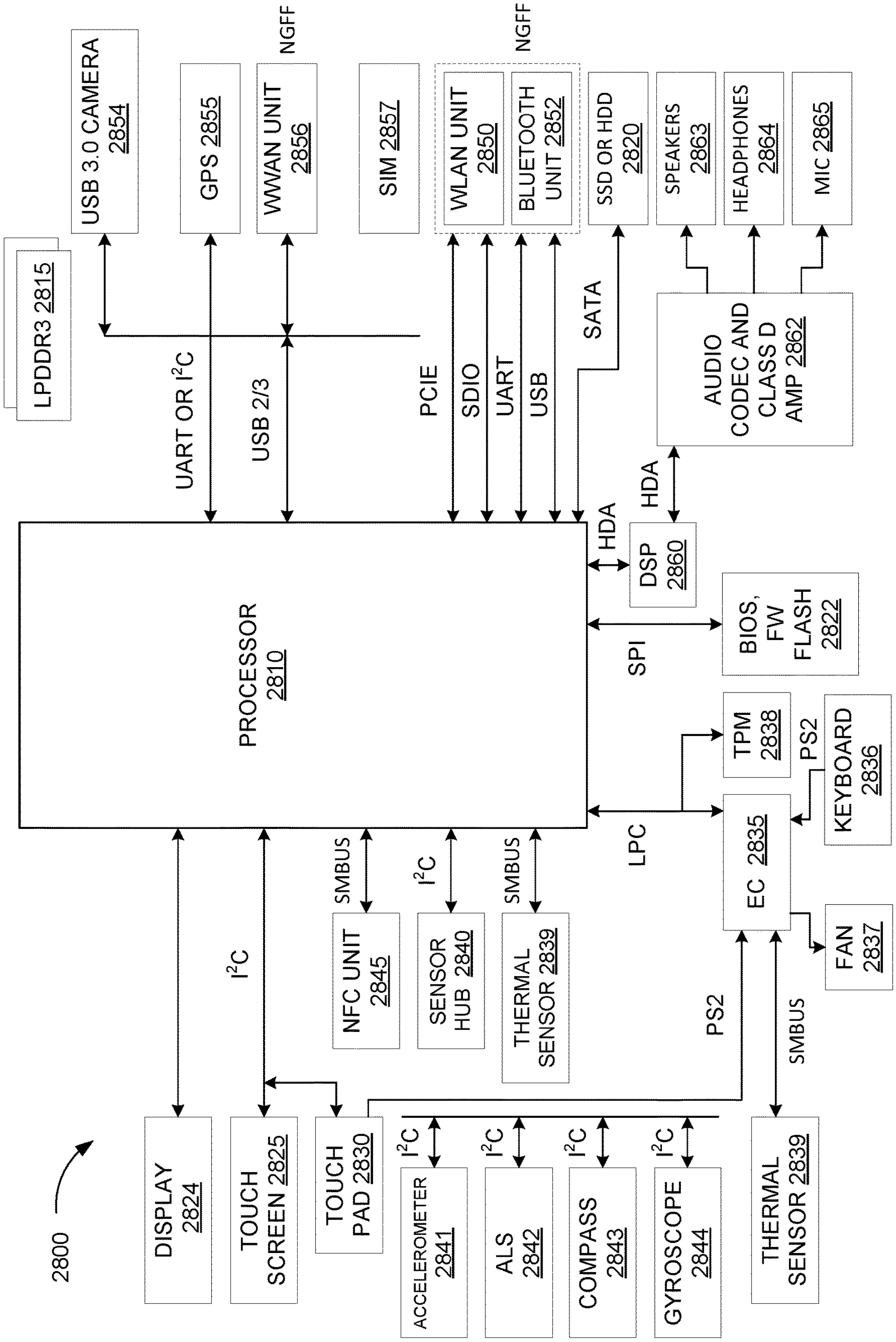
FIG. 28 illustrates a system, in accordance with at least one embodiment.

FIG. 28 illustrates a system 2800, in accordance with at least one embodiment. In at least one embodiment, system 2800 is an electronic device that utilizes a processor 2810. In at least one embodiment, system 2800 may be, for example and without limitation, a notebook, a tower server, a rack server, a blade server, a laptop, a desktop, a tablet, a mobile device, a phone, an embedded computer, or any other suitable electronic device.

In at least one embodiment, system 2800 may include, without limitation, processor 2810 communicatively coupled to any suitable number or kind of components, peripherals, modules, or devices. In at least one embodiment, processor 2810 is coupled using a bus or interface, such as an I2C bus, a System Management Bus ("SMBus"), a Low Pin Count ("LPC") bus, a Serial Peripheral Interface ("SPI"), a High Definition Audio ("HDA") bus, a Serial Advance Technology Attachment ("SATA") bus, a USB (versions 1, 2, 3), or a Universal Asynchronous Receiver/Transmitter ("UART") bus. In at least one embodiment, FIG. 28 illustrates a system which includes interconnected hardware devices or "chips." In at least one embodiment, FIG. 28 may illustrate an exemplary SoC. In at least one embodiment, devices illustrated in FIG. 28 may be interconnected with proprietary interconnects, standardized interconnects (e.g., PCIe) or some combination thereof. In at least one embodiment, one or more components of FIG. 28 are interconnected using CXL interconnects.

In at least one embodiment, FIG. 28 may include a display 2824, a touch screen 2825, a touch pad 2830, a Near Field Communications unit ("NFC") 2845, a sensor hub 2840, a thermal sensor 2846, an Express Chipset ("EC") 2835, a Trusted Platform Module ("TPM") 2838, BIOS/firmware/flash memory ("BIOS, FW Flash") 2822, a DSP 2860, a Solid State Disk ("SSD") or Hard Disk Drive ("HDD") 2820, a wireless local area network unit ("WLAN") 2850, a Bluetooth unit 2852, a Wireless Wide Area Network unit ("WWAN") 2856, a Global Positioning System ("GPS") 2855, a camera ("USB 3.0 camera") 2854 such as a USB 3.0 camera, or a Low Power Double Data Rate ("LPDDR") memory unit ("LPDDR3") 2815 implemented in, for example, LPDDR3 standard. These components may each be implemented in any suitable manner.

In at least one embodiment, other components may be communicatively coupled to processor 2810 through components discussed above. In at least one embodiment, an accelerometer 2841, an Ambient Light Sensor ("ALS") 2842, a compass 2843, and a gyroscope 2844 may be communicatively coupled to sensor hub 2840. In at least one embodiment, a thermal sensor 2839, a fan 2837, a keyboard 2846, and a touch pad 2830 may be communicatively coupled to EC 2835. In at least one embodiment, a speaker 2863, a headphones 2864, and a microphone ("mic") 2865 may be communicatively coupled to an audio unit ("audio codec and class d amp") 2864, which may in turn be communicatively coupled to DSP 2860. In at least one embodiment, audio unit 2864 may include, for example and without limitation, an audio coder/decoder ("codec") and a class D amplifier. In at least one embodiment, a SIM card ("SIM") 2857 may be communicatively coupled to WWAN unit 2856. In at least one embodiment, components such as WLAN unit 2850 and Bluetooth unit 2852, as well as WWAN unit 2856 may be implemented in a Next Generation Form Factor ("NGFF").

Figure 29:
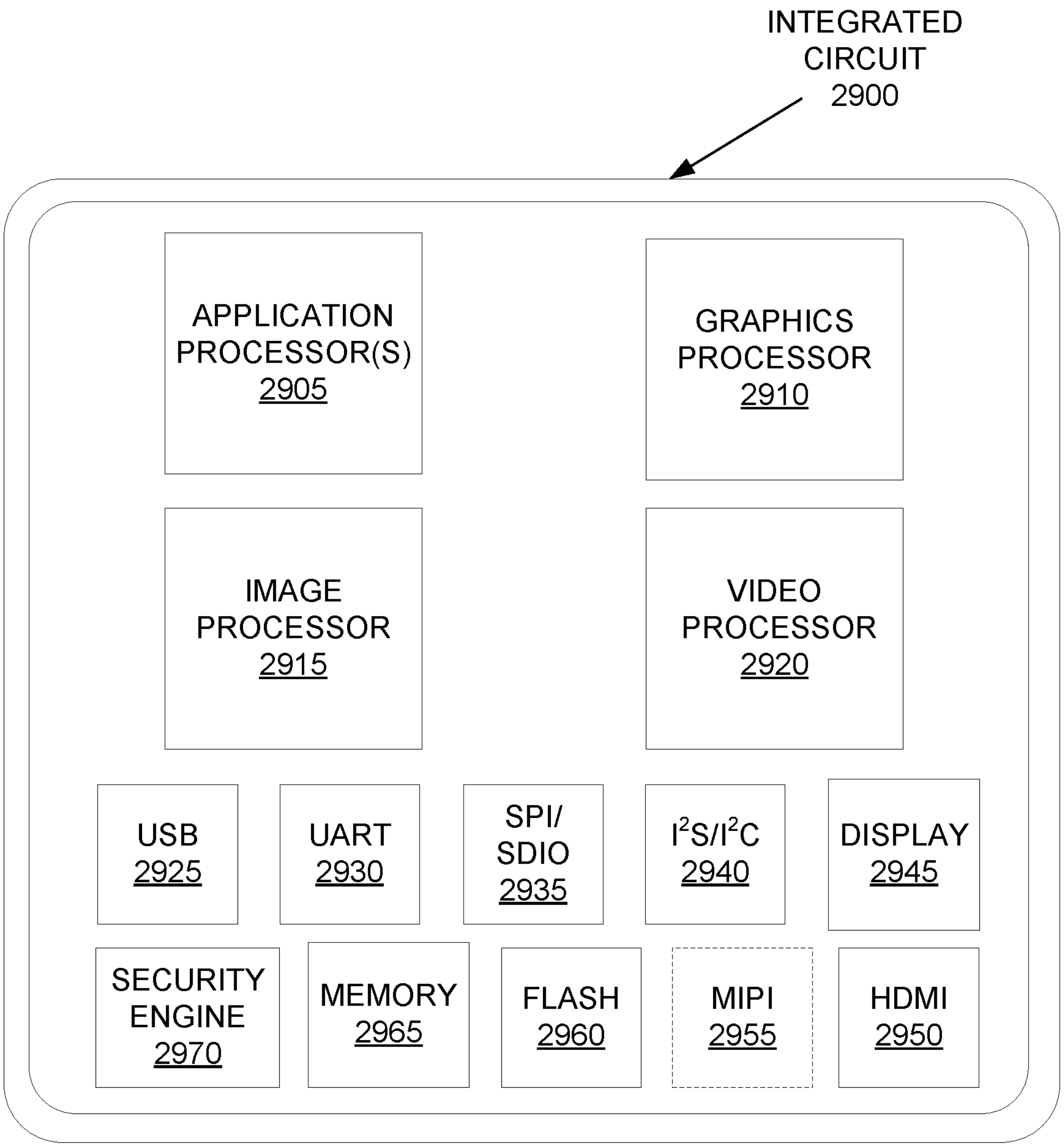
FIG. 29 illustrates an exemplary integrated circuit, in accordance with at least one embodiment.

FIG. 29 illustrates an exemplary integrated circuit 2900, in accordance with at least one embodiment. In at least one embodiment, exemplary integrated circuit 2900 is an SoC that may be fabricated using one or more IP cores. In at least one embodiment, integrated circuit 2900 includes one or more application processor(s) 2905 (e.g., CPUs), at least one graphics processor 2910, and may additionally include an image processor 2915 and/or a video processor 2920, any of which may be a modular IP core. In at least one embodiment, integrated circuit 2900 includes peripheral or bus logic including a USB controller 2925, a UART controller 2930, an SPI/SDIO controller 2935, and an $I^2S/I^2C$ controller 2940. In at least one embodiment, integrated circuit 2900 can include a display device 2945 coupled to one or more of a high-definition multimedia interface ("HDMI") controller 2950 and a mobile industry processor interface ("MIPI") display interface 2955. In at least one embodiment, storage may be provided by a flash memory subsystem 2960 including flash memory and a flash memory controller. In at least one embodiment, a memory interface may be provided via a memory controller 2965 for access to SDRAM or SRAM memory devices. In at least one embodiment, some integrated circuits additionally include an embedded security engine 2970.

Figure 30:
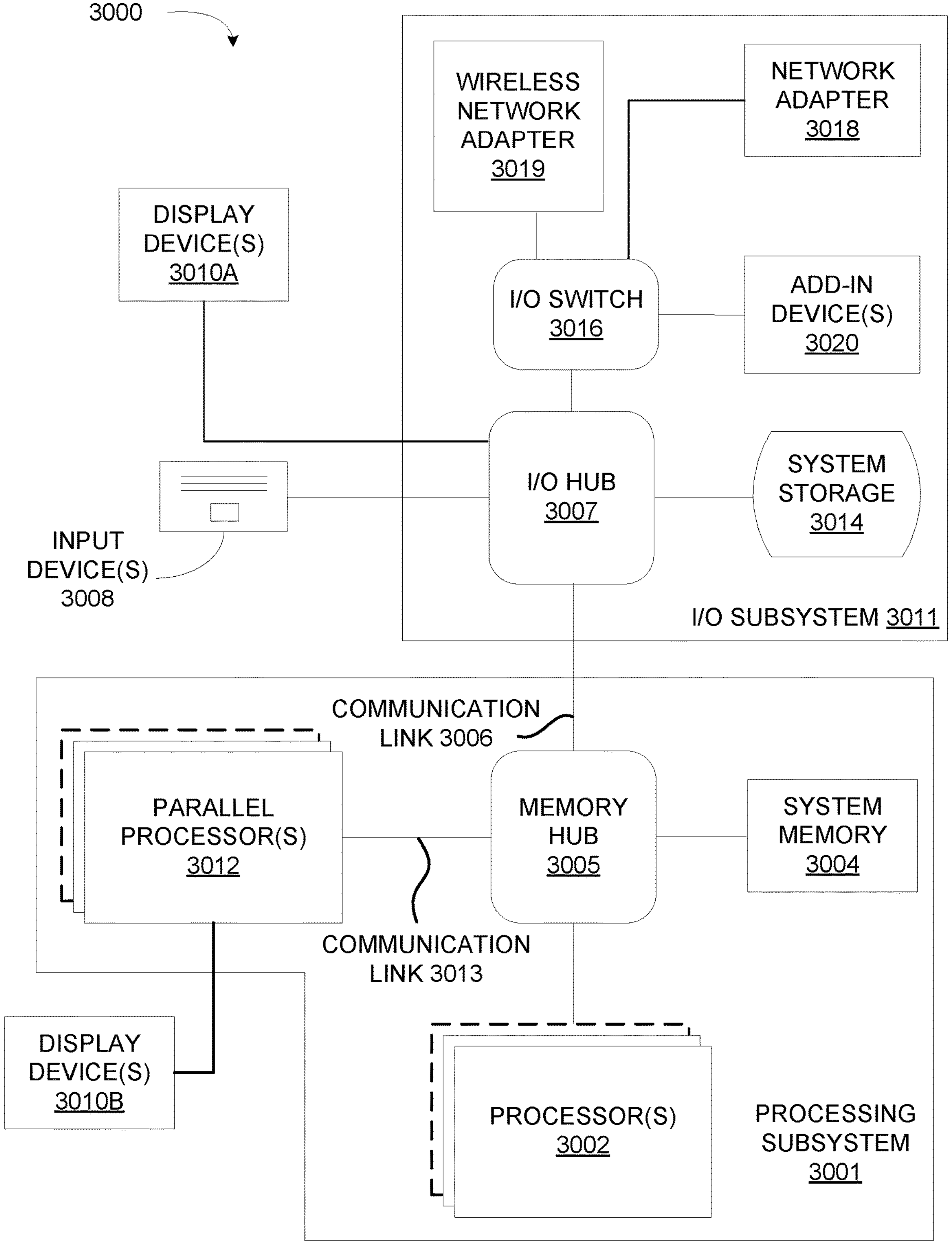
FIG. 30 illustrates a computing system, according to at least one embodiment.

FIG. 30 illustrates a computing system 3000, according to at least one embodiment; In at least one embodiment, computing system 3000 includes a processing subsystem 3001 having one or more processor(s) 3002 and a system memory 3004 communicating via an interconnection path that may include a memory hub 3005. In at least one embodiment, memory hub 3005 may be a separate component within a chipset component or may be integrated within one or more processor(s) 3002. In at least one embodiment, memory hub 3005 couples with an I/O subsystem 3011 via a communication link 3006. In at least one embodiment, I/O subsystem 3011 includes an I/O hub 3007 that can enable computing system 3000 to receive input from one or more input device(s) 3008. In at least one embodiment, I/O hub 3007 can enable a display controller, which may be included in one or more processor(s) 3002, to provide outputs to one or more display device(s) 3010A. In at least one embodiment, one or more display device(s) 3010A coupled with I/O hub 3007 can include a local, internal, or embedded display device.

In at least one embodiment, processing subsystem 3001 includes one or more parallel processor(s) 3012 coupled to memory hub 3005 via a bus or other communication link 3013. In at least one embodiment, communication link 3013 may be one of any number of standards based communication link technologies or protocols, such as, but not limited to PCIe, or may be a vendor specific communications interface or communications fabric. In at least one embodiment, one or more parallel processor(s) 3012 form a computationally focused parallel or vector processing system that can include a large number of processing cores and/or processing clusters, such as a many integrated core processor. In at least one embodiment, one or more parallel processor(s) 3012 form a graphics processing subsystem that can output pixels to one of one or more display device(s) 3010A coupled via I/O Hub 3007. In at least one embodiment, one or more parallel processor(s) 3012 can also include a display controller and display interface (not shown) to enable a direct connection to one or more display device(s) 3010B.

In at least one embodiment, a system storage unit 3014 can connect to I/O hub 3007 to provide a storage mechanism for computing system 3000. In at least one embodiment, an I/O switch 3016 can be used to provide an interface mechanism to enable connections between I/O hub 3007 and other components, such as a network adapter 3018 and/or wireless network adapter 3019 that may be integrated into a platform, and various other devices that can be added via one or more add-in device(s) 3020. In at least one embodiment, network adapter 3018 can be an Ethernet adapter or another wired network adapter. In at least one embodiment, wireless network adapter 3019 can include one or more of a Wi-Fi, Bluetooth, NFC, or other network device that includes one or more wireless radios.

In at least one embodiment, computing system 3000 can include other components not explicitly shown, including USB or other port connections, optical storage drives, video capture devices, and/or variations thereof, that may also be connected to I/O hub 3007. In at least one embodiment, communication paths interconnecting various components in FIG. 30 may be implemented using any suitable protocols, such as PCI based protocols (e.g., PCIe), or other bus or point-to-point communication interfaces and/or protocol(s), such as NVLink high-speed interconnect, or interconnect protocols.

In at least one embodiment, one or more parallel processor(s) 3012 incorporate circuitry optimized for graphics and video processing, including, for example, video output circuitry, and constitutes a graphics processing unit ("GPU"). In at least one embodiment, one or more parallel processor(s) 3012 incorporate circuitry optimized for general purpose processing. In at least embodiment, components of computing system 3000 may be integrated with one or more other system elements on a single integrated circuit. For example, in at least one embodiment, one or more parallel processor(s) 3012, memory hub 3005, processor(s) 3002, and I/O hub 3007 can be integrated into a SoC integrated circuit. In at least one embodiment, components of computing system 3000 can be integrated into a single package to form a system in package ("SIP") configuration. In at least one embodiment, at least a portion of components of computing system 3000 can be integrated into a multi-chip module ("MCM"), which can be interconnected with other multi-chip modules into a modular computing system. In at least one embodiment, I/O subsystem 3011 and display devices 3010B are omitted from computing system 3000.

Processing Systems

The following figures set forth, without limitation, exemplary processing systems that can be used to implement at least one embodiment.

Figure 31:
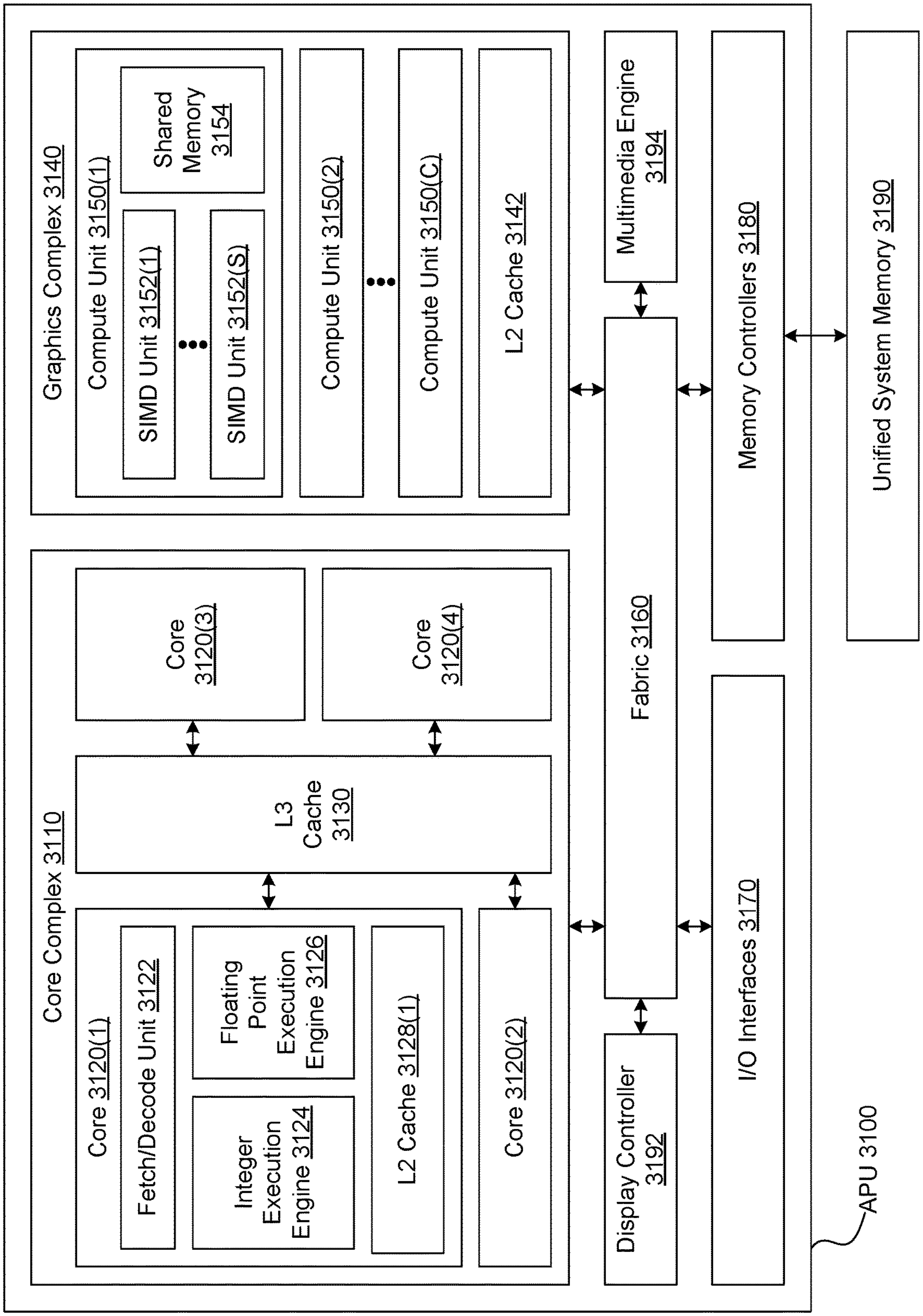
FIG. 31 illustrates an APU, in accordance with at least one embodiment.

FIG. 31 illustrates an accelerated processing unit ("APU") 3100, in accordance with at least one embodiment. In at least one embodiment, APU 3100 is developed by AMD Corporation of Santa Clara, CA. In at least one embodiment, APU 3100 can be configured to execute an application program, such as a CUDA program. In at least one embodiment, APU 3100 includes, without limitation, a core complex 3110, a graphics complex 3140, fabric 3160, I/O interfaces 3170, memory controllers 3180, a display controller 3192, and a multimedia engine 3194. In at least one embodiment, APU 3100 may include, without limitation, any number of core complexes 3110, any number of graphics complexes 3150, any number of display controllers 3192, and any number of multimedia engines 3194 in any combination. For explanatory purposes, multiple instances of like objects are denoted herein with reference numbers identifying an object and parenthetical numbers identifying an instance where needed.

In at least one embodiment, core complex 3110 is a CPU, graphics complex 3140 is a GPU, and APU 3100 is a processing unit that integrates, without limitation, 3110 and 3140 onto a single chip. In at least one embodiment, some tasks may be assigned to core complex 3110 and other tasks may be assigned to graphics complex 3140. In at least one embodiment, core complex 3110 is configured to execute main control software associated with APU 3100, such as an operating system. In at least one embodiment, core complex 3110 is a master processor of APU 3100, controlling and coordinating operations of other processors. In at least one embodiment, core complex 3110 issues commands that control an operation of graphics complex 3140. In at least one embodiment, core complex 3110 can be configured to execute host executable code derived from CUDA source code, and graphics complex 3140 can be configured to execute device executable code derived from CUDA source code.

In at least one embodiment, core complex 3110 includes, without limitation, cores 3120(1)-3120(4) and an L3 cache 3130. In at least one embodiment, core complex 3110 may include, without limitation, any number of cores 3120 and any number and type of caches in any combination. In at least one embodiment, cores 3120 are configured to execute instructions of a particular instruction set architecture ("ISA"). In at least one embodiment, each core 3120 is a CPU core.

In at least one embodiment, each core 3120 includes, without limitation, a fetch/decode unit 3122, an integer execution engine 3124, a floating point execution engine 3126, and an L2 cache 3128. In at least one embodiment, fetch/decode unit 3122 fetches instructions, decodes such instructions, generates micro-operations, and dispatches separate micro-instructions to integer execution engine 3124 and floating point execution engine 3126. In at least one embodiment, fetch/decode unit 3122 can concurrently dispatch one micro-instruction to integer execution engine 3124 and another micro-instruction to floating point execution engine 3126. In at least one embodiment, integer execution engine 3124 executes, without limitation, integer and memory operations. In at least one embodiment, floating point engine 3126 executes, without limitation, floating point and vector operations. In at least one embodiment, fetch-decode unit 3122 dispatches micro-instructions to a single execution engine that replaces both integer execution engine 3124 and floating point execution engine 3126.

In at least one embodiment, each core 3120(*i*), where i is an integer representing a particular instance of core 3120, may access L2 cache 3128 (*i*) included in core 3120(*i*). In at least one embodiment, each core 3120 included in core complex 3110(*j*), where j is an integer representing a particular instance of core complex 3110, is connected to other cores 3120 included in core complex 3110(*j*) via L3 cache 3130 (*j*) included in core complex 3110(*j*). In at least one embodiment, cores 3120 included in core complex 3110(*j*), where j is an integer representing a particular instance of core complex 3110, can access all of L3 cache 3130 (*j*) included in core complex 3110(*j*). In at least one embodiment, L3 cache 3130 may include, without limitation, any number of slices.

In at least one embodiment, graphics complex 3140 can be configured to perform compute operations in a highly-parallel fashion. In at least one embodiment, graphics complex 3140 is configured to execute graphics pipeline operations such as draw commands, pixel operations, geometric computations, and other operations associated with rendering an image to a display. In at least one embodiment, graphics complex 3140 is configured to execute operations unrelated to graphics. In at least one embodiment, graphics complex 3140 is configured to execute both operations related to graphics and operations unrelated to graphics.

In at least one embodiment, graphics complex 3140 includes, without limitation, any number of compute units 3150 and an L2 cache 3142. In at least one embodiment, compute units 3150 share L2 cache 3142. In at least one embodiment, L2 cache 3142 is partitioned. In at least one embodiment, graphics complex 3140 includes, without limitation, any number of compute units 3150 and any number (including zero) and type of caches. In at least one embodiment, graphics complex 3140 includes, without limitation, any amount of dedicated graphics hardware.

In at least one embodiment, each compute unit 3150 includes, without limitation, any number of SIMD units 3152 and a shared memory 3154. In at least one embodiment, each SIMD unit 3152 implements a SIMD architecture and is configured to perform operations in parallel. In at least one embodiment, each compute unit 3150 may execute any number of thread blocks, but each thread block executes on a single compute unit 3150. In at least one embodiment, a thread block includes, without limitation, any number of threads of execution. In at least one embodiment, a workgroup is a thread block. In at least one embodiment, each SIMD unit 3152 executes a different warp. In at least one embodiment, a warp is a group of threads (e.g., 16 threads), where each thread in a warp belongs to a single thread block and is configured to process a different set of data based on a single set of instructions. In at least one embodiment, predication can be used to disable one or more threads in a warp. In at least one embodiment, a lane is a thread. In at least one embodiment, a work item is a thread. In at least one embodiment, a wavefront is a warp. In at least one embodiment, different wavefronts in a thread block may synchronize together and communicate via shared memory 3154.

In at least one embodiment, fabric 3160 is a system interconnect that facilitates data and control transmissions across core complex 3110, graphics complex 3140, I/O interfaces 3170, memory controllers 3180, display controller 3192, and multimedia engine 3194. In at least one embodiment, APU 3100 may include, without limitation, any amount and type of system interconnect in addition to or instead of fabric 3160 that facilitates data and control transmissions across any number and type of directly or indirectly linked components that may be internal or external to APU 3100. In at least one embodiment, I/O interfaces 3170 are representative of any number and type of I/O interfaces (e.g., PCI, PCI-Extended ("PCI-X"), PCIe, gigabit Ethernet ("GBE"), USB, etc.). In at least one embodiment, various types of peripheral devices are coupled to I/O interfaces 3170 In at least one embodiment, peripheral devices that are coupled to I/O interfaces 3170 may include, without limitation, keyboards, mice, printers, scanners, joysticks or other types of game controllers, media recording devices, external storage devices, network interface cards, and so forth.

In at least one embodiment, display controller AMD92 displays images on one or more display device(s), such as a liquid crystal display ("LCD") device. In at least one embodiment, multimedia engine 240 includes, without limitation, any amount and type of circuitry that is related to multimedia, such as a video decoder, a video encoder, an image signal processor, etc. In at least one embodiment, memory controllers 3180 facilitate data transfers between APU 3100 and a unified system memory 3190. In at least one embodiment, core complex 3110 and graphics complex 3140 share unified system memory 3190.

In at least one embodiment, APU 3100 implements a memory subsystem that includes, without limitation, any amount and type of memory controllers 3180 and memory devices (e.g., shared memory 3154) that may be dedicated to one component or shared among multiple components. In at least one embodiment, APU 3100 implements a cache subsystem that includes, without limitation, one or more cache memories (e.g., L2 caches 3128, L3 cache 3130, and L2 cache 3142) that may each be private to or shared between any number of components (e.g., cores 3120, core complex 3110, SIMD units 3152, compute units 3150, and graphics complex 3140).

Figure 32:
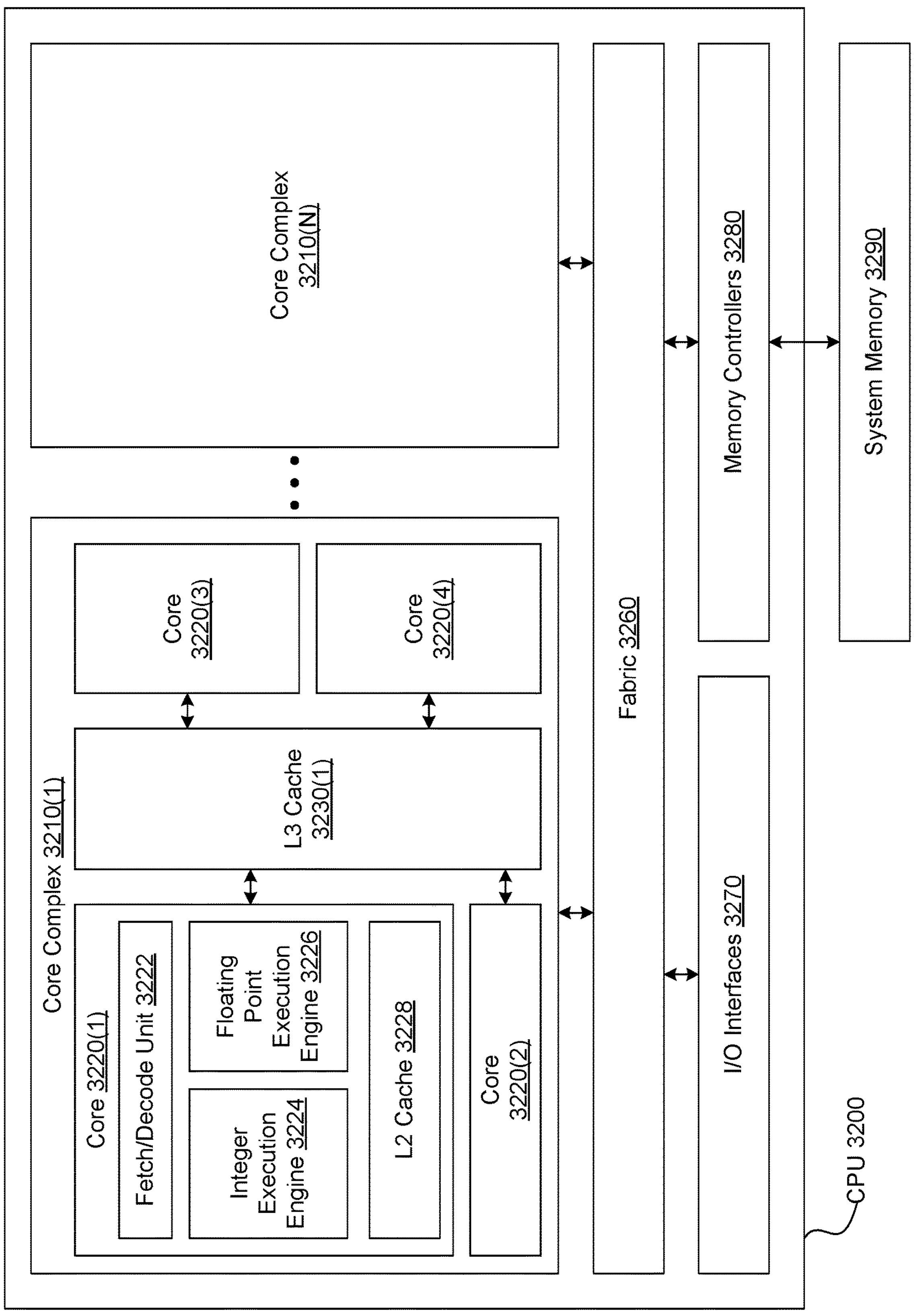
FIG. 32 illustrates a CPU, in accordance with at least one embodiment.

FIG. 32 illustrates a CPU 3200, in accordance with at least one embodiment. In at least one embodiment, CPU 3200 is developed by AMD Corporation of Santa Clara, CA. In at least one embodiment, CPU 3200 can be configured to execute an application program. In at least one embodiment, CPU 3200 is configured to execute main control software, such as an operating system. In at least one embodiment, CPU 3200 issues commands that control an operation of an external GPU (not shown). In at least one embodiment, CPU 3200 can be configured to execute host executable code derived from CUDA source code, and an external GPU can be configured to execute device executable code derived from such CUDA source code. In at least one embodiment, CPU 3200 includes, without limitation, any number of core complexes 3210, fabric 3260, I/O interfaces 3270, and memory controllers 3280.

In at least one embodiment, core complex 3210 includes, without limitation, cores 3220(1)-3220(4) and an L3 cache 3230. In at least one embodiment, core complex 3210 may include, without limitation, any number of cores 3220 and any number and type of caches in any combination. In at least one embodiment, cores 3220 are configured to execute instructions of a particular ISA. In at least one embodiment, each core 3220 is a CPU core.

In at least one embodiment, each core 3220 includes, without limitation, a fetch/decode unit 3222, an integer execution engine 3224, a floating point execution engine 3226, and an L2 cache 3228. In at least one embodiment, fetch/decode unit 3222 fetches instructions, decodes such instructions, generates micro-operations, and dispatches separate micro-instructions to integer execution engine 3224 and floating point execution engine 3226. In at least one embodiment, fetch/decode unit 3222 can concurrently dispatch one micro-instruction to integer execution engine 3224 and another micro-instruction to floating point execution engine 3226. In at least one embodiment, integer execution engine 3224 executes, without limitation, integer and memory operations. In at least one embodiment, floating point engine 3226 executes, without limitation, floating point and vector operations. In at least one embodiment, fetch-decode unit 3222 dispatches micro-instructions to a single execution engine that replaces both integer execution engine 3224 and floating point execution engine 3226.

In at least one embodiment, each core 3220(*i*), where i is an integer representing a particular instance of core 3220, may access L2 cache 3228 (*i*) included in core 3220(*i*). In at least one embodiment, each core 3220 included in core complex 3210(*j*), where j is an integer representing a particular instance of core complex 3210, is connected to other cores 3220 in core complex 3210(*j*) via L3 cache 3230 (*j*) included in core complex 3210(*j*). In at least one embodiment, cores 3220 included in core complex 3210(*j*), where j is an integer representing a particular instance of core complex 3210, can access all of L3 cache 3230 (*j*) included in core complex 3210(*j*). In at least one embodiment, L3 cache 3230 may include, without limitation, any number of slices.

In at least one embodiment, fabric 3260 is a system interconnect that facilitates data and control transmissions across core complexes 3210(1)-3210(N) (where Nis an integer greater than zero), I/O interfaces 3270, and memory controllers 3280. In at least one embodiment, CPU 3200 may include, without limitation, any amount and type of system interconnect in addition to or instead of fabric 3260 that facilitates data and control transmissions across any number and type of directly or indirectly linked components that may be internal or external to CPU 3200. In at least one embodiment, I/O interfaces 3270 are representative of any number and type of I/O interfaces (e.g., PCI, PCI-X, PCIe, GBE, USB, etc.). In at least one embodiment, various types of peripheral devices are coupled to I/O interfaces 3270. In at least one embodiment, peripheral devices that are coupled to I/O interfaces 3270 may include, without limitation, displays, keyboards, mice, printers, scanners, joysticks or other types of game controllers, media recording devices, external storage devices, network interface cards, and so forth.

In at least one embodiment, memory controllers 3280 facilitate data transfers between CPU 3200 and a system memory 3290. In at least one embodiment, core complex 3210 and graphics complex 3240 share system memory 3290. In at least one embodiment, CPU 3200 implements a memory subsystem that includes, without limitation, any amount and type of memory controllers 3280 and memory devices that may be dedicated to one component or shared among multiple components. In at least one embodiment, CPU 3200 implements a cache subsystem that includes, without limitation, one or more cache memories (e.g., L2 caches 3228 and L3 caches 3230) that may each be private to or shared between any number of components (e.g., cores 3220 and core complexes 3210).

Other variations are within spirit of present disclosure. Thus, while disclosed techniques are susceptible to various modifications and alternative constructions, certain illustrated embodiments thereof are shown in drawings and have been described above in detail. It should be understood, however, that there is no intention to limit disclosure to specific form or forms disclosed, but on contrary, intention is to cover all modifications, alternative constructions, and equivalents falling within spirit and scope of disclosure, as defined in appended claims.

Use of terms "a" and "an" and "the" and similar referents in context of describing disclosed embodiments (especially in context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. Term "connected," when unmodified and referring to physical connections, is to be construed as partly or wholly contained within, attached to, or joined together, even if there is something intervening. Recitation of ranges of values herein are merely intended to serve as a shorthand method of referring individually to each separate value falling within range, unless otherwise indicated herein and each separate value is incorporated into specification as if it were individually recited herein. In at least one embodiment, use of term "set" (e.g., "a set of items") or "subset" unless otherwise noted or contradicted by context, is to be construed as a nonempty collection comprising one or more members. Further, unless otherwise noted or contradicted by context, term "subset" of a corresponding set does not necessarily denote a proper subset of corresponding set, but subset and corresponding set may be equal.

Conjunctive language, such as phrases of form "at least one of A, B, and C," or "at least one of A, B and C," unless specifically stated otherwise or otherwise clearly contradicted by context, is otherwise understood with context as used in general to present that an item, term, etc., may be either A or B or C, or any nonempty subset of set of A and B and C. For instance, in illustrative example of a set having three members, conjunctive phrases "at least one of A, B, and C" and "at least one of A, B and C" refer to any of following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, term "plurality" indicates a state of being plural (e.g., "a plurality of items" indicates multiple items). In at least one embodiment, a number of items in a plurality is at least two, but can be more when so indicated either explicitly or by context. Further, unless stated otherwise or otherwise clear from context, phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium. In at least one embodiment, in form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause computer system to perform operations described herein. A set of non-transitory computer-readable storage media, in at least one embodiment, comprises multiple non-transitory computer-readable storage media and one or more of individual non-transitory storage media of multiple non-transitory computer-readable storage media lack all of code while multiple non-transitory computer-readable storage media collectively store all of code. In at least one embodiment, executable instructions are executed such that different instructions are executed by different processors-in at least one embodiment, a non-transitory computer-readable storage medium store instructions and a main central processing unit ("CPU") executes some of instructions while a graphics processing unit ("GPU") executes other instructions. In at least one embodiment, different components of a computer system have separate processors and different processors execute different subsets of instructions.

Accordingly, in at least one embodiment, computer systems are configured to implement one or more services that singly or collectively perform operations of processes described herein and such computer systems are configured with applicable hardware and/or software that enable performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of disclosure and does not pose a limitation on scope of disclosure unless otherwise claimed. No language in specification should be construed as indicating any non-claimed element as essential to practice of disclosure.

All references, including publications, patent applications, and patents, cited herein are hereby incorporated by reference to same extent as if each reference were individually and specifically indicated to be incorporated by reference and were set forth in its entirety herein.

In description and claims, terms "coupled" and "connected," along with their derivatives, may be used. It should be understood that these terms may be not intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, term "processor" may refer to any device or portion of a device that processes electronic data from registers and/or memory and transform that electronic data into other electronic data that may be stored in registers and/or memory. As non-limiting examples, "processor" may be a CPU or a GPU. A "computing platform" may comprise one or more processors. As used herein, "software" processes may include, in at least one embodiment, software and/or hardware entities that perform work over time, such as tasks, threads, and intelligent agents. Also, each process may refer to multiple processes, for carrying out instructions in sequence or in parallel, continuously or intermittently. Terms "system" and "method" are used herein interchangeably insofar as system may embody one or more methods and methods may be considered a system.

In present document, references may be made to obtaining, acquiring, receiving, or inputting analog or digital data into a subsystem, computer system, or computer-implemented machine. In at least one embodiment, process of obtaining, acquiring, receiving, or inputting analog and digital data can be accomplished in a variety of ways such as by receiving data as a parameter of a function call or a call to an application programming interface. In some implementations, process of obtaining, acquiring, receiving, or inputting analog or digital data can be accomplished by transferring data via a serial or parallel interface. In another implementation, process of obtaining, acquiring, receiving, or inputting analog or digital data can be accomplished by transferring data via a computer network from providing entity to acquiring entity. References may also be made to providing, outputting, transmitting, sending, or presenting analog or digital data. In various examples, process of providing, outputting, transmitting, sending, or presenting analog or digital data can be accomplished by transferring data as an input or output parameter of a function call, a parameter of an application programming interface or inter-process communication mechanism.

Although discussion above sets forth example implementations of described techniques, other architectures may be used to implement described functionality, and are intended to be within scope of this disclosure. Furthermore, although specific distributions of responsibilities are defined above for purposes of discussion, various functions and responsibilities might be distributed and divided in different ways, depending on circumstances.

Furthermore, although subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A system comprising:

one or more first cooling loops to flow a first coolant to cool one or more first components of one or more servers at least partially submerged in an immersion coolant tank by cold plate cooling, wherein at least one of the one or more first cooling loops comprises a first coolant distribution unit (CDU) disposed within the immersion coolant tank, wherein the first CDU is to cool the first coolant, and wherein one or more first manifolds extend from the first CDU within the immersion coolant tank to distribute cooled first coolant to the one or more servers; and one or more second cooling loops to flow a second coolant to cool one or more second components of the one or more servers at least partially submerged in the immersion coolant tank by immersion cooling, wherein at least one of the one or more second cooling loops comprises a second CDU disposed within the immersion coolant tank, wherein the second CDU is to cool the second coolant, wherein a second manifold extends from the second CDU within the immersion coolant tank to distribute cooled second coolant from the second CDU within the immersion coolant tank, and wherein the second manifold is disposed beneath the one or more servers.

2. The system of claim 1, wherein the one or more first cooling loops comprise one or more associated cold plates for cooling the one or more first components.

3. The system of claim 1, wherein the one or more second cooling loops flow a dielectric liquid coolant in the immersion coolant tank by forced convection.

4. The system of claim 1, wherein;

the first CDU comprises a first heat exchanger to exchange first heat from at least one of the one or more first cooling loops with a third cooling loop; and the second CDU comprises a second heat exchanger to exchange second heat from the at least one of the one or more second cooling loops with a fourth cooling loop.

5. The system of claim 4, wherein the third cooling loop is to exchange the first heat with a cold sink via one or more chillers or one or more cooling towers, and wherein the fourth cooling loop is to exchange the second heat with the cold sink via the one or more chillers or the one or more cooling towers.

6. The system of claim 1, wherein the one or more first cooling loops comprise a supply manifold and a return manifold disposed within the immersion coolant tank to distribute the first coolant to the one or more servers.

7. The system of claim 6, wherein the supply manifold and the return manifold are disposed above the one or more servers.

8. The system of claim 1, wherein the one or more servers are supported in an at least partially submerged state in the immersion coolant tank.

9. The system of claim 1, wherein the one or more first components have a first power density and the one or more second components have a second power density, wherein the first power density is greater than the second power density.

10. A datacenter comprising:

one or more servers at least partially submerged in an immersion coolant tank; and a cooling system to cool the one or more servers, the cooling system comprising:

one or more first cooling loops to flow a first coolant to cool one or more first components of the one or more servers at least partially submerged in the immersion coolant tank by cold plate cooling and one or more second cooling loops to flow a second coolant to cool one or more second components of the one or more servers at least partially submerged in the immersion coolant tank by immersion cooling, wherein at least one of the one or more first cooling loops comprises a first coolant distribution unit (CDU) disposed within the immersion coolant tank, wherein the first CDU is to cool the first coolant, and wherein one or more first manifolds extend from the first CDU within the immersion coolant tank to distribute cooled first coolant to the one or more servers, wherein at least one of the one or more second cooling loops comprises a second CDU disposed within the immersion coolant tank, wherein the second CDU is to cool the second coolant, wherein a second manifold extends from the second CDU within the immersion coolant tank to distribute cooled second coolant from the second CDU within the immersion coolant tank, and wherein the second manifold is disposed beneath the one or more servers.

11. The datacenter of claim 10, wherein the one or more first cooling loops comprise one or more associated cold plates for cooling the one or more first components.

12. The datacenter of claim 10, wherein the first CDU comprises a first heat exchanger to exchange first heat from at least one of the one or more first cooling loops with a third cooling loop, wherein the second CDU comprises a second heat exchanger to exchange second heat from the at least one of the one or more second cooling loops with a fourth cooling loop.

13. The datacenter of claim 12, wherein the third cooling loop is to exchange the first heat with a cold sink via one or more chillers or one or more cooling towers, and wherein the fourth cooling loop is to exchange the second heat with the cold sink via the one or more chillers or the one or more cooling towers.

14. The datacenter of claim 10, wherein the one or more first manifolds comprises:

a supply manifold and a return manifold disposed within the immersion coolant tank to distribute the first coolant to the one or more servers, wherein the supply manifold and the return manifold are disposed above the one or more servers.

15. The datacenter of claim 10, wherein the one or more first components have a first power density and the one or more second components have a second power density, wherein the first power density is greater than the second power density.

16. A method comprising:

cooling, by cold plates via one or more first cooling loops that flow a first coolant, one or more first components of one or more servers at least partially submerged in an immersion coolant tank;

cooling, by immersion cooling via one or more second cooling loops that flow a second coolant, one or more second components of the one or more servers at least partially submerged in the immersion coolant tank;

distributing cooled first coolant, via one or more first manifolds extending from a first coolant distribution unit (CDU) disposed within the immersion coolant tank, wherein the first CDU is to cool the first coolant; and distributing cooled second coolant, via a second manifold extending from a second CDU disposed within the immersion coolant tank, wherein the second CDU is to cool the second coolant, wherein the second manifold is disposed beneath the one or more servers.

17. The method of claim 16, wherein the cooled first coolant is distributed to one or more associated cold plates of the one or more first cooling loops for cooling the one or more first components.

18. The method of claim 16, further comprising:

exchanging, via a first heat exchanger of the first CDU, first heat from at least one of the one or more first cooling loops with a third cooling loop, wherein the third cooling loop is to exchange the first heat with a cold sink via one or more chillers or one or more cooling towers; and exchanging, via a second heat exchanger of the second CDU, second heat from the one or more second cooling loops with a fourth cooling loop, wherein the fourth cooling loop is to exchange the second heat with the cold sink via the one or more chillers or the one or more cooling towers.

19. The method of claim 16, further comprising:

distributing the first coolant to the one or more servers via a supply manifold and a return manifold of the one or more first cooling loops disposed within the immersion coolant tank, wherein the supply manifold and the return manifold are disposed above the one or more servers.

* * * * *